(12) United States Patent
Sano et al.

(10) Patent No.: US 6,916,676 B2
(45) Date of Patent: Jul. 12, 2005

(54) METHOD FOR PRODUCING A NITRIDE SEMICONDUCTOR ELEMENT

(75) Inventors: Masahiko Sano, Anan (JP); Mitsuhiro Nonaka, Anan (JP); Kazumi Kamada, Anan (JP); Masashi Yamamoto, Anan (JP)

(73) Assignee: Nichia Corporation, Anan (JP)

(*) Notice: Subject to any disclaimer, the term of this patent is extended or adjusted under 35 U.S.C. 154(b) by 45 days.

(21) Appl. No.: 10/614,778

(22) Filed: Jul. 9, 2003

(65) Prior Publication Data

US 2004/0104390 A1 Jun. 3, 2004

Related U.S. Application Data

(62) Division of application No. 10/351,497, filed on Jan. 27, 2003, now Pat. No. 6,744,071.

(30) Foreign Application Priority Data

| Jan. 28, 2002 | (JP) | ......... 2002/19192 |
| Jun. 17, 2002 | (JP) | ......... 2002/175686 |
| Jul. 3, 2002 | (JP) | ......... 2002/195179 |
| Aug. 9, 2002 | (JP) | ......... 2002/233866 |
| Dec. 9, 2002 | (JP) | ......... 2002/356463 |

(51) Int. Cl.$^7$ .................................. H01L 21/00
(52) U.S. Cl. ................ 438/46; 438/22; 438/34; 438/47; 438/455; 438/458; 438/459
(58) Field of Search .................. 438/22, 34, 46, 438/47, 455, 458, 459

(56) References Cited

FOREIGN PATENT DOCUMENTS

| JP | 9-8403 | 1/1997 |
| JP | 09-129932 | 5/1997 |
| JP | 10-117016 | 5/1998 |
| JP | 11-214744 | 8/1999 |
| JP | 2000-196152 | 7/2000 |
| JP | 2001-284641 | 10/2001 |
| JP | 2001-298214 | 10/2001 |
| JP | 2001-313422 | 11/2001 |

*Primary Examiner*—Long Pham
(74) *Attorney, Agent, or Firm*—Wenderoth, Lind & Ponack, L.L.P.

(57) ABSTRACT

A method of producing an efficient nitride semiconductor element having an opposed terminal structure. The method includes a growing step for growing the nitride semiconductor further having an undoped GaN layer on a different materials substrate; subsequently, an attaching step for attaching the supporting substrate to the first conductive type nitride semiconductor layer side of the nitride semiconductor and interposing a first terminal between them; and subsequently, an exposing step for exposing the second conductive type nitride semiconductor layer by eliminating the different material substrate and the undoped GaN.

19 Claims, 27 Drawing Sheets

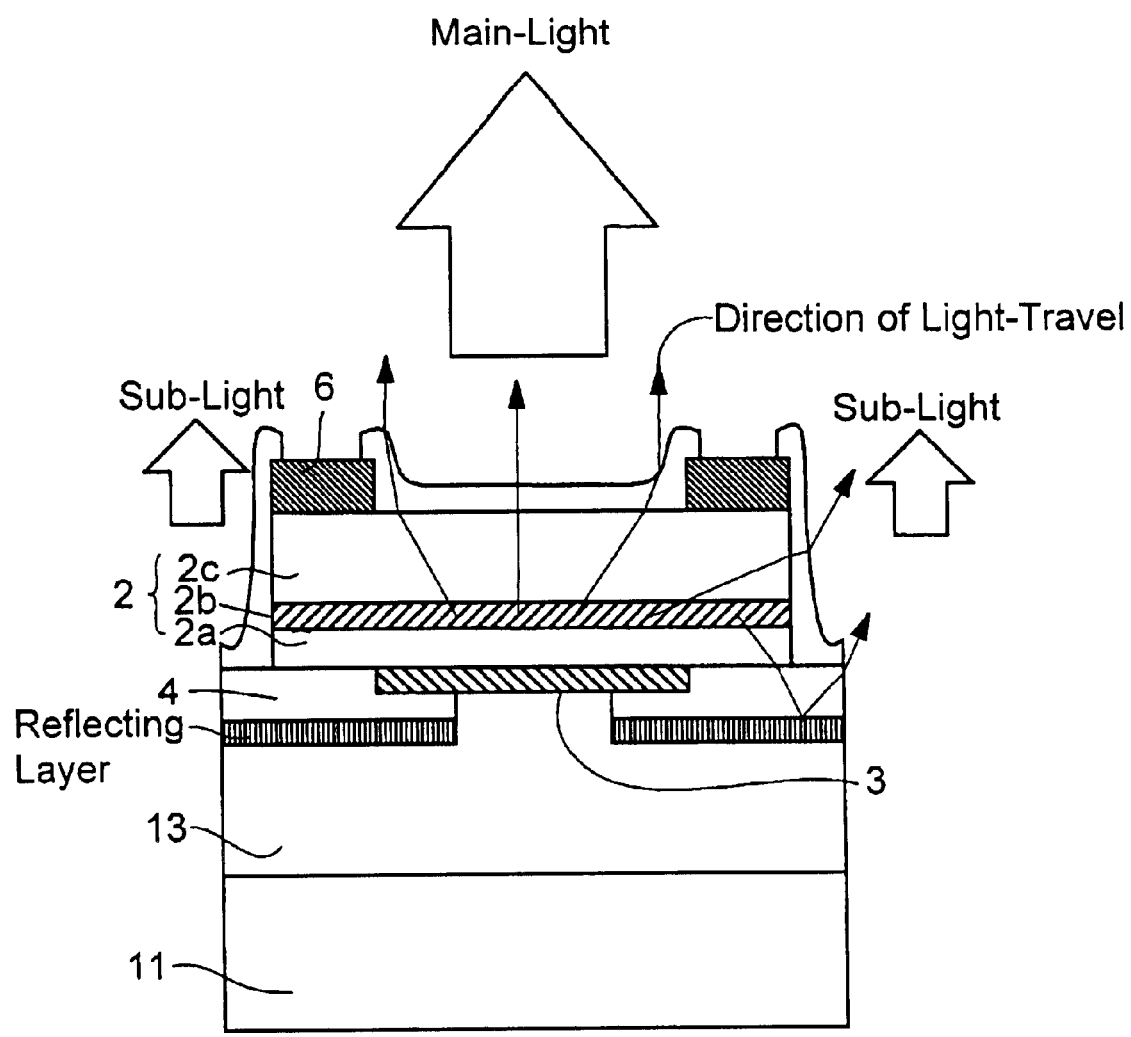

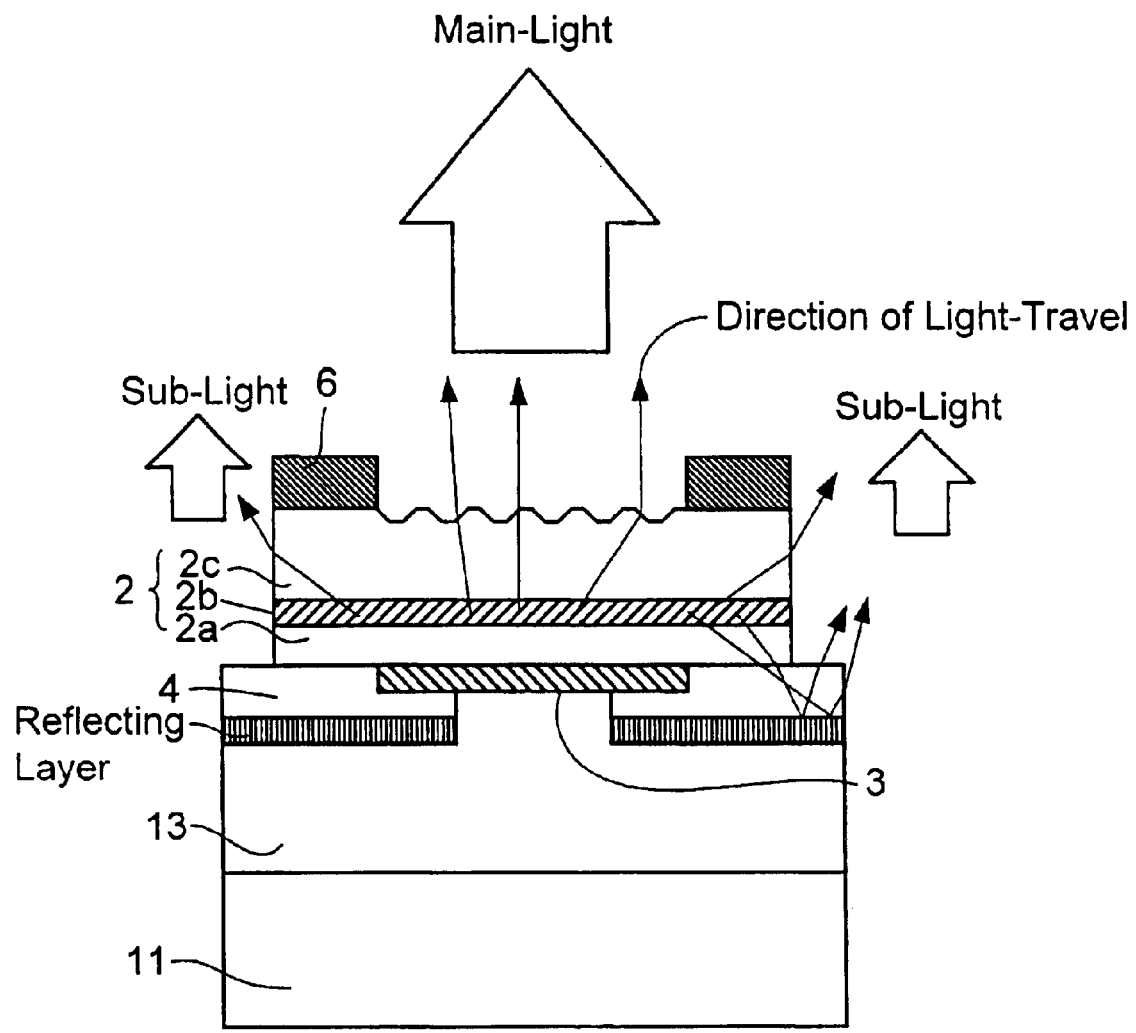

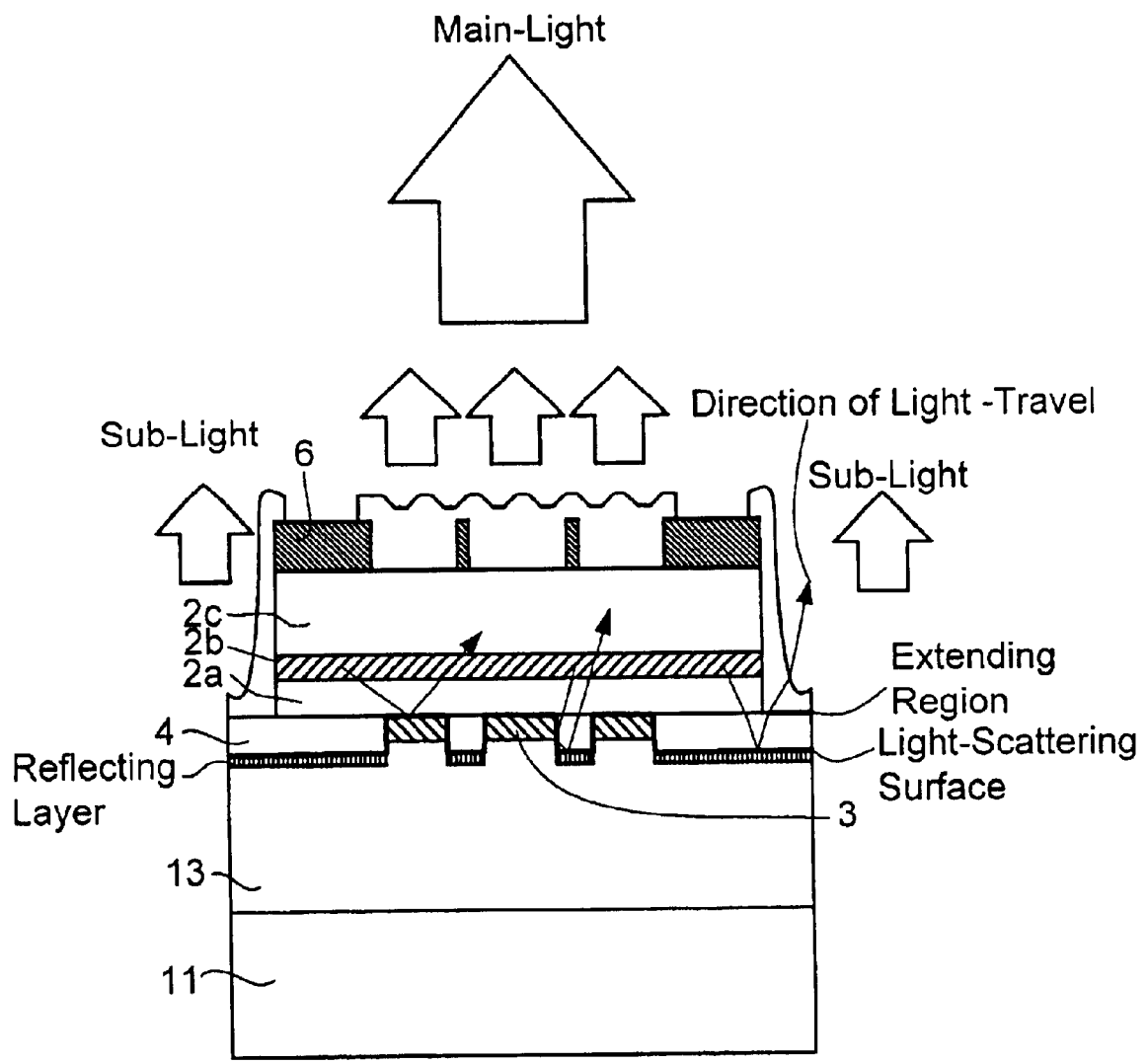

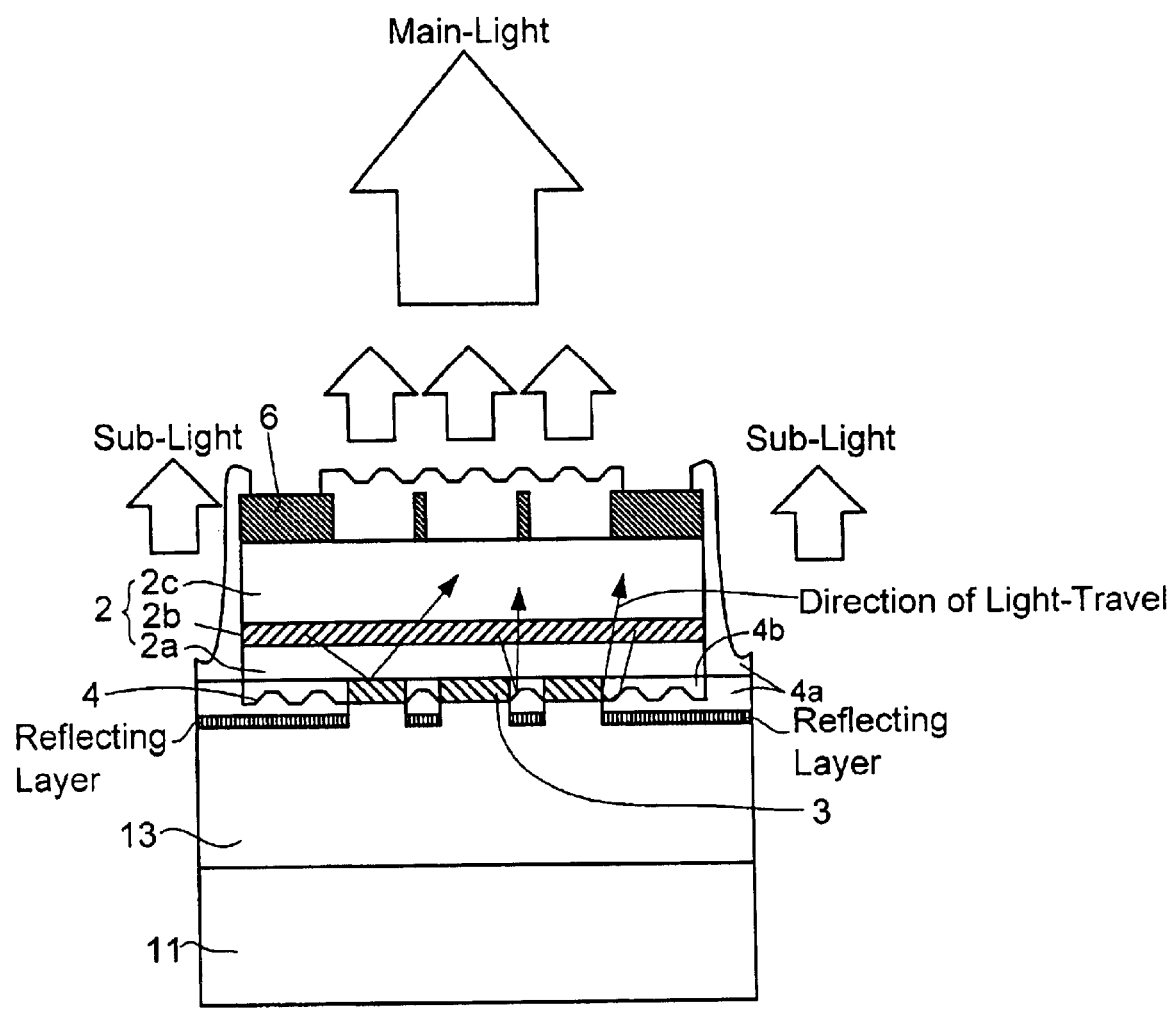

METHOD FOR PRODUCING A NITRIDE SEMICONDUCTOR ELEMENT

This is a Divisional Application of U.S. application Ser. No. 10/351,497, filed Jan. 27, 2003 now U.S. Pat. No. 6,744,071.

This application is based on Application No. 2002-019192 filed in Japan on Jan. 28, 2002, No. 2002-195179 filed in Japan on Jul. 3, 2002, No. 2002-356463 filed in Japan on Dec. 9, 2002, No. 2002-175686 filed in Japan on Jun. 17, 2002, No. 2002-233866 filed in Japan on Aug. 9, 2002, the contents of which are incorporated hereinto by references.

FILED OF THE INVENTION

This invention relates to a nitride semiconductor element with a supporting substrate used for a light-emitting device such as a light emitting diode (LED), a laser diode (LD), etc., a photoreceptor such as a solar cell, a photo sensor, etc., an electronic device such as a transistor, a power device, etc., and a method for producing thereof. An attaching structure is employed as one of the methods for producing.

BACKGROUND OF THE INVENTION

A nitride semiconductor is one of desirable candidate direct-band-gap semiconductor materials, however, it is difficult to produce a bulk of its single crystal. Therefore, hetero-epitaxial technology is usually employed to grow GaN on a different material substrate such as sapphire, SiC, etc. by metal-organic chemical vapor deposition (MOCVD) for the present. It was shown that sapphire is a preferable substrate for growing a high efficient light-emitting device of nitride semiconductor because of its stability at high temperature under atmosphere with ammonia in an epitaxial vapor deposition process compared with the other different material substrates. When a sapphire substrate is employed, a process for forming AlGaN layer as a buffer layer on the sapphire substrate at low-temperature around 600° C. is usually employed to grow nitride semiconductor layers thereon. It can improve crystallinity of the nitride semiconductor layers.

Specifically, a nitride semiconductor element grown on a sapphire substrate is used for a blue LED, a pure-green LED with higher luminance than conventional LEDs, and an LD (laser diode). They are applied for a full-color display; traffic lights; an image scanner; light sources such as a light source for an optical disc, which is media, for example DVD, capable of memorizing a large-capacity of information; a light source for communication; a printer; etc. Further, it is anticipated to apply to an electronic device such as a field-effect transistor (FET).

Related Reference 1

Japanese Patent Laid-Open Publication Toku-Kai No. HEI 9-129932 (1997).

However, sapphire is a low thermal conductivity insulating material. Thus, the structure of nitride semiconductor element is limited. For example, in the case of conductive substrate such as GaAs or GaP, one of electric contact portions (terminals) can be disposed on the top surface of the semiconductor device, another contact portion can be disposed on the bottom. But, both of the electric contact portions of the light-emitting element grown on the sapphire substrate should be disposed on the top surface (the same plane side). Therefore, when an insulating material such as sapphire, etc. is employed as a substrate, it reduce the effective area of light-emission compared with a conductive substrate having the same area of substrate. In addition, when an insulating substrate is employed, it reduces the number of elements (chips) obtained from the same diameter of a wafer.

Further, a nitride semiconductor element with an insulating substrate such as sapphire is used as face-up type or face-down type. These types have both terminals in the same plane side, so that it increases current density locally. Then, it generates heat in the element (chip), so that it accelerates deterioration of the element. In addition, wires are required for both of pn terminals in a wire-bonding process for the terminals, so that it increases chip size. Therefore it reduces yield of chips. Additionally, sapphire has high hardness and a crystal structure with hexagonal system. So that when sapphire is employed as a substrate for growth, it is requires to break into chips by scribing the sapphire substrate. Thus, it requires an additional process compared with the other substrates.

Furthermore, recently, it has been available that an LED capable of emitting in ultra-violet region is in practical use. Generally, ultra-violet region is defined as wavelength of light-emission not more than 400 nm. The band gap of GaN is 365 nm. To shorten the wavelength not more than 365 nm, absorption of GaN of a contact layer, etc. may reduce the outgoing efficiency of the light extremely.

The present invention is devised to solve the above problems, and therefore, is aimed to at providing a high efficient nitride semiconductor element having an opposed terminal structure, whose terminals facing each other, without increasing its voltage, and a method for producing thereof. Further, it is another object to provide a high light-emitting power nitride semiconductor element even in ultra-violet region.

SUMMARY OF THE INVENTION

The nitride semiconductor element of the invention includes, at least a conductive layer, a first terminal, a nitride semiconductor with a light-emitting layer, and a second terminal, from a supporting substrate successively, wherein, the first terminal and a first insulating protect layer are interposed between the conductive layer and a first conductive type nitride semiconductor layer. The nitride semiconductor may include the first conductive type nitride semiconductor layer, the light-emitting layer, and a second conductive type nitride semiconductor layer, which has an asperity portion as a top layer thereof. When the supporting substrate is conductive material, it can provide the nitride semiconductor element with an opposed terminal structure. In addition, when the first terminal is a p-type terminal, it can improve the outgoing efficiency of the light. That is, the second conductive type nitride semiconductor element formed in the second terminal (n-type terminal) side, which is topside of the nitride semiconductor layer, is an n-type nitride semiconductor layer. In other word, the n-type nitride semiconductor layer side is the outgoing surface of the light. An n-type layer in the nitride semiconductor (especially GaN system semiconductor) is of low resistance, so that the size of the n-type terminal, the second terminal, can be downsized. Because downsizing the size of the n-type terminal reduce the area cutting off the light, it can improve the outgoing efficiency of the light. Additionally, the conventional nitride semiconductor element has a structure having both terminals in the same plane side, so that it is required to provide a p-pad terminal for the p-type terminal. When conductive material is employed as the supporting substrate in the invention, die-bonding to a package such as a lead frame with a conductive material can achieve continuity. Therefore the p-pad terminal can be eliminated, it can increase the area of light-emission. In addition, providing the first insulating protect layer can prevent short circuit, etc., so that it can improve yield and reliability. It can also simplify its producing process.

In the nitride semiconductor element of the invention, the first terminal and the first insulating protect layer are in contact with the first conductive type nitride semiconductor layer. The first terminal may be formed on the whole of the first conductive type nitride semiconductor layer, however, it should be appreciated that forming the first terminal partially and covering an opening portion with the first insulating protect layer can adjust the contact area between the first terminal and the first conductive type nitride semiconductor layer. In addition, forming the first terminal in a pattern such as a rectangular shape, lines, a square shape, a grid pattern, dots, a rhombus, a parallelogram, a mesh shape, a striped shape, a ramose shape branching from one into a plurality of branches, etc. can improve the outgoing efficiency of the light. When the first conductive type nitride semiconductor layer can have ohmic contact with the first terminal, either p-type terminal or n-type terminal can be employed as the first conductive type nitride semiconductor layer. The first conductive type nitride semiconductor layer is not restricted either in a single-layer or a multi-layer.

The first terminal includes at least one element selected from the group of Ag, Rh, Ni, Au, Pd, Ir, Ti, Pt, W, and Al. Concretely, reflectivity of Ag, Al, Rh, Pd, and Au are 89%, 84%, 55%, 50%, and 24%, respectively. Thus, according to the reflectivity Ag is the most preferable material, however, it is preferable to employ Rh in view of ohmic contact when the first conductive type nitride semiconductor layer is p-type. Using the material can achieve low resistance, and can improve the outgoing efficiency of the light. The conductive layer is formed of eutectic, which includes at least one element selected from the group of Au, Sn, and In. Employing the eutectic material as the conductive layer can form the layers even at low temperature. The eutectic junction can attach at low temperature, so that it can achieve an effect for reducing warpage. Additionally, employing the structure of (intimate-contact layer)/(barrier layer)/(eutectic layer) formed of Au, Sn, Pd, In, Ti, Ni, W, Mo, Au—Sn, Sn—Pd, In—Pd, Ti—Pt—Au, and Ti—Pt—Sn, etc. from the first terminal side can prevent deterioration cause of the diffusion from the first terminal (p-type terminal, for example).

In the nitride semiconductor element of the invention, the first terminal and the second terminal are formed in an opposed terminal structure, and the second terminal is disposed on the portion corresponding to the rest of the portion, on which the first terminal is disposed. That is, in a view from the terminal-forming surface, both terminals do not overlap each other. Because both terminals do not overlap each other in a view from the terminal-forming surface, the emitted light can outgo effectively without being cut off by the second terminal (n-type terminal, for example). Thus, it can reduce the absorption of the emitted light by the second terminal. When the conductive type nitride semiconductor layer is n-type, it is preferable that the second terminal includes Al, such as Ti—Al, W—Al, for example. In the present invention, the opposed terminal structure is meant a structure, in which the first terminal and the second terminal are formed so as to face each other with interposing the nitride semiconductor.

In the nitride semiconductor element of the invention, the nitride semiconductor includes a second conductive type nitride semiconductor layer with an asperity portion as a top layer thereof. The asperity-forming (dimple processing) portion is provided in the outgoing side of the light. Forming the asperity on the surface can let the light, which does not outgo cause of the total internal reflection, outgo by varying the entry angle of the light at the asperity surface. It is anticipated that forming the asperity potion improve more than or equal to 1.5 times of the power compared with that without asperity. Its plane shape can be formed in a circle shape, polygonal shape such as a hexagonal shape or a triangle shape. In addition, the asperity also can be formed in a striped shape, a grid pattern, and a rectangular shape. It is preferable to form in a micro pattern for improving the outgoing efficiency of the light. In addition, it is preferable that its cross-sectional shape is a wave shape rather than a flat plane. Because it can improve the outgoing efficiency of the light compared with the square-cornered asperity. Additionally, it is preferable that the depth of the asperity is 0.2–3 $\mu$m. It is more preferable that it is 1.0–1.5 $\mu$m. It causes that it is less effective to improve the outgoing efficiency of the light, if the depth of the asperity is shallower than 0.2 $\mu$m. If the depth is deeper than the above range, the resistance in the transverse direction may be increased. In addition, drawing out to form the asperity shape in a circle shape or a polygonal shape can improve its power with maintaining low resistance.

In the nitride semiconductor element of the invention, the nitride semiconductor layers except the light-emitting layer in the nitride semiconductor have a band gap larger than the light-emission band gap. It is more preferable that the nitride semiconductor layers except the light-emitting layer in the nitride semiconductor have a band gap more than or equal to 0.1 eV larger than the light-emission band gap. Thus, the emitted light can outgo without absorption.

In the nitride semiconductor element of the invention, the linear thermal expansion coefficient of the supporting substrate is 4–10×10$^{-6}$/K. Setting the coefficient of linear thermal expansion of the supporting substrate in the above range can prevent warpage or crack of the nitride semiconductor element. Because over the above range increase the warpage and the ratio of occurrence of the crack of the nitride semiconductor element or the supporting substrate sharply, it is required to set the difference of the thermal expansion coefficient of GaN within not more than 4–10×10$^{-6}$/K.

In the nitride semiconductor element of the invention, the supporting substrate includes at least one element selected from the group of Cu, Mo, and W. The characteristics of the supporting substrate are required to have conductivity, and the thermal expansion coefficient approximate to the nitride semiconductor element. The supporting substrate including the above metal satisfies these characteristics. In addition, it can improve the characteristics of LED or LD such as high thermal dissipation, and ease of chip separation.

In the nitride semiconductor element of the invention, the content of Cu in the supporting substrate is not more than 50%. While increasing the content of Cu improves thermal conductivity, increases thermal expansion coefficient. Therefore, it is more preferable that the content of Cu is not more than 30%. It is preferable to decrease thermal expansion coefficient for alloying with Cu. When Mo is alloyed with Cu contained therein, the content of Mo is more than or equal to 50%. Mo is low cost. In addition, when W is alloyed with Cu contained therein, the content of W is more than or equal to 70%. W can be diced easily. Employing such supporting substrate can make its thermal expansion coefficient closer to the nitride semiconductor, so that it can provide preferable characteristics for thermal conductivity. The supporting substrate exhibits conductivity, so that it is possible to apply a large amount of current.

The first insulating protect layer includes a metal layer, which includes at least one element selected from the group of Al, Ag, and Rh, is formed on the side of the first insulating protect layer not in contact with the nitride semiconductor. That is, the metal layer is interposed between the conductive layer and the first insulating protect layer (FIG. 4). Forming the metal layer at this position can improve the outgoing efficiency of the light. Because it can reflect the light, which mostly runs in the transverse direction in the LED, toward light-outgoing face side. The metal layer is in contact with the conductive layer.

The semiconductor light-emitting element includes the first terminal 3, the laminated semiconductor layer 2 with the light-emitting layer, and the second terminal 6 on or above the supporting substrate 11 successively. Here, the first terminal 3 is provided in the junction plane side with the supporting substrate 11 supporting the semiconductor layer 2. In addition, the second terminal 6 is provided the light-outgoing surface side of the semiconductor 2. In such light-emitting element, the light emitted from the light-emitting layer is not radiated only upward, or toward outgoing surface, but also in all direction. So that the light radiated downward in the light emitted from the light-emitting layer is absorbed by the other formed layers. On the other hand, the thickness of the semiconductor layer 2 formed in the semiconductor element is about several $\mu$m to 10 $\mu$m, while the length of the traverse direction is not less than 200 $\mu$m, further more than 1 mm in wider one. Since the light transmitted longer distance until reflected at the side surface of the semiconductor, and so on, in the traverse direction than in the vertical direction, it is absorbed by the materials composing the semiconductor. Thus, the outgoing-efficiency of the light is reduced.

The semiconductor light-emitting element of the invention has: at least the conductive layer 13; the first terminal 3; the semiconductor 2, which includes the first conductive type semiconductor layer 2a in the contact boundary side with the first terminal, the light-emitting layer thereon, and the second conductive type semiconductor layer 2c further thereon in the light-outgoing surface side; and the second terminal on or above the supporting substrate 11 successively. The semiconductor light-emitting element further has the first protect layer 4, which has a contact boundary region with the semiconductor 2 and/or a region extending from the contact boundary in traverse direction of the semiconductor 2.

It is meant also to include even interposing an interposition layer between the first protect layer 4 and the semiconductor 2 that the first protect layer 4 has the contact boundary region with the semiconductor 2, as long as the first protect layer 4 and the laminated semiconductor layer 2 has optical connection transmittable of the light. Additionally, in the first protect layer 4, the region extending from the contact boundary in traverse direction of the semiconductor 2 is shown the region, in which the protect layer 4 is not in contact with the semiconductor 2, extended to the outside of the semiconductor layer 2 (FIG. 4, etc.). The first protect layer 4 is only to required to have the effect as a light-transmitting layer transmittable of the light emitted from the light-emitting layer. In addition, it works as insulating layer with the effect for preventing a leak current and for current convergence (current blocking). The light is transmitted from the light-emitting layer 2b downward, and moves into the first protect layer 4. The transmitted light is reflected upward at the boundary with a layer having reflection effect, and outgoes as an outgoing light through the extending region, which is provided outside of the semiconductor layer 2 as a light-outgoing surface. The light transmitted from the light-emitting layer 2b of the semiconductor 2 moves into the first protect layer 4, and it is repeatedly reflected at the side surfaces and the bottom surface of the first protect layer 4, then most of the light outgoes as the outgoing light upwardly though the top surface of the extending region. The thickness of the first protect layer is less than the thickness of the semiconductor in growth direction. Thus, the absorption and loss in the light-emitting element can be reduced, and the outgoing efficiency of the light from the light-emitting element is improved. It is preferable to select a material with low absorption coefficient as the first protect layer 4. The extending region, which is a light-outgoing path transmitting the light moving into the first protect layer 4 connected optically with the semiconductor layer 2, has the effect of guiding the emitted light outward before the light reflected repeatedly inside of the semiconductor laminated body is absorbed caused of the internal absorption. The sub light, which outgoes from the extending region corresponding to outside of the semiconductor light-emitting element, is added to the main light, which outgoes from the upper part of the first terminal 3, so that the external quantum efficiency can be improved. Concretely, the conductive layer 13 works as the layer with reflection effect, however, it is preferable to interpose a reflecting layer between the first protect layer 4 and the conductive layer 13. It is possible to reduce the loss at the reflection in the first protect layer 4.

Forming an asperity surface on the top surface of the extending region in the first protect layer 4 by etching and so on can improve the outgoing efficiency of the light from the surface. As another constitution, forming a protect layer 40 with refractive index $n_3$ on the top surface of the extending region can also achieve the same result. When the refractive index difference between the formed protect layer 40 and the refractive index $n_2$ of the first protect layer 4 is less than the refractive index difference between the refractive index $n_1$ of the semiconductor layer 2 and the refractive index $n_2$ of the first protect layer 4, a large part of the light outgoes toward less refractive-index-difference side. Therefore, a large part of the light moves into the first protect layer 4 having the surface exposed outside, and it is possible to improve the outgoing efficiency of the light.

Further, in the semiconductor light-emitting element, at least one first terminal 3 and the first protect layer 4 is formed by turns on the surface of the semiconductor in the supporting substrate side. It is preferable that the semiconductor light-emitting element has a reflecting layer under the first protect layer 4 (FIG. 12F). The light from the light-emitting layer is reflected at the boundary a between the first conductive type semiconductor layer 2a and the first terminal 3. In addition, the light-emitting layer passes through the boundary between the first conductive type semiconductor layer 2a and the first protect layer 4, and the light from the light-emitting layer is reflected at the boundary b between the first protect layer 4 and the conductive layer 13. The first terminal 3 absorbs the light. To reduce this absorption of the light, reducing the reflectivity at the boundary between the semiconductor 2 and the first protect layer 4, and increasing the reflectivity at the boundary b guides the light into the first protect layer 4, thereby the reflecting layer or the conductive layer 13 formed under the first protect layer reflects the light. Thus, it is possible to improve the outgoing efficiency of the light. It is preferable that the reflectivity of the first protect layer 4 is lower than the first terminal 3, and is formed of a material with high transmittance of the light.

Both of the boundary a between the first conductive type semiconductor layer 2a and the first terminal 3, and the boundary b between the first protect layer 4 and the conductive layer 13 are formed as an asperity portions. Here, the boundaries a, b are the surfaces with the effect as the light-reflecting surface reflecting the light from the light-emitting layer 2b. The first protect layer 4 is a transparent layer. However, the first terminal 3 in contact with the side surface of the first protect layer 4 and the boundary b with the conductive layer 13 in contact with the back surface of the first protect layer 4 can reflect the light. Recess portions as the boundaries b and projecting portions as the boundaries a are provided in traverse direction (FIG. 12D). It is appreciated that the reflecting layer shown in FIG. 12D, etc. may be omitted.

Providing the asperity portion can improve the outgoing efficiency of the light from the semiconductor to the outside. The reasons is that the light, which is transmitted downward originally, is reflected or scattered with increasing the vertical component of the transmittance. That is, the light is scattered at the asperity portion so as to run upward before it is transmitted for long distance in the traverse direction. Most of the light with the high traverse component of the transmittance is absorbed in the semiconductor. However asperity portion scatters the light from the light-emitting layer in all directions divergently, then can change the light with vertical component of the transmittance. Optical connection between such asperity portion and the extending region of the first protect layer 4 as mentioned above further can improve the outgoing efficiency of the light.

The first terminal 3 and the first protect layer 4 are provided under the same surface of the first conductive type semiconductor layer 2a. Here, while the first conductive type semiconductor layer 2a may have the bumps and dips of the asperity formed by "as-grown" or suitable micro process on the first-terminal-forming surface, it is preferable that the surface is flat. If the asperity portion is formed on the semiconductor by etching, the semiconductor has not some little damage. Accordingly, the life characteristics shall be reduced. In the invention, the asperity portion is not formed by etching, but also formed by combining materials. Therefore, the outgoing efficiency of the light can be improved without etching damage or reduction of the life characteristics.

The first protect layer 4 has a multi-layer structure composed of at least two layers. The boundary surface between the layers is formed in asperity surface. It is preferable that the asperity surface is inclined. The first protect layer 4 has the area in the semiconductor larger than the first terminal 3 in the traverse direction of the semiconductor 2. Accordingly, the light transmitted in the first protect layer is high ratio of the whole emitted light. It is very important to change the light, which moves into the first protect layer 4 once, upward, thereby the light outgoes. To achieve it, forming the first protect layer 4 in the multi-layer structure composed of at least two layers, and forming the asperity in the first protect layer 4 scatter the light, which moves into the first protect layer 4, at the boundary to change its direction upwardly. The first protect layer is composed of materials such as $SiO_2$, $Al_2O_3$, $ZrO_2$, $TiO_2$, $Nb_2O_5$. For example, the first protect layer 4 is formed in a two-layer structure composed of $Nb_2O_5$ in the boundary side 4b, and $SiO_2$ as a lower the layer 4a. The asperity portion is provided between the two layers to effect diffusion in the protect layer (FIG. 12F).

The nitride semiconductor element of the invention has the first terminal 3 and the second terminal 6 of the opposed terminal structure (FIG. 3, FIG. 12, etc.). As mentioned above, it is preferable that the second terminal is disposed on the portion corresponding to rest of the position, on which the first terminal is disposed, however, it is not specifically limited, for example, the second terminal may be disposed on the portion corresponding to the first terminal portion partially. In FIG. 3D, when the second terminal 6 is an n-type terminal, the current flows in wide area of the nitride semiconductor in the second terminal side, or n-type nitride semiconductor 2c. On the other hand, the current flows in narrow area of the nitride semiconductor in the first terminal 3 side, or p-type nitride semiconductor 2a, so that the first terminal is widely formed in the surface of the nitride semiconductor. To achieve efficient outgoing of the light, it is preferable that the second terminal is formed in a shape surrounding the top surface of the light-outgoing portion of the semiconductor 2. However, the terminal-forming area of the second terminal 6 can be small, both terminals may partially overlap each other as long as no cutting off a large amount of the light (FIG. 12E).

In addition, in the invention, the bumps and the dips of the asperity portion formed in the light-outgoing surface are formed in square shapes or rectangular shapes with square corners, mesa shapes or reverse-mesa shapes with inclined surfaces, or the like. It is preferable that the shape of the asperity portion has inclined surfaces.

The semiconductor 2 is nitride semiconductor in the invention. The nitride semiconductor is a semiconductor compound including nitrogen. The nitride semiconductor is direct-band-gap semiconductor. It has efficiency of light-emission much higher than indirect-band-gap semiconductor. Additionally, when it is formed of a semiconductor compound including group III element such as In, Ga, Al, the semiconductor light-emitting element capable of light-emission in the short wavelength region (300–550 nm) including ultra-violet region can be provided.

the light-emitting layer has a quantum well structure, which includes at least a well layer of $Al_aIn_bGa_{1-a-b}N$ (0=a=1, 0=b=1, a+b=1) and a barrier layer of $Al_cIn_dGa_{1-c-d}N$ (0=c=1, 0=d=1, c+d=1). The quantum well structure can provide the light-emitting element with high light-emission efficiency. The quantum well structure can be either a single quantum well structure or multi-quantum-well structure. In addition, it is preferable for achieving high power that b of the In composition of the well layer is set as 0<b=0.3. Because the mixture ratio b of In is higher, the crystallinity is prone to be uneven in the plane cause of segregation of the crystal, and preferable portions are interspersed in the plane. Additionally, it is prone to makes less linearity of the current-output characteristics and to become saturated easily. However, setting within the above range of the In composition can apply a large amount of current, so that it provide the advantage in the invention.

the light-emitting layer has a quantum well structure, which includes at least a well layer of $Al_aIn_bGa_{1-a-b}N$ (0<a=1, 0<b=1, a+b<1) and a barrier layer of $Al_cIn_dGa_{1-c-d}N$ (0<c=1, 0<d=1, c+d<1), and the first conductive type semiconductor layer is disposed in one side of the principal plane of the light-emitting layer, the second conductive type semiconductor layer, which includes Al, is disposed in another side of the principal plane of the light-emitting layer. In addition, in the range not more than 420 nm (near-ultra-violet region), which is low luminosity, b of the In composition is set as around 0<b=0.1. In the range not more than 380 nm (ultra-violet region), a of the Al composition is set as around 0.01=b=0.2.

The second conductive type nitride semiconductor layer includes at least two layers, one layer of said two layers, which is disposed in the second terminal side, is formed of $Al_eGa_{1-e}N$, and another layer of said two layers, which is disposed in the light-emitting layer side, is formed of $Al_fGa_{1-f}N$, wherein, the impurity concentration of the $Al_eGa_{1-e}N$ layer is higher than the $Al_fGa_{1-f}N$ layer.

In the invention, $Al_aIn_bGa_{1-a-b}N$ (0=a=1 0=b=1, a+b=1) can be employed as an active layer of the nitride semiconductor element. It can be applied to elements emitting light with various wavelengths, in the light-emitting element of InAlGaN system. Especially, the nitride semiconductor element in the ultra-violet region, which is not more than 380 nm, further has a particular advantageous. The invention provide a method for producing the nitride semiconductor element, which has a active layer having a quantum well structure with a well layer formed of a quaternary mixed crystal of InAlGaN and a barrier layer formed of nitride semiconductor including at least Al, capable of use even for short wavelength range, which is not more than 380 nm, appropriately. Because the well layer of the above active layer is formed of a quaternary mixed crystal of InAlGaN, it can minimize the number of the composition elements, and can reduce deterioration of the crystallinity, and further can improve light-emission efficiency. In addition, the band gap of the barrier layer formed of the nitride semiconductor including at least Al can be wider than the well layer, so that the active layer with the quantum well structure suitable for the wavelength of the light-emission can be formed, and can be maintain preferable crystallinity in the active layer.

Further, especially in the nitride semiconductor element for the ultra-violet region, which is not more than 380 nm, it is required to grow a GaN layer on or above a substrate, a buffer layer at high temperature for obtaining the nitride semiconductor element with preferable crystallinity. If a light-emitting layer (active layer) is grown without growing this layer, its crystallinity may be very poor. Therefore, in such nitride semiconductor light-emitting element, its light-emitting power is quit low, so that it is not appropriate for practical use. Thus, forming a high-temperature-grown layer of GaN can provide the nitride semiconductor element with preferable crystallinity. However, when a GaN layer is included as a primary layer or the high-temperature-grown layer, this GaN layer absorbs a part of the light from the active layer cause of the self-absorption of the GaN in the ultra-violet region. In the invention, the substrate for growing, the buffer layer, and high-temperature-grown layer of GaN are eliminated after attaching the conductive substrate, so that it can maintain the crystallinity of the nitride semiconductor element appropriately, and can reduce self-absorption.

It should be appreciated that a composition-graded layer may further be formed on or above the high-temperature-grown layer. The composition-graded layer is useful for the LED, which does not have GaN playing a role of recovering crystallinity, capable of emitting in ultra-violet region. It can laminate the nitride semiconductor layer with less defect and high crystallinity. In addition, It should be appreciated that the composition-graded layer may be formed with modulated-doping so as to grade impurity concentration affecting its conductivity. When the nitride semiconductor layer of Si-doped AlGaN is formed thereon for example, the composition-graded layer is formed in the structure graded from undope to the impurity concentration similar to the Si-concentration of the n-type cladding layer. It can laminate the nitride semiconductor layer with further less defect and high crystallinity. Additionally, it should be appreciated that the composition-graded layer may be formed with graded from a high-impurity-concentration region to an undoped layer.

In the nitride semiconductor element of the invention, especially in the light-emitting element, it should be appreciated that a coating layer or a molding material including a fluorescent material, which can absorb a part of or the whole of the light from the active layer then can emit light with different wavelength, may be formed on the nitride semiconductor element with attached to supporting substrate. It can emit light with various wavelengths. Examples of the fluorescent material are shown as follows. $SrAl_2O_4$:Eu; $Y_2SiO_5$:Ce,Tb; $MgAl_{11}O_{19}$:Ce,Tb; $Sr_7Al_{12}O_{25}$:Eu; and (at lease one element selected from the group of Mg, Ca, Sr, and Ba)$Ga_2S_4$:Eu are can be employed as a greenish fluorescent material. In addition, $Sr_5(PO_4)_3Cl$:Eu; $(SrCaBa)_5(PO_4)_3Cl$:Eu; $(BaCa)_5(PO_4)_3Cl$:Eu; (at lease one element selected from the group of Mg, Ca, Sr, and Ba)$_2B_5O_9Cl$:Eu,Mn; and (at lease one element selected from the group of Mg, Ca, Sr, and Ba)$(PO_4)_6Cl_2$:Eu,Mn can be employed as a bluish fluorescent material. Additionally, $Y_2O_2S$:Eu; and $La_2O_2S$:Eu; $Y_2O_3$:Eu; $Gd_2O_2S$:Eu are can be employed as a reddish fluorescent material. Especially, including YAG can emit white light, so that it can be applied to a light source for illumination, etc. widely. The YAG is represented in $(Y_{1-x}Ga_x)_3(Al_{1-y}Ga_y)_5O_{12}$:R (R is at lease one element selected from the group of Ce, Tb, Pr, Sm, Eu, Dy, and Ho. 0<R<0.5), for example $(Y_{0.8}Gd_{0.2})_3Al_5O_{12}$:Ce or $Y_3(Al_{0.8}Ga_{0.2})_5O_{12}$:Ce or the like. In addition, with regard to the fluorescent material, which can absorb a part of or the whole of the light then can emit light with different wavelength; the material, which can absorb a part of or the whole of visible light then can emit light with different wavelength, is limited. Therefore, there is a problem of material selectivity. However, many materials, which can absorb a part of or the whole of the ultra-violet light then can emit light with different wavelength, are known, so that it can select the material according to various applications. One reason to be able to select the material is high efficiency of light-conversion of the fluorescent material absorbing ultra-violet light compared with the efficiency of light-conversion of visible light. White light widely provides possibility such as obtaining white light with high color rendering or the like. The invention can provide a nitride semiconductor light-emitting element with less self-absorption. Further, the invention can provide a white light-emitting element with extremely high efficiency of conversion by coating the fluorescent material.

Fluorescent Material

It is preferable that the fluorescent material used in the invention has particle size with center particle size in the range of 6–50 $\mu$m. It is more preferable that the center particle size is in the range of 15–30 $\mu$m. The fluorescent material with such particle size has a high absorption coefficient, high converting efficiency, and wide range of excited light wavelength. Since the fluorescent material with the particle size less than 6 $\mu$m relatively tends to form aggregate, they sediment in the liquid resin cause of their density, so that it might reduces transmittance of the light, further, its absorption coefficient and the converting efficiency might be poor, and its range of excited light wavelength might be narrow.

In the invention, the particle size is meant a value obtained by the volume-base particle size distribution curve. The volume-base particle size distribution curve is measured by the laser diffraction and scattering method. Specifically, it can be obtained with measurement of sodium hexametaphosphate aqueous solution, in which each substance is dispersed, with 0.05% concentration by laser diffraction type particle size distribution analyzer (SALD-2000A), in the measurement particle size range 0.03 $\mu$m–700 $\mu$m, under circumstance temperature 25° C. and humidity 70%. In the invention, the center particle size is meant a particle size value when the integrated value reaches 50% in the volume-base particle size distribution curve. It is preferable that the content of the fluorescent material with this center particle size is high. It is preferable its content is 20–50%. Employing the fluorescent material with less variation of the particle size can reduce variation of the color, so that the light-emitting device with preferable contrast can be provided.

Yttrium-Aluminum-Oxide System Fluorescent Material

The light-emitting device of the invention employs a fluorescent material based on the yttrium-aluminum-oxide based fluorescent material (YAG system fluorescent material) activated with cerium (Ce) or praseodymium (Pr), which can light with being exited by the light emitted from the semiconductor light-emitting element with the light-emitting layer of the nitride semiconductor.

As the concrete yttrium-aluminum-oxide based fluorescent material, $YAlO_3$:Ce, $Y_3Al_5O_{12}$:Ce(YAG:Ce), $Y_4Al_2O_9$:Ce, or mixture of them may be usable. The yttrium-aluminum-oxide based fluorescent material may include at least one element selected from the group consisting of Ba, Sr, Mg, Ca, and Zn. In addition, adding Si can control or reduce reaction of the crystal growth to make particles of the fluorescent material uniform.

In this specification, the yttrium-aluminum-oxide based fluorescent material activated with cerium is meant in a broad sense, and it includes a fluorescent material capable of fluorescent action having at least one element selected from the group consisting of Lu, Sc, La, Gd, and Sm, with which substitute all or part of the yttrium and/or at least one element selected from the group consisting of Ba, Tl, Ga, and In, with which substitute all or part of the aluminum.

More specifically, it may be a photo-luminescent fluorescent material having a general formula $(Y_zGd_{1-z})_3Al_5O_{12}$:Ce (where $0<z<=1$), or a photo-luminescent fluorescent material having a general formula $(Re_{1-a}Sm_a)_3Re'_5O_{12}$:Ce (where $0<=a<1$; $0<=b<1$; Re is at least one element selected from the group consisting of Y, Gd, La, and Sc; and Re' is at least one element selected from the group consisting of Al, Ga, and In). Since the fluorescent material has a garnet stricture, it is impervious to heat, light, and moisture. Its peak of excitation spectrum can be around 450 nm. The peak of light-emission is around 580 nm, and the distribution of the light-emission spectrum is broad in which the foot of the distribution extends to about 700 nm.

Gd (gadolinium) may be added to the crystal lattice of the photo-luminescent fluorescent material to improve excited light-emission efficiency in the long-wavelength range over 460 nm. Increasing the Gd content shifts the peak wavelength of the light-emission toward long-wavelength side, and also overall wavelength of the light-emission toward long-wavelength side. In other words, if reddish light-emission color is needed, increasing the amount of substitutive Gd can achieve it. On the other hand, the more Gd is increasing, the less luminance of the photo-luminescent by the blue light. Other elements such as Tb, Cu, Ag, Au, Fe, Cr, Nd, Dy, Co, Ni, Ti, Eu may be added as well as Ce, if desirable. If Al in the composition of the yttrium-aluminum-garnet fluorescent material with the garnet structure is partially substituted with Ga, the wavelength of the light-emission shifts toward longer-wavelength region. In contrast, if Y in the composition is partially substituted with Gd shifts the wavelength of the light-emission toward longer-wavelength region.

If a part of Y is substituted with Gd, it is preferable that the percentage of substitutive Gd is less than 10%, and the composition ratio or substitution is 0.03–1.0. In case the percentage of substitutive Gd were less than 20%, the light in the green range would be high and the light in the red range be less. However, increasing content of the Ce can compensate the light in the red range, so as to be desired color tone without reduction of the luminance. Such composition can achieve preferable temperature characteristics, and improve reliability of the light-emitting diode. In addition, to use the photo-luminescent fluorescent material adjusted to emit the light in the red range, the light-emitting device can emit the intermediate color such as pink.

A material for the photo-luminescent fluorescent material can be obtained by mixing oxides or compounds sufficiently, which can become oxide at high temperature easily, as materials of Y, Gd, Al, and Ce according to stoichiometry ratio. The mixed material also can be obtained by mixing: coprecipitation oxides, which are formed by firing materials formed by coprecipitating solution dissolving rare-earth elements, Y, Gd, and Ce, in acid according to stoichiometry ratio with oxalic acid; and an aluminum oxide. After mixing the mixed material and an appropriate amount of fluoride such as barium fluoride, ammonium fluoride as flux, inserting them in to a crucible, then burning them at temperature 1350–1450° C. in air for 2–5 hours, as a result, a burned material can be obtained. Next, the burned material is crushed in water by a ball mill. Then washing, separating, drying it, finally sifting it through a sieve, the photo-luminescent fluorescent material can be obtained.

In the light-emitting device of the invention, the photo-luminescent fluorescent material may be a substance mixed two or more kinds of the yttrium-aluminum-garnet fluorescent material activated with cerium, or can be a substance mixed the yttrium-aluminum-garnet fluorescent material activated with cerium and the other fluorescent materials. Mixing two kinds of the yttrium-aluminum-oxide system fluorescent materials, which have different amount of the substitution from Y to Gd, can achieve the desired color light easily. Especially, when the fluorescent material with higher content of the amount of the substitution is the above fluorescent material, and the fluorescent material with lower content of or without the amount of the substitution is the fluorescent material with middle particle size, both the color rendering characteristics and the luminance can be improved.

Nitride System Fluorescent Material

The fluorescent material used in the invention is a nitride system fluorescent material, which includes N, and can include at least one element selected from the group consisting of Be, Mg, Ca, Sr, Ba, and Zn, at least one element selected from the group consisting of C, Si, Ge, Sn, Ti, Zr, Hf, and is activated with at least one element selected from the group consisting rare-earth elements. In the invention, the nitride system fluorescent material is meant a fluorescent material, which is capable of absorbing the visible, ultraviolet light emitted from the light-emitting element, or the fluorescence from the YAG fluorescent material partially and of emitting a excited light. The fluorescent material according to the invention is silicon nitride such as Mn-added Sr—Ca—Si—N:Eu; Ca—Si—N:Eu; Sr—Si—N:Eu; Sr—Ca—Si—O—N:Eu; Ca—Si—O—N:Eu; and Sr—Si—O—N:Eu systems. The basic component elements of the fluorescent material is represented in the general formulas $L_XSi_YN_{(2/3X+4/3Y)}$:Eu or $L_XSi_YO_ZN_{(2/3X+4/3Y-2/3Z)}$:

Eu (where L is any one element of Sr, Ca, Sr, or Ca). It is preferable that X and Y in the general formulas are X=2, Y=5, or X=1, Y=7, however, it is not specifically limited. As concrete basic component elements, it is preferable that fluorescent materials represented in Mn-added $(Sr_XCa_{1-X})_2Si_5N_8$:Eu; $Sr_2Si_5N_8$:Eu; $Ca_2Si_5N_8$:Eu; $Sr_XCa_{1-X}Si_7N_{10}$:Eu; $SrSi_7N_{10}$:Eu; and $CaSi_7N_{10}$:Eu are employed. Here, the fluorescent material may include at least one element selected from the group consisting of Mg, Sr, Ca, Ba, Zn, B, Al, Cu, Mn, Cr, and Ni. In addition, the invention is not limited in these materials.

L is any one element of Sr, Ca, Sr, or Ca. The composition ratio of Sr and Ca can be varied, if desirable.

Employing Si in composition of the fluorescent material can provide the low cost fluorescent material with preferable crystallinity.

Europium, which is a rare-earth element, is employed as center of fluorescent. Europium mainly has a divalent or trivalent energy level. The fluorescent material of the invention employs $Eu^{2+}$ as the activator against the base material of alkaline-earth-metal system silicon nitride. $Eu^{2+}$ tends to be subject to oxidation. Trivalent $Eu_2O_3$ is available on the market. However, O in $Eu_2O_3$ available on the market is too active, it is difficult to obtain the preferable fluorescent material. It is preferable to use $Eu_2O_3$, from which O is removed out of the system. For example, it is preferable to use europium alone or europium nitride. In addition, when Mn is added, it is not always required.

Added Mn accelerates diffusion of $Eu^{2+}$, and improves light-emitting efficiency such as light-emission luminance, energy efficiency, or quantum efficiency. Mn is included in the material, or is added in the process as Mn alone or Mn compounds, then is burned with the material. In addition, after burned, Mn does not remain in the basic component elements or remains much less than the original content even included. It is considered that Mn flies away in the burning process.

The fluorescent material includes at least one element selected from the group consisting of Mg, Sr, Ca, Ba, Zn, B, Al, Cu, Mn, Cr, and Ni in the basic component elements or with the basic component elements. These elements have the effect increasing the particle size, or improve light-emitting luminance. In addition, B, Al, Mg, Cr, and Ni have the effect reducing persistence.

Such nitride system fluorescent materials is capable of absorbing the blue light emitted from the light-emitting element partially and of emitting a excited light in the region yellow to red. Employing the nitride system fluorescent material with the YAG system fluorescent material in the above light-emitting device can provide the light-emitting device capable of emitting a warm white color by mixing the blue light emitted from the light-emitting element and the light in the region yellow to red from the nitride system fluorescent material. It is preferable that the other fluorescent materials except the nitride system fluorescent material include the yttrium-aluminum-oxide system fluorescent materials activated with cerium. Including the yttrium-aluminum-oxide system fluorescent materials can adjust desired chromaticity. The yttrium-aluminum-oxide system fluorescent material activated with cerium is capable of absorbing the blue light emitted from the light-emitting element partially and of emitting an excited light in the region yellow. The blue light emitted from the light-emitting element and the yellow light of the yttrium-aluminum-oxide system fluorescent material are mixed. Mixing the yttrium-aluminum-oxide system fluorescent material and the fluorescent material capable of emitting red light in the color converting layer, and combining them with blue light emitted from the light-emitting element can provide the light-emitting device emitting white light as mixed color light. It is preferable that its chromaticity of the white-light-emitting device is on blackbody radiation locus in the chromaticity diagram. The light-emitting device emitting whitish mixed light is aimed at improving a special color-rendering index of R9. In a conventional white-light-emitting device combining the bluish-light-emitting element and the yttrium-aluminum-oxide system fluorescent material activated with cerium, its special color-rendering index of R9 around color temperature Tcp=4600 K in nearly zero, and a red color component is not enough. Accordingly, it is required to improve special color-rendering index of R9. In the invention, employing the fluorescent material capable of emitting red light with the yttrium-aluminum-oxide system fluorescent material can improve special color-rendering index of R9 around color temperature Tcp=4600 K to about 40.

Next, a process for producing the fluorescent material $((Sr_XCa_{1-X})_2Si_5N_8$:Eu) used in the invention will be described as follows. However, the process for producing in the invention is not specifically limited. The above fluorescent material includes Mn, O.

1. The materials Sr and Ca are pulverized. It is preferable to use Sr and Ca alone as the materials. However, an imide compound, an amide compound, or the like also can be employed. In addition, the materials Sr, Ca may include B, Al, Cu, Mg, Mn, $Al_2O_3$, and so on. The materials Sr and Ca are pulverized in the glove box under atmosphere with argon. It is preferable that Sr and Ca have the average particle size about 0.1 μm–15 μm, however it is not specifically limited. It is preferable that the purity of Sr and Ca is more than or equal to 2N, however it is not specifically limited. To achieve preferable mixture, at least one element of metal Ca, metal Sr, and metal Eu is alloyed, and nitrided, then pulverized for using as the materials.

2. The material Si is pulverized. It is preferable to use Si alone as the materials. However, a nitride compound, an imide compound, an amide compound, or the like, for example $Si_3N_4$, $Si(NH_2)_2$, and $Mg_2Si$, etc. also can be employed. It is preferable that the purity of the material Si is more than or equal to 3N, however the material may include compounds such as $Al_2O_3$, Mg, metal boride ($CO_3B$, $Ni_3B$, CrB), manganese oxide, $H_4BO_3$, $B_2O_3$, $Cu_2O$, and CuO. Si is also pulverized in the glove box under atmosphere with argon or nitride, similar to the material Si and Ca. It is preferable that the Si compound has the average particle size about 0.1 μm–15 μm.

3. Subsequently, the materials Sr and Ca are nitrided under atmosphere with nitrogen. The equations, as Equation 1 and Equation 2, are $$3Sr+N_2 \rightarrow Sr_3N_2 \qquad \text{(Equation 1)}$$

$$3Ca+N_2 \rightarrow Ca_3N_2 \qquad \text{(Equation 2)}$$

Sr and Ca are nitrided under atmosphere with nitrogen at 600–900° C. for about 5 hours. Sr and Ca are nitrided with mixed together, or are nitrided individually. Finally, a strontium nitride and a calcium nitride are obtained. It is preferable that the strontium nitride and the calcium nitride have high purity. However, a strontium nitride and a calcium nitride on the market also can be employed.

4. The material Si is nitrided under atmosphere with nitrogen. The equation, as Equation 3, is $$3Si+2N_2 \rightarrow Si_3N_4 \qquad \text{(Equation 3)}$$

Silicon Si is also nitrided under atmosphere with nitrogen at 600–900° C. for about 5 hours. Finally, a silicon nitride is obtained. It is preferable that the silicon nitride used in the invention has high purity. However, a silicon nitride on the market also can be employed.

5. The strontium nitride and the calcium nitride, or the strontium-calcium nitride is pulverized. The strontium nitride, the calcium nitride, and the strontium-calcium nitride are pulverized in the glove box under atmosphere with argon or nitrogen.

The silicon nitride is pulverized similarly. In addition, the europium compound $Eu_2O_3$ is also pulverized similarly. Here, the europium oxide is employed as the europium compound, however metal europium, a europium nitride, or the like, can be employed. An imide compound, an amide compound, or the like can be employed as the material Z. It is preferable that the europium oxide has high purity. However, the europium oxide on the market also can be employed. It is preferable that the alkaline-earth-metal nitride, the silicon nitride, and the europium oxide have the average particle size about 0.1–15 μm.

The above materials may include at least one element selected the group consisting of Mg, Sr, Ca, Ba, Zn, B, Al, Cu, Mn, Cr, O, and Ni. In addition, the above elements such as Mg, Zn, and B may be mixed with adjusting content in the processes below. These compounds can be added in the materials alone, normally they are added in the form of compounds. Such compounds are $H_3BO_3$, $Cu_2O_3$, $MgCl_2$, MgO.CaO, $Al_2O_3$, metal boride (CrB, $Mg_3B_2$, $AlB_2$, MnB), $B_2O_3$, $Cu_2O$, CuO, and so on.

6. After pulverized, the strontium nitride, the calcium nitride, and the strontium-calcium nitride, the silicon nitride, and the europium compound $Eu_2O_3$ are mixed, and added with Mn. Since these mixtures undergo oxidation easily, they are mixed under atmosphere with argon or nitrogen in a glove box.

7. Finally, the mixtures of the strontium nitride, the calcium nitride, and the strontium-calcium nitride, the silicon nitride, and the europium compound $Eu_2O_3$ are burned under atmosphere with ammonia. Burning them can provide the fluorescent material represented in formula Mn-added $(Sr_xCa_{1-x})_2Si_5N_8$:Eu. In addition, the ratio of each material can be changed so as to obtain composition of the desirable fluorescent material.

A tube furnace, a small furnace, a high-frequency furnace, a metal furnace, or the like can be used for burning. The burning is performed at burning temperature in the range 1200–1700° C., however it is preferable that the burning temperature is at 1400–1700° C. It is preferable to use one-stage burning, in which temperature rises slowly and burning is performed at 1200–1500° C. for several hours. However, Two-stage burning (multi-stage burning), in which first-stage burning is performed at 800–1000° C., and temperature rises slowly, then second-stage burning is performed at 1200–1500° C., also can be used. It is preferable that the materials of the fluorescent material are burned in a crucible or a boat of a boron nitride (BN) material. Instead of the crucible of a boron nitride material, a crucible of alumina also can be used.

The desired fluorescent material can be obtained by the above method.

The nitride system fluorescent material is used as the fluorescent material capable of emitting reddish light in the light-emitting device as mentioned above. However, the light-emitting device can have the above YAG system fluorescent material and the fluorescent material capable of emitting reddish light. Such the fluorescent material capable of emitting reddish light is a fluorescent material, which can emit excited light by the light with wavelength 400–600 nm, for example $Y_2O_2S$:Eu, $La_2O_2S$:Eu, CaS:Eu, SrS:Eu, ZnS:Mn, ZnCdS:Ag,Al, ZnCdS:Cu, Al, and so on. Using the fluorescent material capable of emitting reddish light with the YAG system fluorescent material can improve color rendering o the light-emitting device.

Regarding the YAG system fluorescent material and the fluorescent material capable of emitting reddish light, for representative example the nitride system fluorescent material, formed as mentioned above, one layer of the color-converting layer in the side end surface of the light-emitting element includes two or more kinds of them, or two layers of the color-converting layer include one or more kinds of them respectively. Such constitution can provide mixed color light from different kinds of the fluorescent materials. In this case, it is preferable that each kind of the fluorescent materials has similar average particle size and similar shape for mixing the light from each kind of the fluorescent materials, and for reducing color variation. In addition, since the light converted its wavelength by the YAG system fluorescent material is partially absorbed by the nitride system fluorescent material, it is preferable that the nitride system fluorescent material is provided in the position closer to the side end surface of the light-emitting element than the YAG system fluorescent material. Accordingly the light converted its wavelength by the YAG system fluorescent material can avoid to be absorbed partially by the nitride system fluorescent material. Therefore, the color rendering of the mixed light of the YAG system fluorescent material and can be improved compared with mixing both fluorescent materials together.

The method of the invention for producing a nitride semiconductor element having at least a conductive layer, a first terminal, a nitride semiconductor with a light-emitting layer, and a second terminal, from a supporting substrate successively, comprising: a growing step for growing the nitride semiconductor having at least a second conductive type nitride semiconductor layer, the light-emitting layer, and a first conductive type nitride semiconductor layer, on a different material substrate; subsequently, a attaching step for attaching the supporting substrate to the first conductive type nitride semiconductor layer side of the nitride semiconductor with interposing the first terminal between them; and subsequently, a different-material-substrate-eliminating step for eliminating the different material substrate so as to expose the second conductive type nitride semiconductor layer. When an n-type layer, a p-type layer of the nitride semiconductor layer are formed on the different material substrate successively, eliminating the different material substrate (sapphire, etc.) after attaching the supporting substrate exposes the surface of the n-type layer. A damaged layer is formed in the surface of the n-type layer by eliminating the different material substrate with polishing. However, the damaged layer can be eliminated by chemical polishing, therefore eliminating the different material substrate may not reduce its characteristics.

The conductive layer is formed by a eutectic junction in the attaching step. The attaching step is performed by thermocompression bonding. It is preferable that the temperature is 150–350° C. In the case more than or equal to 150° C., it can accelerate diffusion of the metal of the conductive layer, so that the eutectic with uniform density distribution can be formed. Thus, It can improve intimate contact between the nitride semiconductor element and the supporting substrate. In the case over the 350° C., the region of the diffusion may spread to the attaching region, so that it may reduce the intimate contact. The eliminating step eliminates the different material substrate by laser irradiation, polishing, or chemical polishing. The above step can make the exposed surface of the nitride semiconductor element mirror-like surface.

The method further includes an asperity-portion-forming step for forming an asperity portion on the exposed surface of the nitride semiconductor, which is the second type conductive nitride semiconductor layer, after the different-material-substrate-eliminating step. It can make the emitted light to be diffused at the asperity portion. Therefore, the light, which had total internal reflection conventionally, can be directed upward, and can outgo to outside of the element.

The method further includes a step for forming a second insulating protect layer on the exposed surface of the nitride semiconductor, which is the second type conductive nitride semiconductor layer, after the different-material-substrate-eliminating step. It can prevent short circuit when chipping by dicing, etc. to separate into chips. $SiO_2$, $TiO_2$, $Al_2O_3$, and $ZrO_2$ can be employed as the protect layer. The method further includes a step for forming an asperity portion on the second insulating protect layer. It is preferable that the refractive index of the second insulating protect layer is more than or equal to 1 and not more than 2.5. Because the refractive index of the second insulating protect layer is between the nitride semiconductor element and the air, the outgoing efficiency of the light can be improved. It is more preferable that it is more than or equal to 1.4 and not more than 2.3. The constitution mentioned above can achieve more than or equal to 1.1 times of the outgoing efficiency of the light as much as that without the protect layer. The protect layer also can prevent surface deterioration.

The method further includes a step for breaking the nitride semiconductor into chips by etching the exposed surface of the nitride semiconductor after the different-material-substrate-eliminating step. In the light-emitting element of the invention, first, the semiconductor 2 is etched from the light-outgoing side until the first insulating layer 4, then the light-emitting element is formed into chips on the supporting substrate 11, to form the extending region of the first protect layer 4. At that time, though the semiconductor 2 is separated individually, the supporting substrate is not separated, in the wafer. Subsequently, the second insulating protect layer 7 is formed on the semiconductor 2 and the extending region of the first protect layer 4 except wire-bonding region of the second terminal 6. Forming the second insulating protect layer 7 on the side surfaces and the top surface of the semiconductor 2 can reduce physical damages cause of electric shorting and dust attachment. Next, after the second insulating protect layer 7 is formed, the light-emitting element is chipped by dicing from the supporting substrate 11 side. Consequently, a chip of the light-emitting element is obtained.

Subsequently, the light-emitting device is formed. First, the light-emitting element is mounted on a heat sink with lead frames, then conductive wires are bonded from the light-emitting element to the lead frames. After that, transparent glass packages it, and the light-emitting device is obtained (FIG. 19).

In a light-emitting device as another example, a package resin with a heat sink is prepared, and the light-emitting element is formed on the heat sink, then conductive wires are bonded from the light-emitting element to the lead frames. Subsequently, mold resin such as silicone is applied on the light-emitting element. Further, a lens is formed thereon, and the light-emitting device is obtained (FIG. 20).

It is preferable that the light-emitting device has a protect element for static protection of the light-emitting element.

The invention can improve the outgoing efficiency of the light extremely without increasing its voltage. The invention provides the opposed terminal structure, so that selecting the supporting substrate can improve thermal dissipation and life characteristics. Employing the conductive substrate as the supporting substrate can provide a one-wire structure. In addition, the conductive supporting substrate is employed, so that die-bonding to a package such as a lead frame by a conductive material can provide continuity. Therefore, it is not necessary to provide a pad terminal for a first terminal, so that the area of light-emission can be increased. When the face-down structure (n-side is surface) is used, the outgoing efficiency of the light can be improved. Additionally, the opposed terminal structure can widen the diameter. Providing asperity and aluminum at boundary surface thereof reflects the light, so that it can improve the outgoing efficiency of the light.

The method for producing a nitride semiconductor element of the invention can provide the nitride semiconductor element with the nitride semiconductor layer having fewer nicks or cracks occurred at exfoliation and with high thermal dissipation.

Further, the nitride semiconductor element of the invention has the coating layer including the fluorescent material, which can absorb a part of or the whole of the light from the active layer then can emit light with different wavelength, to emit the light with various wavelengths. Especially, it is preferable for a light source of illumination to include YAG so as to emit white light.

The above and further objects and features of the invention will more fully be apparent from the following detailed description with accompanying drawings.

BRIEF DESCRIPTION OF THE DRAWINGS

FIGS. 3A–3F schematically show cross-sectional views of an embodiment of the invention.

FIGS. 4A–4C schematically show cross-sectional views of another embodiment of the invention.

FIGS. 12A–12F schematically show cross-sectional views and a plan view of another embodiment of the invention.

DETAILED DESCRIPTION OF THE PREFERED EMBODIMENTS

The nitride semiconductor element of the invention includes a conductive layer, a first terminal, a first conductive type nitride semiconductor layer interposing the first terminal and a first insulating protect layer between the conductive layer and thereof, a nitride semiconductor with a light-emitting layer, and a second terminal, on or above a supporting substrate successively. The nitride semiconductor element has a structure, in which the first terminal and the second terminal oppose each other. In addition, it is preferable that the second terminal is disposed on the portion corresponding to rest of the position, on which the first terminal is disposed. The nitride semiconductor layers except the light-emitting layer in the nitride semiconductor have a band gap larger than the light-emission band gap.
Embodiment 1

The following description will describe a process of producing an embodiment of the nitride semiconductor element according to the invention with reference to the drawings.

Figure 1A:
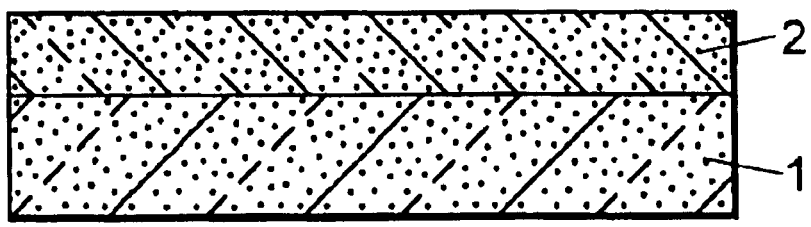
FIGS. 1A–1C schematically show cross-sectional views of a process of producing of the invention.
Figure 1B:
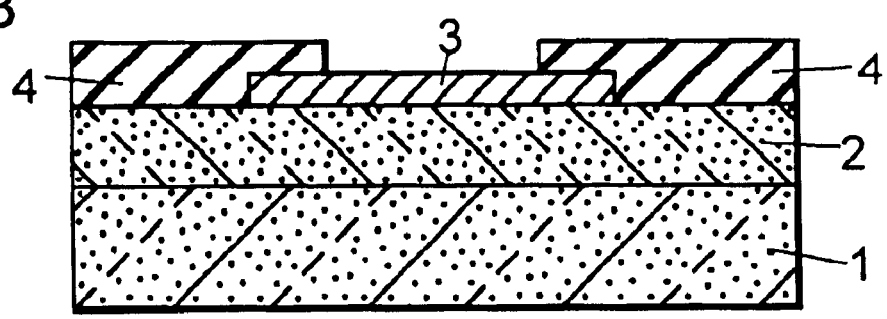
Figure 1C:
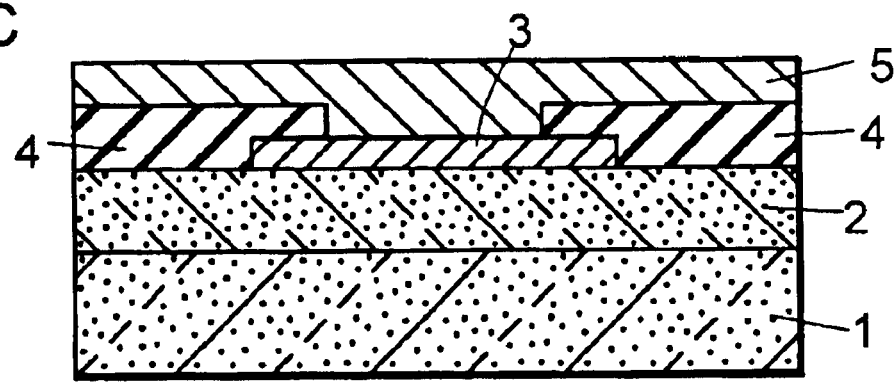
Figure 2A:
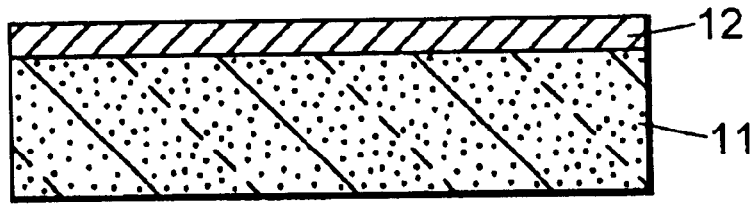
FIGS. 2A–2C schematically show cross-sectional views of a process of producing of the invention.
Figure 2B:
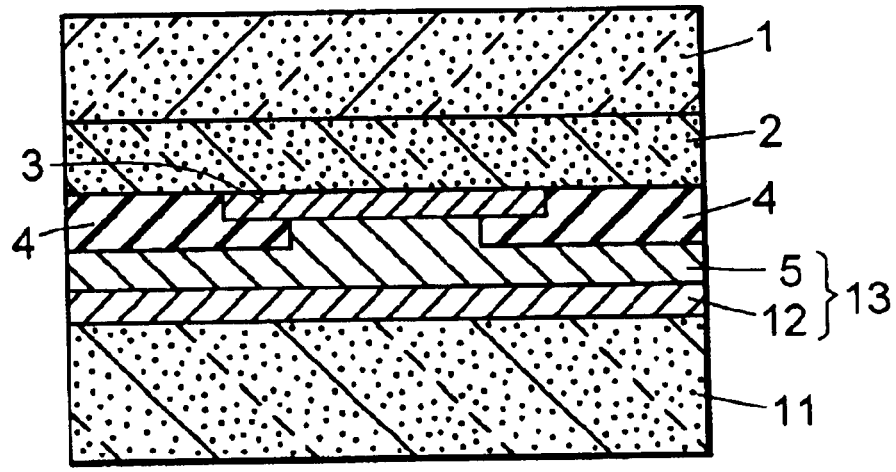
Figure 2C:
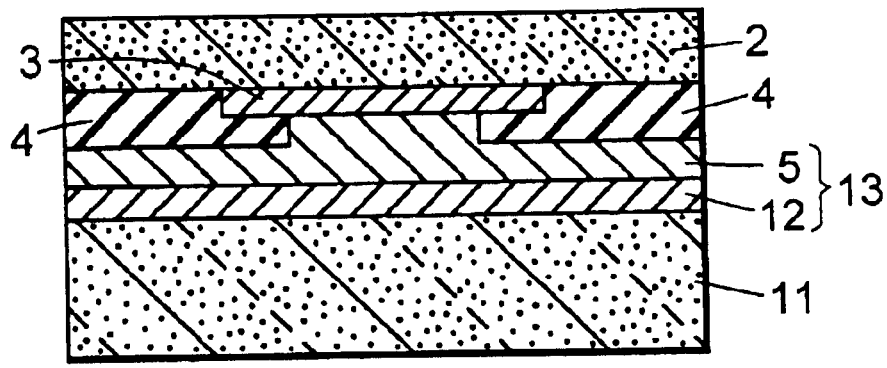
Figure 3A:
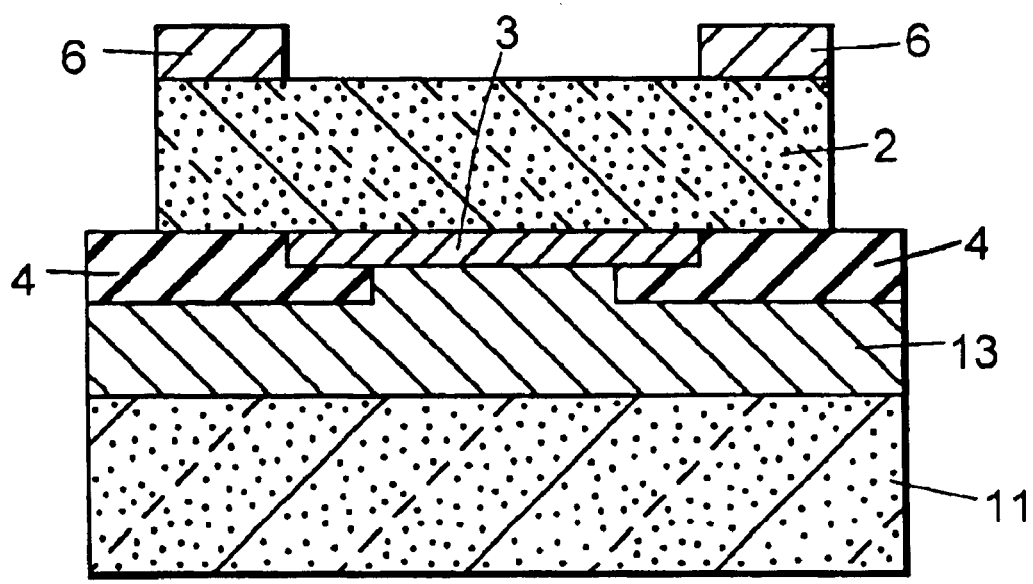
Figure 11A:
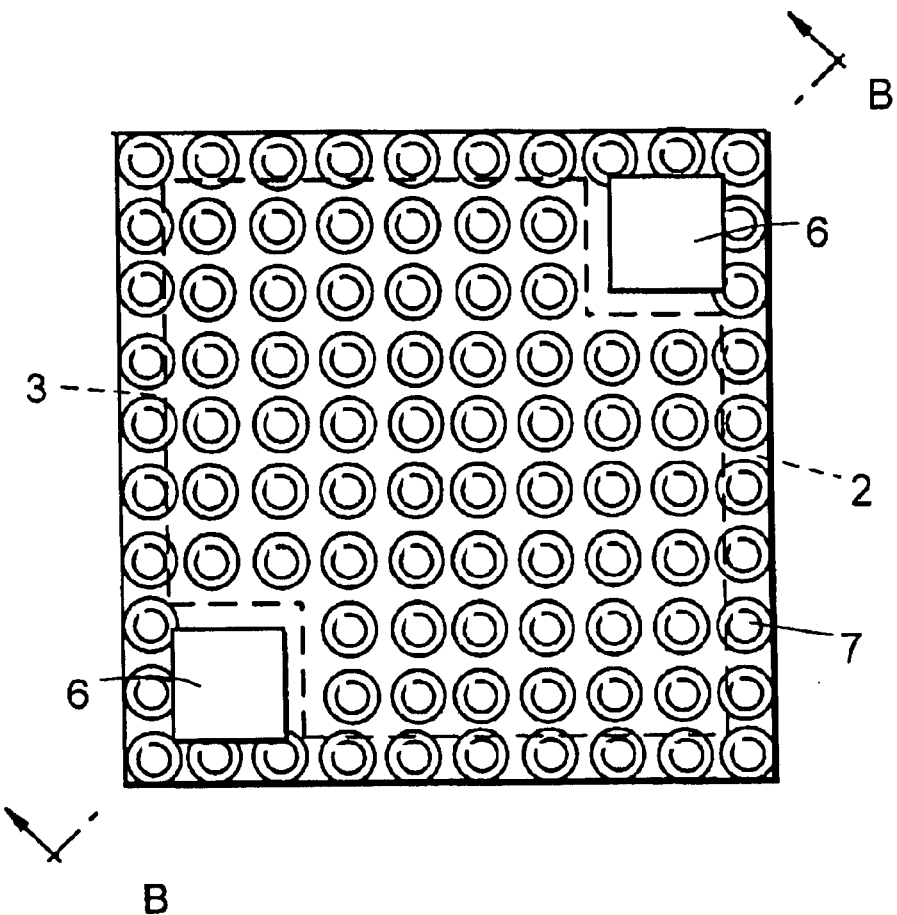
FIGS. 11A–11B schematically show cross-sectional views and a plan view of another embodiment of the invention.
Figure 11B:
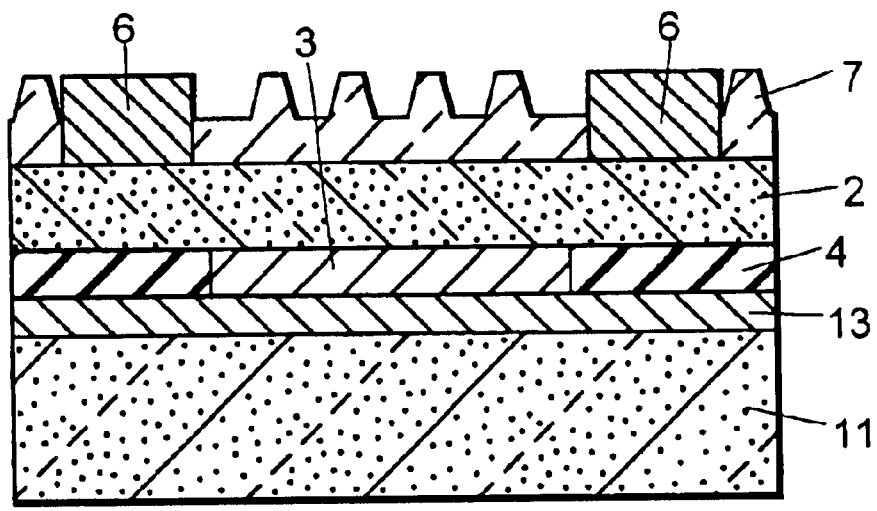

The nitride semiconductor 2 including at least a second conductive type nitride semiconductor layer, a light-emitting layer, a first conductive type nitride semiconductor layer is grown on a different material substrate 1 such as sapphire (FIG. 1A). Subsequently, a first terminal 3 (p-type terminal, for example) is formed on the nitride semiconductor layers. Next, a first insulating protect layer 4 is formed on an opening portion, or an exposed portion of the nitride semiconductor (FIG. 1B). Further, a conductive layer 5 for alloying at attachment is formed (FIG. 1C). It is preferable that the conductive layer has a three-layer structure composed of an intimate-contact, a barrier layer, and a eutectic layer. On the other hand, a supporting substrate 11 is prepared. It is preferable that a conductive layer 12 is also formed on the surface of the supporting substrate (FIG. 2A). Subsequently, the nitride semiconductor element and the supporting substrate are attached by thermocompression bonding (FIG. 2B). Each of attached surfaces is alloyed as a conductive layer 13 after attaching. Then, the different material substrate is eliminated (FIG. 2C). After the different material substrate is eliminated, the nitride semiconductor layer is broken into chips, and a second terminal is formed on an exposed portion of the second conductive type nitride semiconductor layer (FIG. 3A). It should be appreciated that asperity may be formed on the exposed portion of the second conductive type nitride semiconductor layer except the portion forming the second terminal (FIG. 4). Subsequently, a second insulating protect layer covers the top surface of the nitride semiconductor element except a region for wire-bonding (FIG. 3B, FIG. 4B), and the nitride semiconductor element is obtained by dicing into chip. In addition, it should be appreciated that the second insulating protect layer may be formed in an asperity shape (FIG. 5, FIG. 11).

It is adequate that the different material substrate 1 is a substrate capable of epitaxial growth for the nitride semiconductor 2, and the size or thickness of the different material substrate is not restricted especially. An insulating substrate such as sapphire with any one of C-facet, R-facet, or A-facet as a principal surface, or spinel ($MgAl_2O_4$); silicon carbide (6H, 4H, 3C); silicon; ZnS; ZnO; Si; GaAs; diamond; and an oxide substrate such as lithium niobate, gallium acid neodymium, which are capable of lattice junction with nitride semiconductor, can be employed as the different material substrate. In addition, when having enough thickness (several tens of $\mu$m) capable of device processing, a nitride semiconductor substrate such as GaN or AlN can be employed. The different material substrate with off angle can be employed. It is preferable that the angle is 0.1–0.5 degrees, and is more preferable that the angle is 0.05–0.2 degrees, when sapphire with C-facet is employed.

Further, the nitride semiconductor grown above the different material substrate is grown with interposing a buffer layer between them. It is preferable that nitride semiconductor represented in the general formula $Al_aGa_{1-a}N$ (0=a= 0.8) is employed, and it is more preferable that nitride semiconductor represented in $Al_aGa_{1-a}N$ (0=a=0.5) is employed as the buffer layer. It is preferable that the thickness of the buffer layer is 0.002–0.5 $\mu$m. It is more preferable that it is 0.005–0.02 $\mu$m. In addition, it is further more preferable that it is 0.01–0.02 $\mu$m. It is preferable that the temperature of growing the buffer layer is 200–900° C. It is more preferable that it is 400–800° C. Thus dislocation or pits on the nitride semiconductor can be reduced. Furthermore, it should be appreciated that $Al_xGa_{1-x}N$ (0=x= 1) layer may be grown on the different material substrate by the ELO (Epitaxial Lateral Overgrowth) method. The ELO (Epitaxial Lateral Overgrowth) method grows nitride semiconductor in lateral direction, and bends pierced dislocation so as to converge, so that the dislocation is reduced.

An LED element of nitride semiconductor will be described in detail as follows. After the buffer layer is grown at low temperature on the different material substrate, the second conductive type nitride semiconductor layer described below is formed. It is preferable that a high-temperature-grown layer, which is grown at high temperature, is formed on the buffer layer. Undoped GaN or GaN doped with n-type impurity can be employed as the high-temperature-grown layer. It is preferable to employ the undoped GaN for growing in high crystallinity. It is preferable that the thickness of the high-temperature-grown layer is more than or equal to 1 $\mu$m. It is more preferable that it is 3 $\mu$m. It is preferable that the growing temperature of the high-temperature-grown layer is 900–1100° C. It is more preferable that it is more than or equal to 1050° C.

Consequently, an n-type contact layer is grown. It is preferable that the composition $Al_jGa_{1-j}N$ (0<j<0.3), whose band gap is wider than the active layer, is formed. However the thickness of the n-type contact layer is not restricted especially, it is preferable that it is more than or equal to 1 $\mu$m, and it is more preferable that it is more than or equal to 3 $\mu$m. In addition, however the n-type impurity concentration of the n-type contact layer is not restricted especially, it is preferable that it is $1\times10^{17}$–$1\times10^{20}/cm^3$, and it is more preferable that it is $1\times10^{18}$–$1\times10^{19}/cm^3$. Additionally, the n-type impurity concentration can be graded. In addition, grading composition of Al can provide the effect as a cladding layer, which confines carrier.

The light-emitting layer (active layer) used in the invention has a quantum well structure, which includes at least a well layer of $Al_aIn_bGa_{1-a-b}N$ (0=a=1 0=b=1, a+b=1) and a barrier layer of $Al_cIn_dGa_{1-c-d}N$ (0=c=1, 0=d=1, c+d=1). It is more preferable that the well layer, the barrier layer are formed of $Al_aIn_bGa_{1-a-b}N$ (0<a=1 0<b=1, a+b<1), $Al_cIn_dGa_{1-c-d}N$ (0<c=1, 0<d=1, c+d<1) respectively. Any type of Undope, n-type impurity doped, and p-type impurity doped nitride semiconductor can be employed as the active layer. However it is preferable that the undoped or the n-type impurity doped nitride semiconductor is employed for the light-emitting element with high power. It is more preferable that the well layer is formed in undpoped and the barrier layer is formed in n-type impurity doped. It can improve the output and the efficiency of light-emission of the light-emitting element.

Including Al in the well layer can provide short wavelength, which is a difficult wavelength range to be obtained by the conventional well layer of InGaN and is around 365 nm of wavelength corresponding to the band gap of GaN specifically.

It is preferable that the thickness of the well layer is more than or equal to 1 nm and not more than 30 nm. It is more preferable that it is more than or equal to 2 nm and not more than 20 nm. It is further more preferable that it is more than or equal to 3.5 nm and not more than 20 nm. Because the well layer may not have the effect appropriately, when it is less than 1 nm. Further, when it is more than 30 nm, the crystallinity of quaternary of InAlGaN may be reduced, so that the characteristics of the element may be reduced. In addition, when it is more than or equal to 2 nm, it can provide the layer with less unequal thickness and with relative uniform layer-quality. Additionally, when it is not more than 20 nm, it can grow the crystal while reducing the occurrence of crystal fault. In addition, when the thickness is more than or equal to 3.5 nm, it can improve the output. Because the thickness of the well layer is increased, light-emitting recombination is performed in high light-emission efficiency and in high internal quantum efficiency against numbers of carriers as an LD driven by a larger amount of current. The effect can be achieved especially in a multi-quantum-well structure. When its thickness is more than or equal to 5 nm in a single quantum layer, the effect can be achieved for improving output as mentioned above. However the number of the well layers is not restricted, when it is more than or equal to 4, it is preferable that the thickness of the well layers is not more than 10 nm so as to reduce the thickness of the active layer. Because when the thickness of each layer composing the active layer is thick, the total thickness of the active layer should be thick, so that it is prone to increase Vf. It is preferable that the multi-quantum-well structure has at least one well layer, whose thickness is in the above range, or not more than 10 nm. It is more preferable that the thickness of all the well layers is not more than 10 nm, as mentioned above.

Further, it is preferable that the barrier layer is doped with p-type impurity or n-type impurity, or undoped, and is more preferable that it is doped with n-type impurity or undoped, similar to the well layer. For example, when n-type impurity is doped in the barrier layer, it is required that its concentration is at least more than or equal to $5\times10^{16}/cm^3$. It is preferable that it is more than or equal to $5\times10^{16}/cm^3$ and not more than $2\times10^{18}/cm^3$ in an LED, for example. In addition, it is preferable that it is more than or equal to $5\times10^{17}/cm^3$ and not more than $1\times10^{20}/cm^3$, and it is more preferable that it is more than or equal to $1\times10^{18}/cm^3$ and not more than $5\times10^{19}/cm^3$ in a high-power LED, or LD. In this case, it is preferable that the well layer does not include n-type impurity substantially, or is grown while undoped. In addition, when n-type impurity is doped in the barrier layer, all barrier layers in the active layer can be doped, or a part of them can be doped the rest of them can be undoped. Here, when a part of the barrier layers are doped with n-type impurity, it is preferable that the barrier layers in the n-type layer side in the active layer is doped. For example, doping into the n-th barrier layer Bn (n is a positive integer) from the n-type layer side can inject electrons into the active layers effectively. So that it can provide the light-emitting element with high light-emission efficiency and high internal quantum efficiency. Regarding the well layers, doping into the m-th well layer Wm (m is a positive integer) from n-type layer side can also provide the effect similar to the barrier layers. Additionally, doping both the barrier layer and the well layer can provide the similar effect.

In the light-emitting element of the invention, it is required to employ nitride semiconductor, whose band gap is wider than the well layer, as the barrier. Especially, when the wavelength of light-emission of the well layer is in the range, which is not more than 380 nm, it is preferable that quaternary crystal of AlInGaN represented in general formula $Al_cIn_dGa_{1-c-d}N$ (0<c=1, 0=d=1, c+d<1) or ternary crystal of AlGaN is employed as the barrier layer. Al composition ratio c of the barrier layer is higher than Al composition ratio a of the well layer, or c>a, and it can provide sufficient band gap energy between the well layer and the barrier layer, so that it can provide the light-emitting element having the quantum well structure with high light-emission efficiency. In addition, when the barrier layer includes In (d>0), it is preferable that In composition ratio d is not more than 0.1. It is more preferable that it is not more than 0.05. If In composition ratio d is more than 0.1, the reaction between Al and In is accelerated at growing, so that the crystallinity may be reduced, and the layer can not be formed appropriately. When In composition ratio d is not more than 0.05, it can further improve the crystallinity, so that preferable layer can be formed.

Further, because the difference of the band gap energy is provided by Al composition ratio mainly, and In composition ratio d of the barrier layer can be applied in wider composition ratio range compared with In composition ratio b, it is possible to set as d=b. In this case, the critical thickness of the well layer and the barrier layer can be varied, so that it is possible to set the thickness spontaneously. Therefore, the active layer with desired characteristics can be designed. It is preferable that the thickness of the barrier layer is more than or equal to 1 nm and not more than 30 nm, and is more preferable that it is more than or equal to 2 nm and not more than 20 nm. Because when it is less than 1 nm, a uniform layer cannot be formed, and it cannot have the effect as the barrier layer sufficiently. In addition, when it is more than 30 nm, the crystallinity may be reduced.

Subsequently, the first conductive type nitride semiconductor is formed on the light-emitting layer. Here, a plurality of layers, which is p-type layers, is formed. First, it is adequate to form composition, whose band gap is wider than the well layer, capable of confinement of carriers as a cladding layer, however it is not restricted, $Al_kGa_{1-k}N$ (0=k<1) can be employed, and it is preferable that $Al_kGa_{1-k}N$ (0<k<0.4) is employed especially. However the thickness is not restricted especially, it is preferable that it is 0.01–0.3 μm. It is more preferable that it is 0.04–0.2 μm. It is preferable that the p-type impurity of the cladding layer is $1\times10^{18}$–$1\times10^{21}$/cm$^3$. It is more preferable that it is $1\times10^{19}$–$5\times10^{20}$/cm$^3$.

When the p-type impurity concentration is in the above range, bulk resistance can be reduced without reduction of the crystallinity. A single-layer or a multi-layer (supperlattice structure) can be used as the p-type cladding layer. In a multi-layer, the multi-layer is composed of the above $Al_kGa_{1-k}N$ and the nitride semiconductor, whose band gap is smaller than that, preferably. For example, $In_lGa_{1-l}N$ (0=l<1), $Al_mGa_{1-m}N$ (0=m<1, m>1) can be employed as the smaller band gap layer, similar to the n-type cladding layer.

In the supperlattice structure, it is preferable that thickness of one layer, or the thickness of each layer composing the multi-layer, is not more than 100 Å. It is more preferable that it is not more than 70 Å. It is further more preferable that it is 10–40 Å. In addition, when the p-type cladding layer is composed of the larger band gap layer and the smaller band gap layer, at least one of the a band gap larger layer and the smaller layer can be doped with p-type impurity. Additionally, when both of the a band gap larger layer and the smaller layer are doped, the amount of doping can be same, or can be different.

Subsequently, a p-type contact layer is formed on the p-type cladding layer. $Al_fGa_{1-f}N$ (0=f<1) can be employed as the p-type contact layer. Especially, forming $Al_fGa_{1-f}N$ (0=f<0.3) can provide preferable ohmic contact with the first terminal as an ohmic terminal. It is preferable that the p-type impurity concentration is more than or equal to $1\times10^{17}$/cm$^3$. In addition, it is preferable that the p-type contact layer has composition grading structure, p-type impurity concentration is higher side and the mixed crystal ratio of Al is smaller in the conductive substrate therein. In this case, the composition of the composition grading structure can be varied continuously, or can be varied discontinuously, in multi stages. For example, the p-type contact layer can include a first p-type contact layer, which has high p-type impurity concentration and low Al composition ratio and is contact with the ohmic terminal; and a second p-type contact layer, which has low p-type impurity concentration and high Al composition ratio. The first p-type contact layer can provide preferable ohomic contact. The second p-type contact layer can prevent self-absorption.

The nitride semiconductor is grown by metal-organic chemical vapor deposition (MOCVD), halide vapor-phase epitaxy (HVPE), molecular beam epitaxy (MBE), etc., in the invention.

Subsequently, when the nitride semiconductor is formed as n-type nitride semiconductor layer, p-type nitride semiconductor layer successively, after the nitride semiconductor 2 is grown on the different material substrate 1 (FIG. 1A), the wafer is retrieved up from a reactor, then it is annealed under atmosphere with oxygen at more than or equal to 450° C. Thus, hydrogen, which bond with the p-type nitride semiconductor layer, is removed, so that the p-type nitride semiconductor layer with p-type conductivity is formed.

Subsequently, the first terminal capable of ohmic contact with the surface of the p-type nitride semiconductor layer, or first conductive type nitride semiconductor layer, is formed. The first terminal 3 can be formed of Ni, Au, W, Pt, Ti, Al, Ir, Rh, Ag, Ni—Au, Ni—Au—RhO, Rh—Ir, Rh—Ir—Pt, etc. It is preferable that the first terminal is formed of Rh, Ag, Ni, Au, etc., which have high reflectivity. Then it is annealed under atmosphere with oxygen. The thickness of the first terminal is 0.05–0.5 µm.

Subsequently, a first insulating protect layer 4 is formed on an exposed portion of the nitride semiconductor 2, on which the first terminal 3 is formed (FIG. 1B). A single-layer or a multi-layer such as $SiO_2$, $Al_2O_3$, $ZrO_2$, and $TiO_2$ can be employed as the material of the first insulating protect layer. It should be appreciated that a metal layer with high reflectivity such as Al, Ag, and Rh may further be formed on the attachment surface with the supporting substrate. The metal layer increases the reflectivity, so that it can improve the outgoing efficiency of the light. Then, a conductive layer 5 formed of at least one element selected from the group of Au, Sn, Pd, and In is formed on the attachment surface with the supporting substrate (FIG. 1C). In addition, while forming the first terminal with Ag can improve the effect of outgoing of the light, it is prone that migration of said Ag occurs when operating under high temperature, high humidity. If the migration occurs, a leakage current appears. Therefore, when Ag is employed as the first terminal, RhO is formed as a first layer of the conductive layer 5 without forming the first insulating protect layer 4. When RhO is formed the whole surface, it can cover Ag. Thus, the migration of Ag can be reduced, and it can achieve the effect of outgoing of the light.

On the other hand, the supporting substrate 11 to be attached onto the conductive-layer-forming surface of the nitride semiconductor is prepared (FIG. 2A). Cu—W, Cu—Mo, AlSiC, AlN, Si, SiC, Cu-diamond, etc., as a metal-ceramic composite materials or the like, can be employed as a concrete material. For example, its general formula can be represented as $Cu_xW_{1-x}$ (0=x=30), $Cu_xMo_{1-x}$ (0=x=50). When AlN, which is an insulating material, is used as the supporting substrate, it has advantage for disposing the chip onto a circuit such as a printed board. In addition, using Si provide advantage for low cost and for chipping with ease. It is preferable that the thickness of the supporting substrate is 50–500 nm. Making the supporting substrate thinner in the above range can improve thermal dissipation. Additionally, it should be appreciated that the attachment surface with the nitride semiconductor or the opposite surface of the supporting substrate may have asperity. It is preferable that it has a structure with an intimate contact layer, a barrier layer, and a eutectic layer in the attachment surface. It can prevent diffusion with the first terminal. These compose a conductive layer 12 in the supporting substrate side. For example, a metal layer such as Ti—Pt—Au, Ti—Pt—Sn, Ti—Pt—Pd, Ti—Pt—AuSn, W—Pt—Sn, RhO—Pt—Sn, RhO—Pt—Au, RhO—Pt—(Au, Sn), etc. is formed. The metal layer is alloyed by eutectic, and it becomes the conductive layer 13 in a later process. In addition, it is preferable that the attachment surface metals of the supporting substrate side and the nitride semiconductor side are deferent. Because they can be eutectic at low temperature, and its melting point can increase after eutectic.

Subsequently, the conductive-layer-forming surface of the supporting substrate 11 and the conductive-layer-forming surface of the nitride semiconductor element face each other, then thermocompression bonding is performed (FIG. 2). Heat more than or equal to 150° C. is applied with press. It is preferable that both attachment surfaces of the supporting substrate side and the nitride semiconductor side have the intimate contact layer, the barrier layer, and the eutectic layer. The intimate contact layer is a layer for high intimate contact with the first terminal. It is preferable that it formed with any metal of Ti, Ni, W, and Mo. The barrier layer is a layer for preventing diffusion of the metal composing the eutectic layer into the intimate contact layer. It is preferable that Pt or W is employed. In addition, it should be appreciated that a Au layer with the thickness approximately 0.3

μm may be formed between the barrier layer and the eutectic layer, for further preventing diffusion of the metal of the eutectic layer into the intimate contact layer. At attachment, (first terminal)/(Ti—Pt—AuSn—Pt—Ti)/(supporting substrate, First terminal/RhO—Pt—AuSn—Pt—Ti)/ (supporting substrate), (first terminal)/(Ti—Pt—PdSn—Pt—Ti)/(supporting substrate), (first terminal)/(Ti—Pt—AuSn—Pt—RhO)/(supporting substrate) is formed. Thus, it can form alloy with high peel strength. Forming the conductive layer with eutectic can attach at low temperature, and can provide high bond strength. Attaching at low temperature can provide the effect for preventing the warpage.

Subsequently, the different material substrate is eliminated by laser irradiation from the supporting substrate side, or grinding (FIG. 2C). After the different material substrate is eliminated, the desired layer, which is the second conductive type nitride semiconductor layer, is exposed by CMP process (chemical mechanical polishing) for the exposed nitride semiconductor. In this process, the GaN layer grown at high temperature is eliminated, so that the influence of the absorption can also eliminated in the LED with light-emission wavelength in the ultra-violet region. This process can remove a damaged layer, and can adjust the thickness of the nitride semiconductor layer and the surface roughness. Then, outer region etching is performed for chipping the nitride semiconductor element by RIE, etc. so as to eliminate outer region of the nitride semiconductor layer.

Subsequently, a second terminal 6 is formed on the exposed portion of the second conductive type nitride semiconductor layer (FIG. 3A). When an n-type terminal is used as the second terminal, Ti—Al—Ni—Au, W—Al—W—Pt—Au, Al—Pt—Au, etc. can be employed. The thickness of the second terminal is 0.1–1.5 μm. In addition, it should be appreciated that the exposed surface the second conductive type nitride semiconductor layer may be formed in asperity (dimple processing) by RIE, etc. (FIG. 4A). It is preferable that it is formed in the region except surface formed the second terminal thereon. The asperity can be formed in a mesa type or a reverse-mesa type in a cross-sectional view, and can be formed in an island shape, a grid pattern shape, a rectangular shape, or a polygonal shape in a plan view.

Figure 3B:
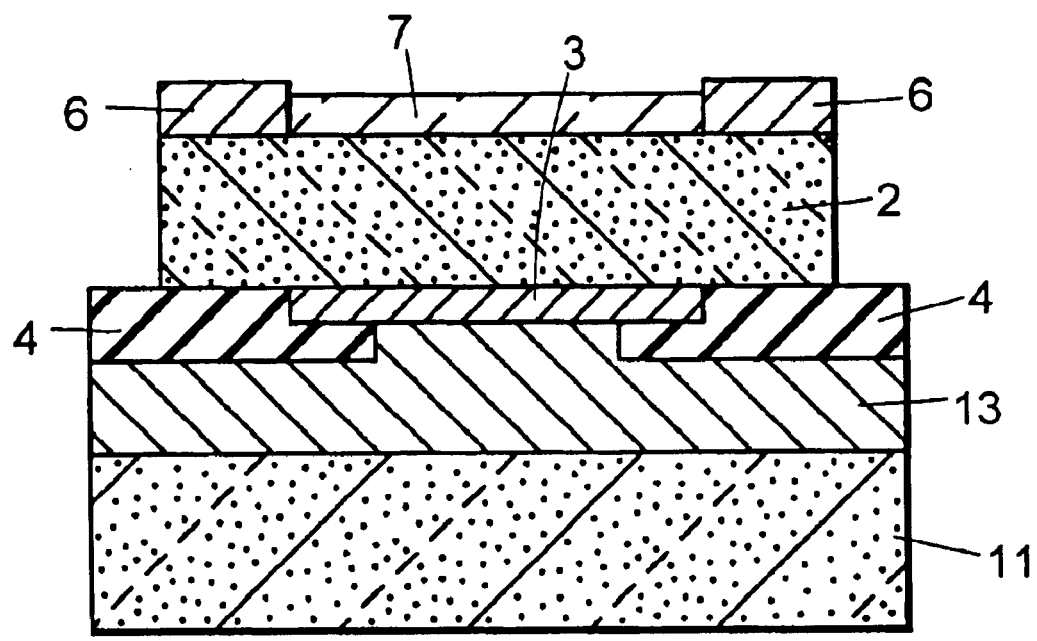
Figure 3C:
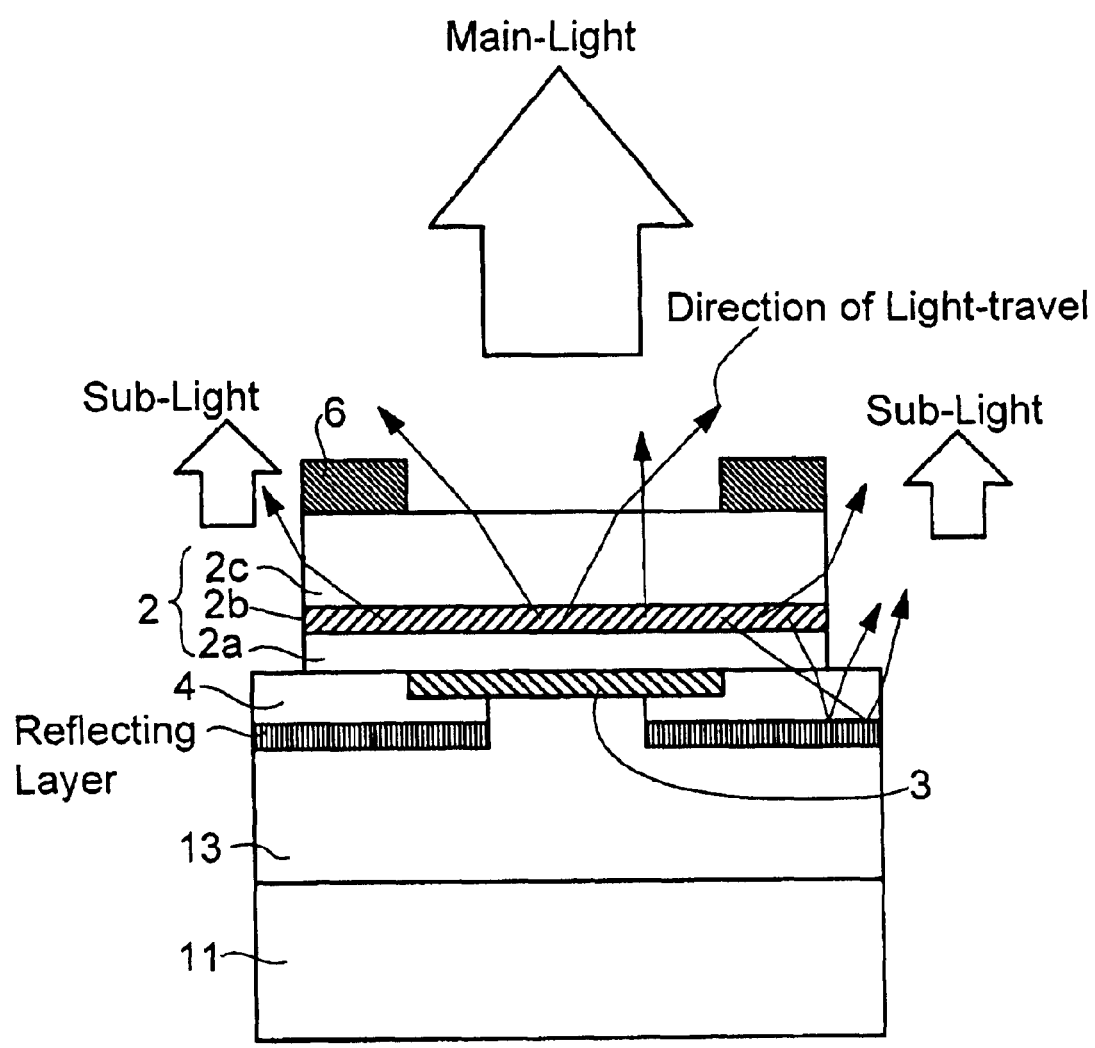
Figure 3D:
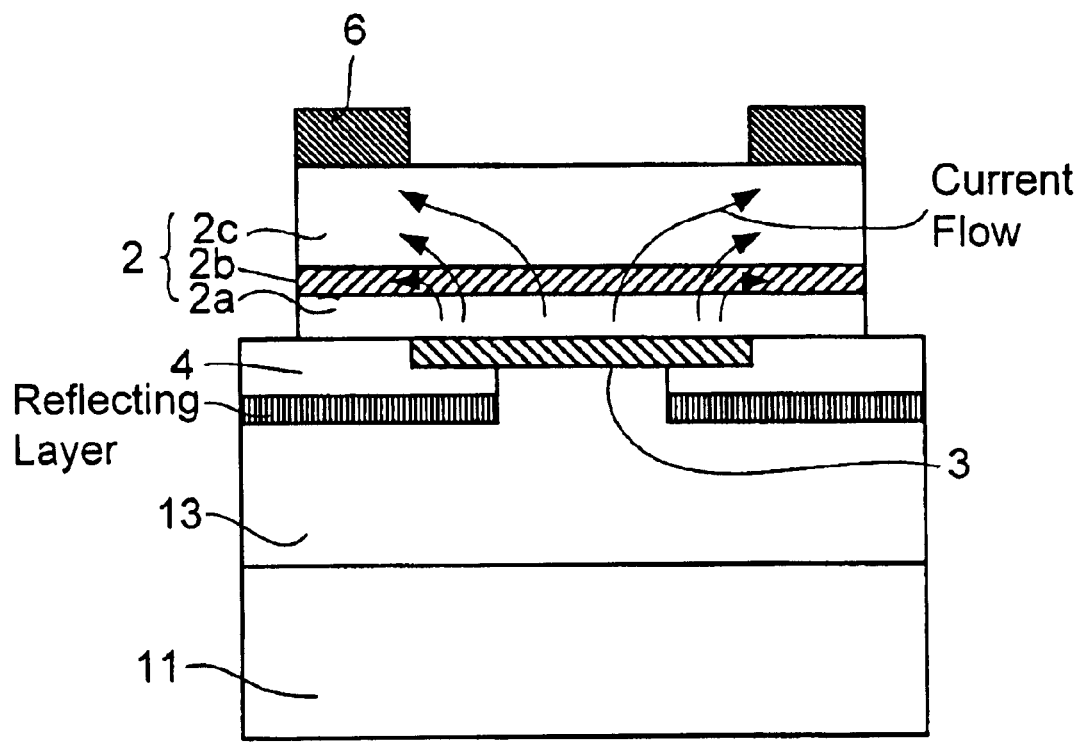
Figure 3F:
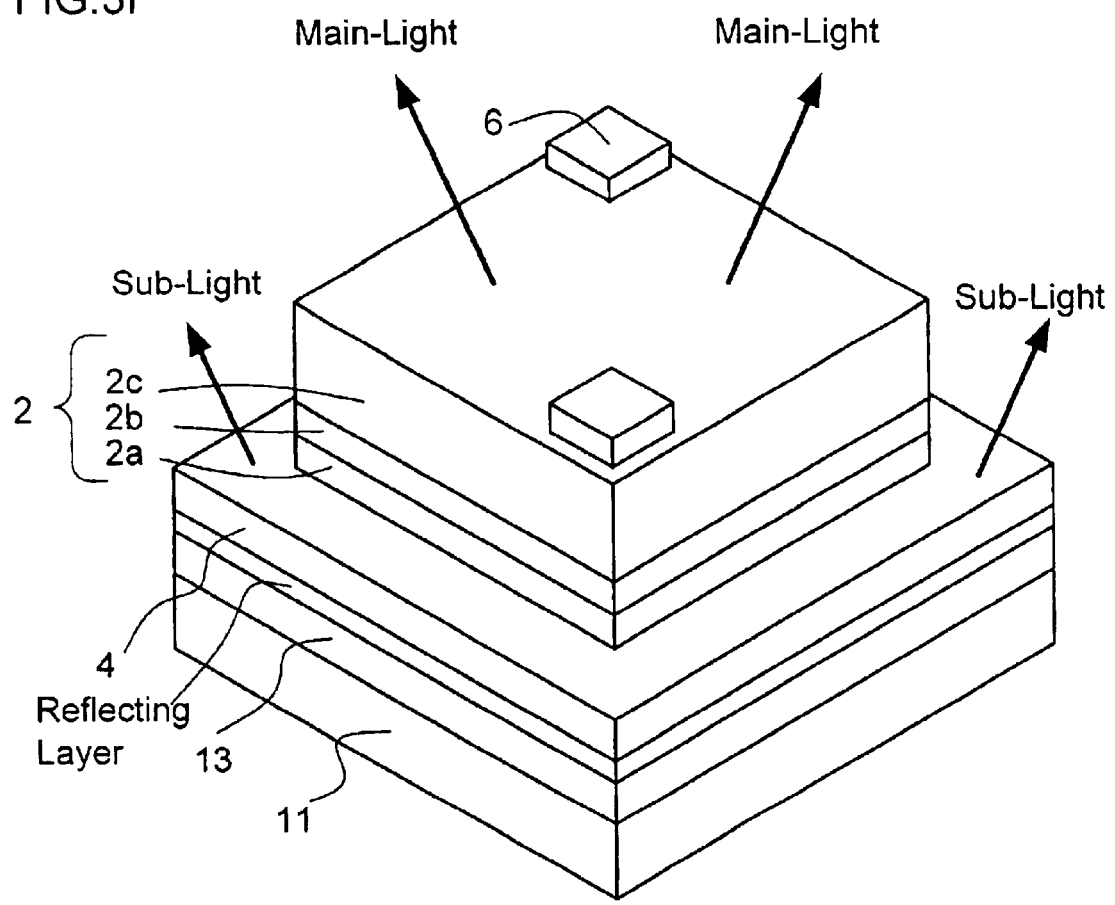
Figure 4A:
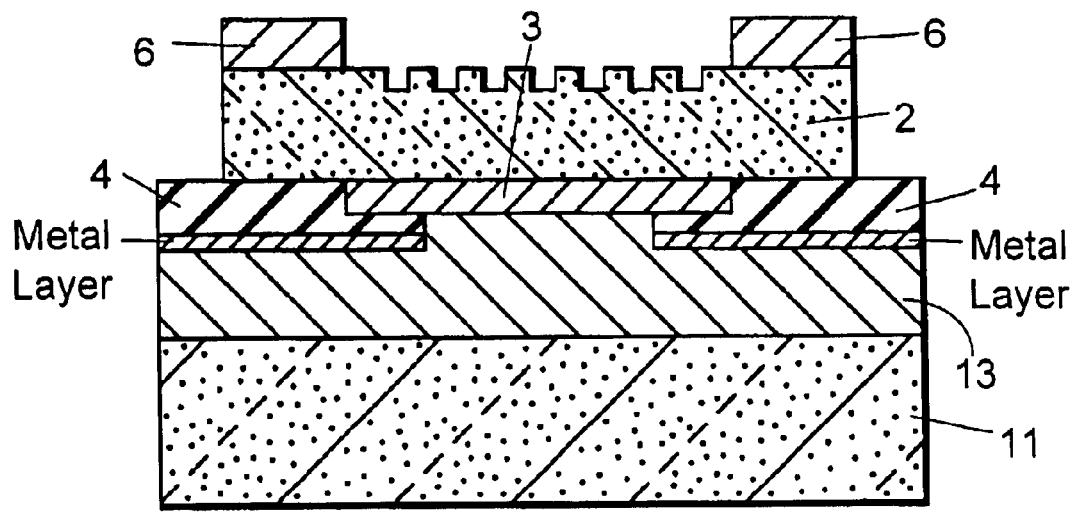
Figure 4B:
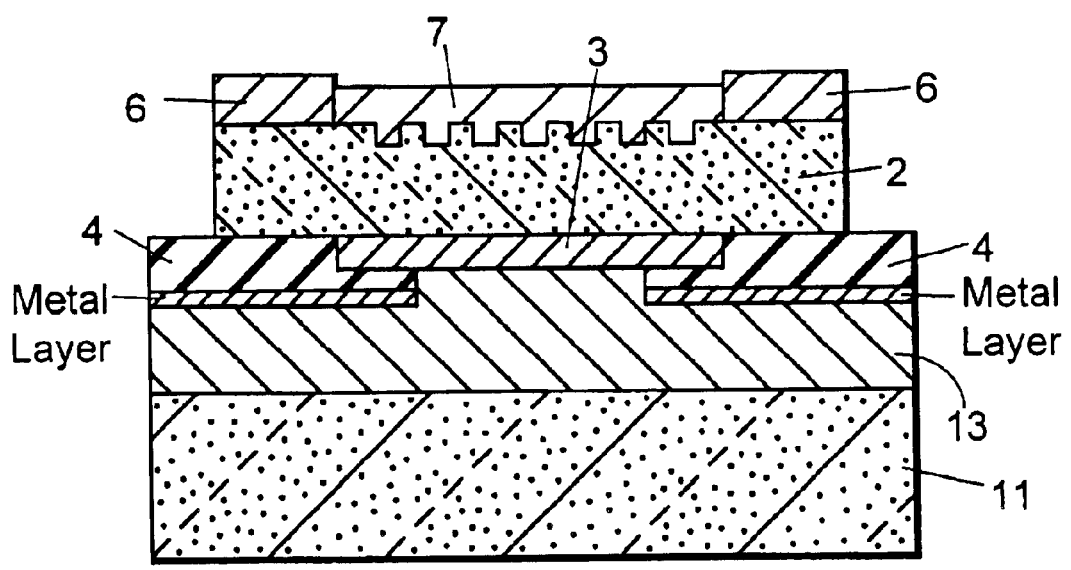
Figure 5:
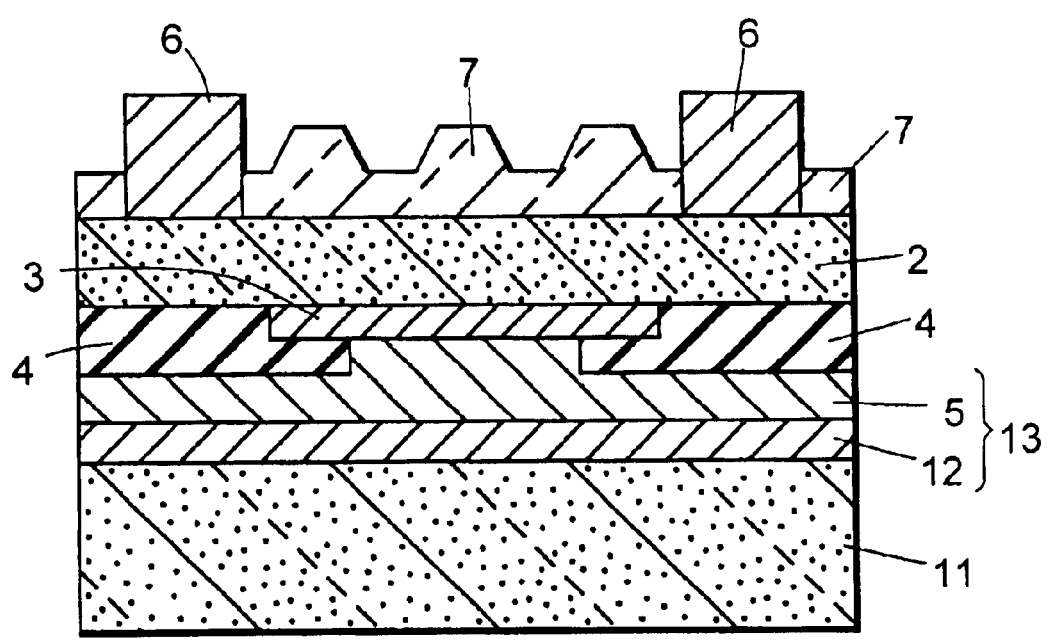
FIG. 5 schematically shows a cross-sectional view of another embodiment of the invention.

Subsequently, a second insulating protect layer 7 is formed so as to cover the exposed surface except pad-terminal-forming region of the second terminal (FIG. 3B, FIG. 4B). An insulating layer such as $SiO_2$, $Nb_2O_5$, $Al_2O_3$, $ZrO_2$, $TiO_2$, etc. can be employed as the second insulating protect layer. Then, the exposed surface of the protect layer can be formed in asperity shape for improving the outgoing efficiency of the light by RIE, etc. (FIG. 5). RIE or wet etching can control at of the order of 0.1 μm for forming the asperity. The bumps of the asperity shape of the protect layer can be formed in a mesa shape, triangle shape, a half-round shape in a cross-sectional view. Thus, inclined faces are provided in the bumps, so that the probability of occurrence of diffusion can be increased. It is preferable that the taper angle in the inclined faces of the bumps is more than or equal to 30 degrees and not more than 60 degrees. In addition, the protect layer can be formed in an island shape, a grid pattern shape, a rectangular shape, or polygonal shape in a plan view.

When the light-outgoing surface of the second insulating protect layer is formed in an asperity shape in a cross-sectional view, the light, which does not outgo cause of total internal reflection, can pass through with varied the angle of the light at the asperity face (the boundary face of the light-outgoing). Therefore, its outgoing efficiency of the light is more than or equal to 1.5 times as much as without the asperity in the protect layer. The asperity shape of the protect layer of the nitride semiconductor element is at least one shape selected from the group of a triangle shape, a half-round shape in a cross-sectional view. In addition, when its corner is rounded, the probability of diffusion can be increased, so that it can further improve the outgoing efficiency of the light. It is preferable that the depth of the dips of the asperity is 0.2–3 μm. It is more preferable that it is 1.0–1.5 μm. Because when the depth of the dips of the asperity is less than 0.2 μm, it may not improve the outdoing efficiency of the light. On the other hand, when it is deeper than 3 μm, it may not provide the effect as the protect layer, though the resistance is not varied. Additionally, drawing out to form the asperity shape in a circle shape or a polygonal shape can also improve its power with maintaining low resistance. Forming the asperity shape to the protect layer on the nitride semiconductor layer can improve the outgoing efficiency of the light without increasing the voltage. Because the nitride semiconductor itself is not thinned by the process, its resistance is not increased. Furthermore, the nitride semiconductor does not have any damage caused by etching directly. In addition, when the asperity process is performed to the protect layer, a fine processing can be performed with selecting the appropriate material for etching such as RIE (reactive ion etching), etc. compared with when asperity process is performed to the nitride semiconductor layer. Forming the above cross-sectional shape can occur diffusion effectively. It is preferable that the difference of the refractive index between the protect layer and the GaN is in the range ±0.5. The constitution mentioned above can improve more than or equal to 1.5 times of the outgoing efficiency of the light as much as without protect layer, without increasing the voltage. Additionally, the protect layer can provide the effect for preventing the surface deterioration. With the insulative protect layer, the short circuit can be prevent when chipping such as dicing for breaking into chips.

Subsequently, the nitride semiconductor element is broken into chips by dicing, etc.

Figure 18:
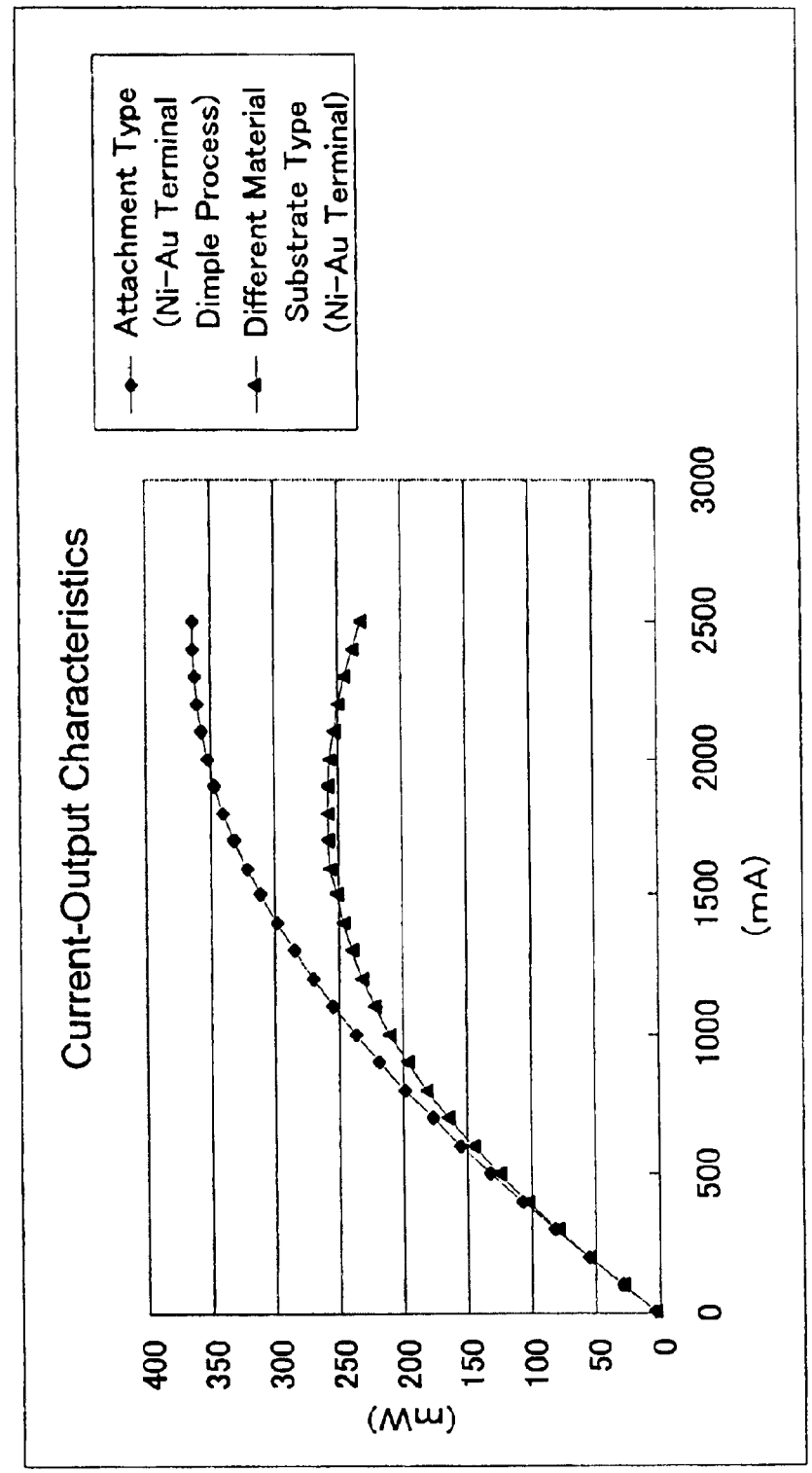
FIG. 18 is a graph showing current-output characteristics of an embodiment of the invention and a comparative example.
Figure 19A:
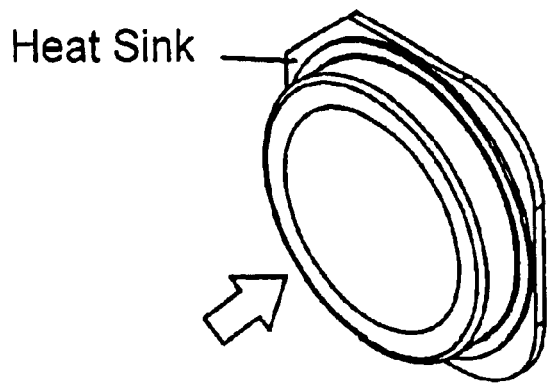
FIGS. 19A–19C show a perspective view, a plan view, and a schematic cross-sectional diagram of the light-emitting device according to one embodiment of the invention.
Figure 19B:
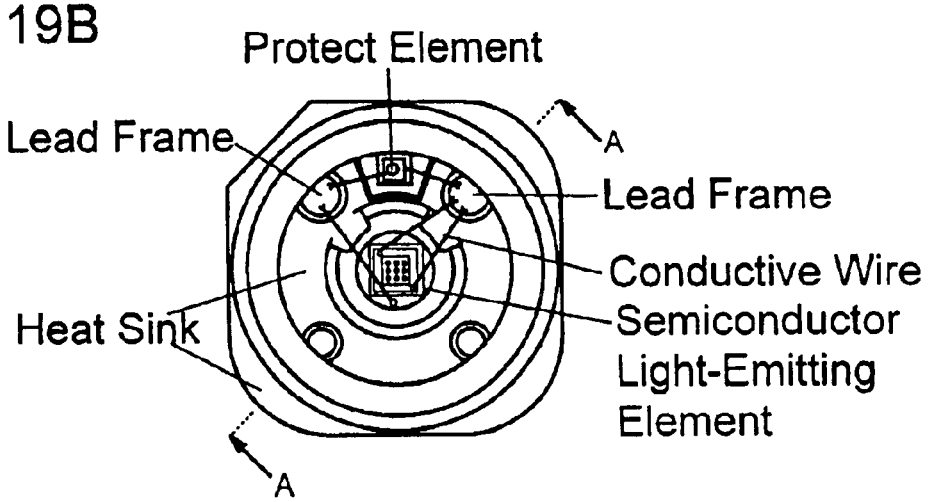
Figure 19C:
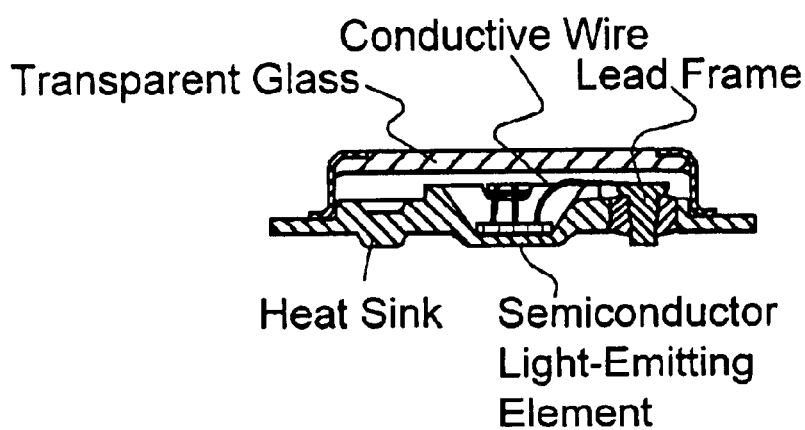

FIG. 18 is a graph showing current-output characteristics of an embodiment of the invention with attached supporting substrate and a conventional nitride semiconductor element with sapphire substrate. The thermal resistance of the nitride semiconductor element with the supporting substrate is low, so that more than or equal to 2000 mA of current can be applied, and it can output more than or equal to 350 mW. On the other hand, the thermal resistance of conventional nitride semiconductor element with sapphire substrate is high, so that the thermal dissipation is low. Therefore, it cannot perform high output. Here, both of the nitride semiconductor elements and terminals are same condition.

Another nitride semiconductor light-emitting element of the embodiment 1 will be described as follows. It has a conductive layer, a first terminal, a first conductive type nitride semiconductor layer, nitride semiconductor, on or above a supporting substrate successively. It has a second terminal on the nitride semiconductor. Pad terminal forming regions are formed at corners in the diagonal line of the four corners, the second terminal with a mesh shape is further formed the region between the pad terminal forming regions. The pad terminal forming regions are not restricted two, and it can be formed at all of four corners. In addition, the second terminal does not overlap the first terminal in a plan view. Additionally, the second terminal has a protect layer thereon. The protect layer can be form not only on the nitride semiconductor layer but also on area except for the forming regions of the pad terminal of the second terminal. Forming the second terminal in a mesh shape, a grid pattern shape, etc. on the whole area of light-emission can reduce the resistance of the nitride semiconductor layer.

Figure 12A:
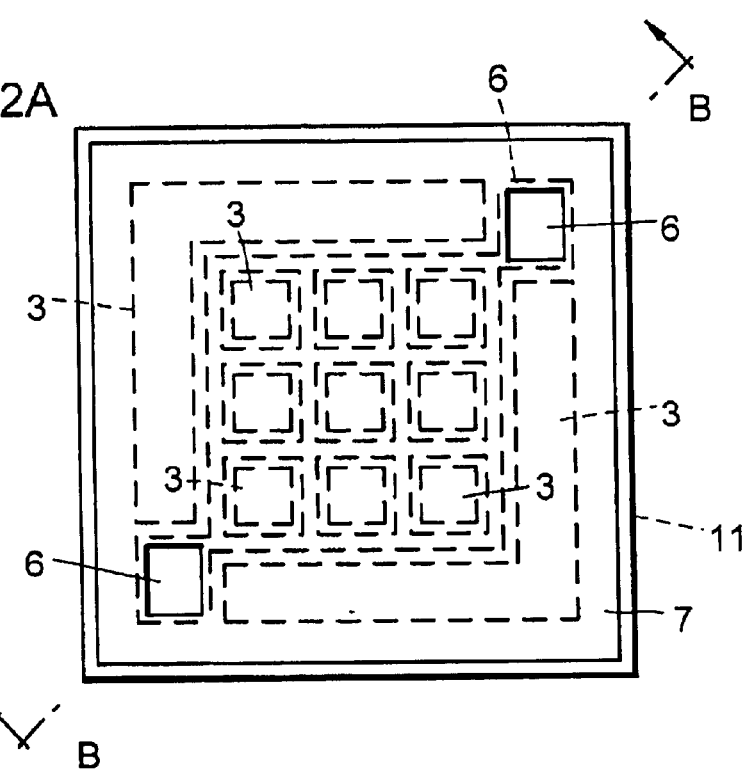
Figure 12B:
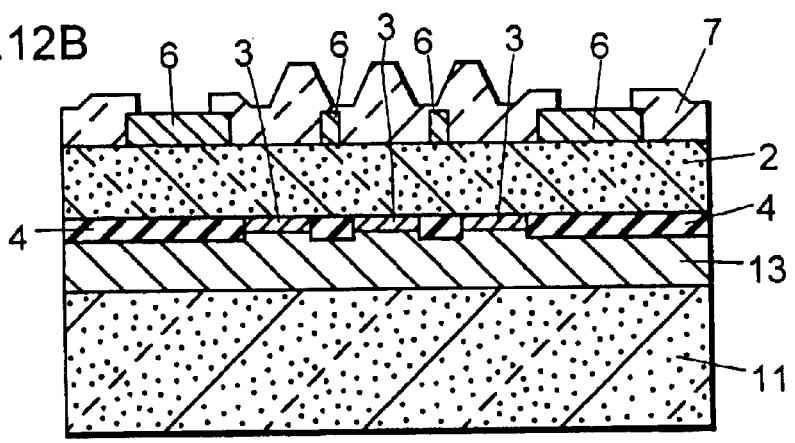
Figure 12C:
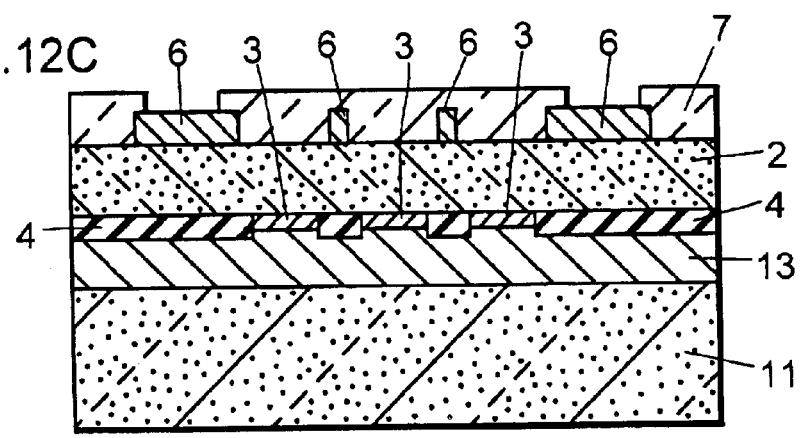
Figure 12E:
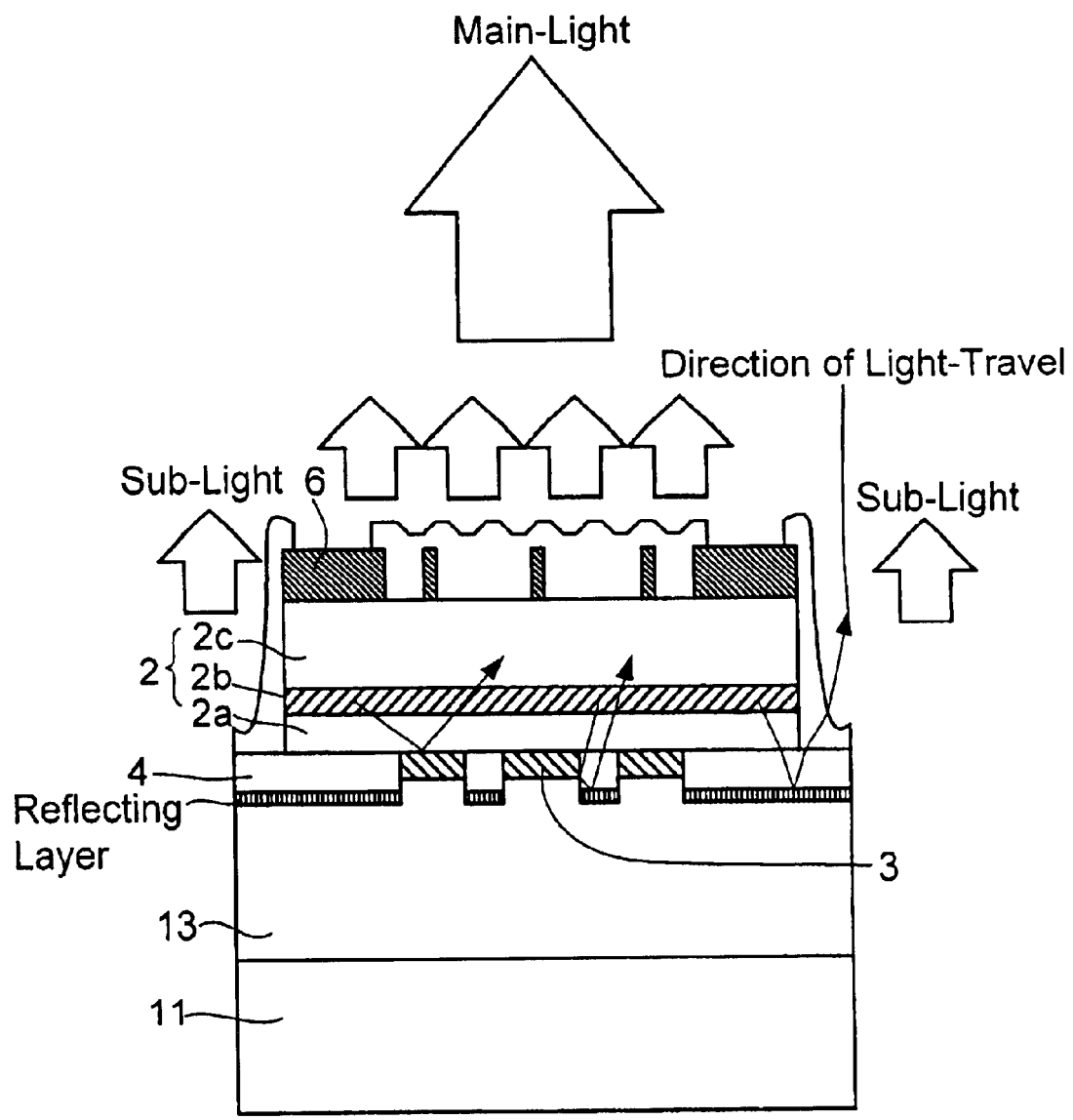

In the cross-sectional view (FIG. 12B) of the nitride semiconductor light-emitting element shown in FIG. 12A, the first terminal 3 in contact with the nitride semiconductor 2 has opening portions. A first insulating protect layer is formed on the opening portions. It is preferable that the protect layer 4 composes a two-layer structure with a reflecting layer (not shown in the drawings). A single layer or a multi-layers employing $SiO_2$, $Al_2O_3$, $ZrO_2$, $TiO_2$, etc. can be used as the material of the protect layer 4. Providing the insulating layer can prevent short circuit, so that it can improve the yield and the reliability. A reflecting layer (not shown in the drawings) of Al, Ag, Rh, etc. with the thickness more than or equal to 500 Å and not more than 2000 Å is formed on the side of the insulating protect layer 4 not in contact with the nitride semiconductor 2. Thus, the light running in the traverse direction can outgo effectively.

As mentioned above, the face-down structure (n-side is the front surface) can improve the outgoing efficiency of the light. The reason is that the reflectivity of the back surface of the nitride semiconductor is high. Further, the opposed terminal structure can increase the area of light-emission. Furthermore, the supporting substrate used in the invention can improve thermal dissipation. Using a conductive substrate can provide a one-wire structure. In addition, the embodiment can be applied to a laser diode.

Figure 6:
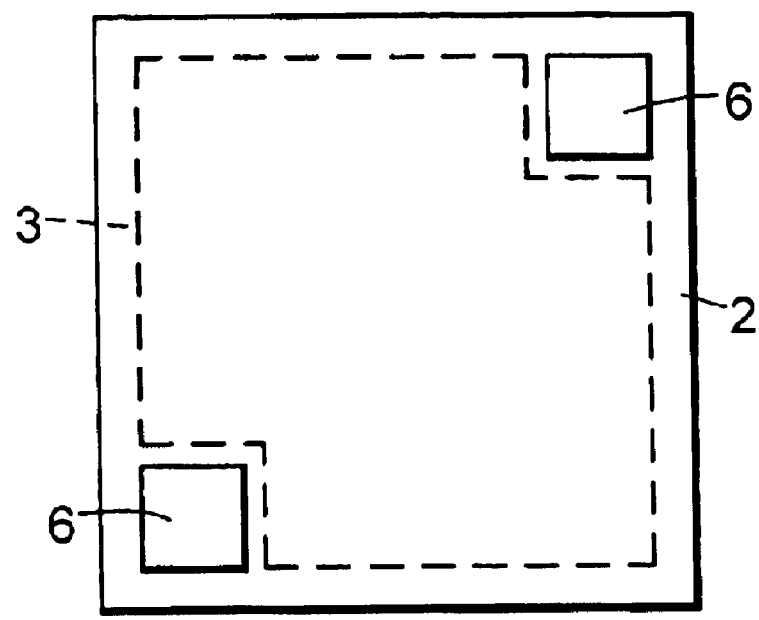
FIG. 6 schematically shows a plan view of another embodiment of the invention.
Figure 7:
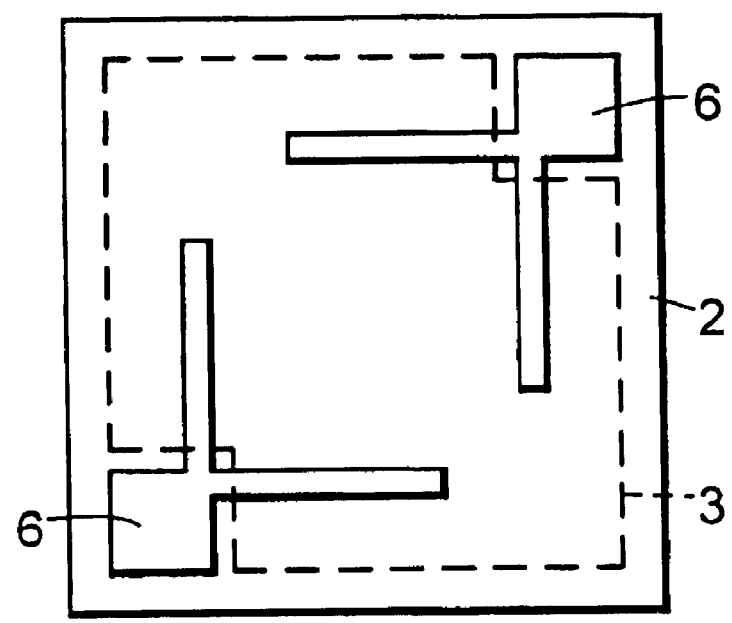
FIG. 7 schematically shows a plan view of another embodiment of the invention.
Figure 8:
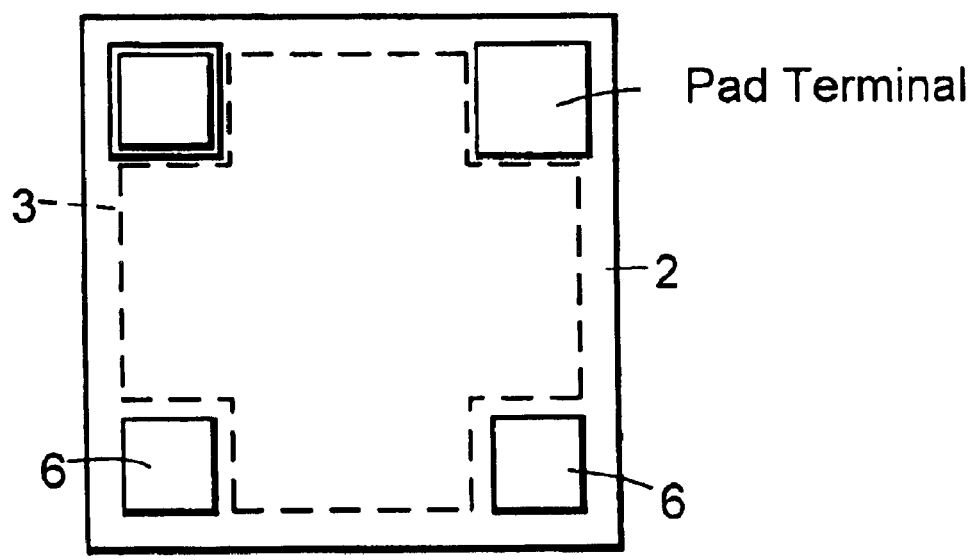
FIG. 8 schematically shows a plan view of another embodiment of the invention.
Figure 9:
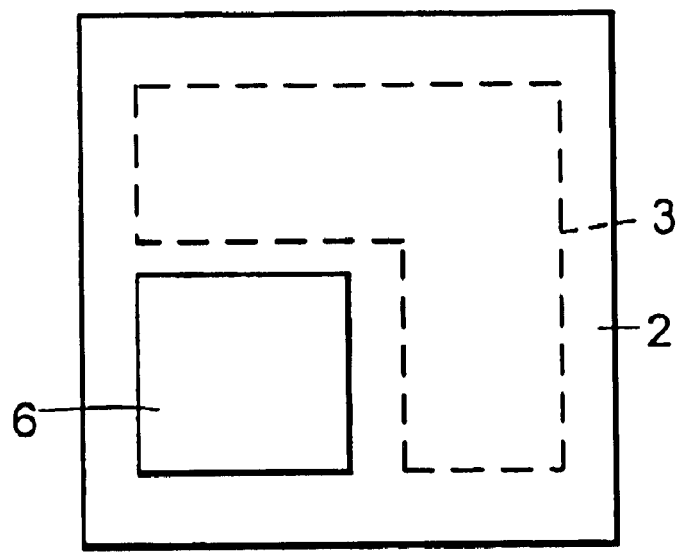
FIG. 9 schematically shows a plan view of another embodiment of the invention.
Figure 10:
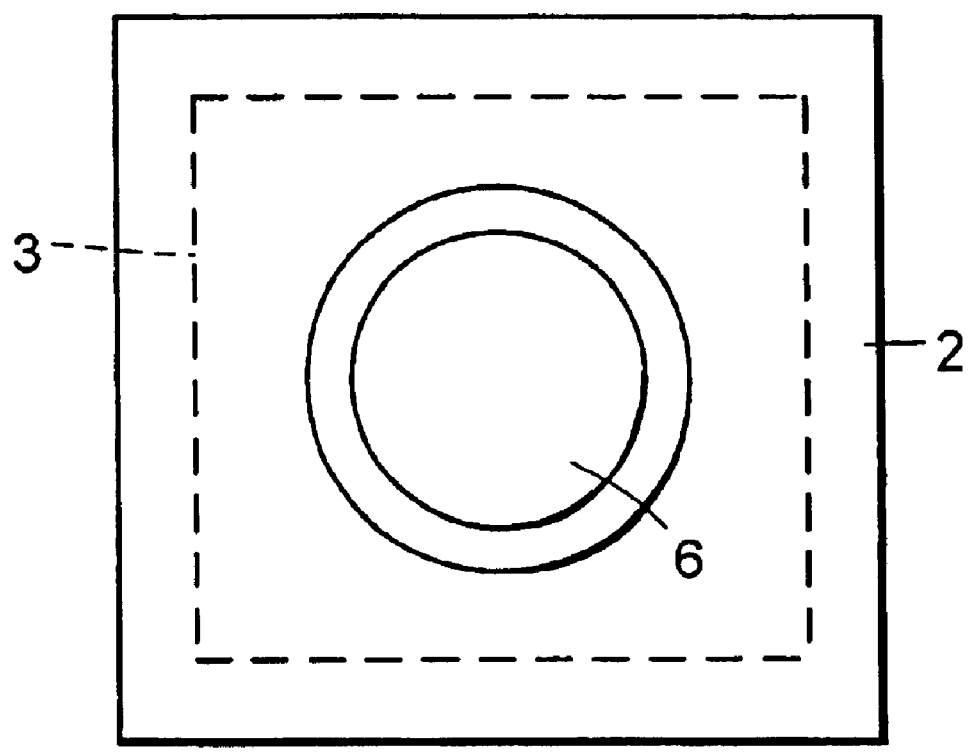
FIG. 10 schematically shows a plan view of another embodiment of the invention.

Another structure of the nitride semiconductor element obtained by the embodiment 1 will be described as follows. FIG. 6 shows a type forming the second terminals at the corners in the diagonal line. It is adequate that the first terminal is not formed on the region overlapping the second terminal, and its size and its shape are not restricted especially. In addition, the second terminals can be formed not only at two corners but also at all of the four corners. FIG. 7 shows a type in which second terminals extend to the middle. FIG. 8 shows a type in which the first terminal has pad terminals. FIG. 9 shows a type in which the first terminal with a L-shape covers the second terminal whereby the first terminal is formed in wide region. Furthermore, FIG. 10 shows a type having the second terminal in the center portion. The first terminal is formed in a periphery of the second terminal so as not to overlap it.

As mentioned above, the face-down structure (n-side is the front surface) can improve the outgoing efficiency of the light. Further, the opposed terminal structure can widen the diameter. Furthermore, selecting the substrate can improve thermal dissipation. In addition, using a conductive substrate can provide a one-wire structure. Additionally, the embodiment can be applied to a laser diode.

Embodiment 2

A nitride semiconductor 2 is formed on or above a different material substrate 1, as a second conductive type nitride semiconductor layer, a light-emitting layer, a first conductive type nitride semiconductor layer successively. First, the surface is etched partly by RIE, etc. Subsequently, it is annealed under atmosphere with oxygen. A first terminal with high reflectivity and capable of ohmic contact with the first conductive type nitride semiconductor layer is pattern-formed on the surface, which is not etched. Next, a first insulating protect layer is formed on the part, on where the first terminal is not formed. $SiO_2$, etc. can be employed as material of the protect layer, and a multi-layer structure of them can also be employed. A metal layer with high reflectivity such as Al can be formed further on there. Then, a conductive layer composed of an intimate layer, a barrier layer, and an eutectic layer, can be formed on the whole of wafer or the part, where is not etched. The conductive layer is a layer for eutectic when attached. For example, Ni—Pt—Au—Sn—Au, RhO—Pt—Au, RhO—Pt—Au—Sn—Au, Ti—Pt—Au—Sn—Au, and Ti—Pt—Sn can be formed.

On the other hand, the supporting substrate 11 is prepared. The metal layer forming surface of the supporting substrate and the first terminal formed on the nitride semiconductor are faced each other, then pressed with heating. Subsequently, grinding, etching, electromagnetic wave irradiation, or combination of them is performed. Excimer laser irradiation can be employed as one example of the electromagnetic wave irradiation. After exposing, a CMP process is performed to the nitride semiconductor, and the desired layer is exposed. Thus, the damaged layer can be eliminated, and the thickness of GaN and the surface roughness can be adjusted.

Subsequently, an asperity-forming process is performed to the exposed surface of the second conductive type nitride semiconductor layer by etching such as RIE, etc. Then Ti—Al—Ni—Au, W—Al—W—Pt—Au, etc. is formed on the surface of the nitride semiconductor layer as the second terminal 6. Further, the protect layer of $SiO_2$, $Al_2O_3$, $ZrO_2$, $TiO_2$, etc. is formed on the exposed surface of the nitride semiconductor layer so as to cover except the second terminal (n-type terminal, for example). Finally, it is broken into chips by dicing, etc. The nitride semiconductor element obtained in the embodiment has the characteristics similar to the embodiment 1.

Embodiment 3

In the nitride semiconductor element of this embodiment, the attachment process is performed twice (FIG. 13). A method for producing a nitride semiconductor element having at least a first terminal, a nitride semiconductor with a light-emitting layer, and a second terminal on or above a supporting substrate successively, includes: a first step for growing the nitride semiconductor with the light-emitting layer on or above a first substrate; subsequently, a second step for eliminating the first substrate and forming an exposed surface of the nitride semiconductor; subsequently, a third step forming a asperity on the exposed surface; subsequently, a forth step for attaching the supporting substrate to the exposed surface of the nitride semiconductor layer with interposing; and subsequently a fifth step for eliminating the second substrate.

In the first step, the second substrate is attached to the growth surface of the nitride semiconductor layer with interposing the second terminal. In the forth step, the first terminal is formed by eutectic alloying when attaching the supporting substrate and the nitride semiconductor layer. In the nitride semiconductor light-emitting element, the first terminal has aluminum at the boundary with the nitride semiconductor, and the boundary is formed in an asperity-shape. The first terminal has a eutectic layer. The depth of the asperity of the boundary between the first terminal and the nitride semiconductor layer is more than or equal to 0.1 $\mu$m.

The nitride semiconductor light-emitting element of this embodiment includes at least the first terminal, the nitride semiconductor layer with light-emitting layer, and the second terminal, wherein the first terminal has aluminum at the boundary with the nitride semiconductor layer, and the boundary is formed in the asperity-shape. Thus, aluminum formed on the boundary dose not allow the light from the light-emitting element to pass through, so that it can improve the outgoing efficiency of the light from the light-outgoing surface. In addition, aluminum can be in ohmic contact with the n-type nitride semiconductor, therefore it can reduce the voltage. It is difficult to form aluminum on the boundary of the nitride semiconductor, because a nitride substrate such as GaN, AlN, etc. is not mass-produced. In the invention, the attaching process is performed twice, so that it is possible to form aluminum at the boundary with the first terminal. Additionally, the first terminal has the eutectic layer, therefore, it is advantageous to obtain conductivity with the supporting substrate. The first terminal has aluminum at the boundary with the nitride semiconductor, so that high reflectivity is also obtained.

Further, the boundary between the first terminal and the nitride semiconductor layer is formed in the asperity shape, so that it can improve the outgoing efficiency of the light. Because the light, which does not outgo cause of total internal reflection, can pass through with varied the angle of the light at the asperity shape of the boundary. When the asperity shape is provided, its outgoing efficiency of the light is more than or equal to 1.5 times as much as without the asperity. It is preferable that the depth of the boundary is more than or equal to 0.1 $\mu$m. It is more preferable that it is more than or equal to 0.3 $\mu$m. When the supporting substrate is conductive material, it can provide the nitride semiconductor element with an opposed terminal structure. To form the eutectic layer, the first terminal includes at least one element selected from the group of Pd, Au, Sn, and In. To improve the outgoing efficiency of the light, the p-type terminal is formed in a mesh shape of Ag, Rh, etc. or is formed with the transparent material such as thin layer of Ni and/or Au. Employing such material can achieve low resistance, and can improve the outgoing efficiency of the light.

The forth step bonds the first terminal by eutectic alloy when attaching the supporting substrate and the nitride semiconductor layer. Eutectic can attach at low temperature, and can also improve bond strength. Attaching at low temperature provide the effect to reduce the warpage. (Supporting substrate)/(first terminal (the eutectic layer+ aluminum))/(nitride semiconductor) is formed successively.

In the attachment process of the first step, the second substrate is attached onto the growth surface of the p-type nitride semiconductor layer by thermocompression, after the nitride semiconductor is formed on or above the first substrate (sapphire, SiC, GaN, etc.) as the n-type nitride semiconductor layer, the light-emitting layer, the p-type nitride semiconductor layer successively. In the first step, the second substrate is attached to the growth surface of the nitride semiconductor with interposing the second terminal between them. Here, Cu—W, invar material, stainless steel, etc, can be employed as the second terminal, and is attached with the material capable of bonding at relatively low temperature such as an epoxy sheet. When the second substrate is attached to the nitride semiconductor with the epoxy sheet, it is preferable to interpose the diffusion-preventing layer between them. Attaching with interposing a metal layer with the effect for preventing diffusion of the organic substance of the resist as a temporary protect layer in the nitride semiconductor side and the epoxy sheet in the second substrate side can make elimination of the second substrate easier in a latter step. Ti, etc can be employed as the metal layer with the effect for preventing the diffusion. Next, in the second step, eliminating the first substrate by polishing, laser irradiation, or chemical polishing, etc. exposes the surface of the n-type nitride semiconductor layer. The damaged layer is formed by eliminating the different material substrate with polishing, however chemical polishing can remove the damaged layer. Thus, the reduction of the characteristics cause of eliminating the different material substrate can be reduced. Subsequently, in the third step, asperity is formed on the exposed surface of the nitride semiconductor layer. The depth of the asperity is more than or equal to 0.1 $\mu$m. RIE or wet etching can control at of the order of 0.1 $\mu$m for forming the asperity. Then, in the forth step, the supporting substrate is formed on the exposed asperity surface of the nitride semiconductor layer with interposing the first terminal between them. The first terminal has aluminum or silver in the boundary with the nitride semiconductor layer. In addition, low-melting metal including Sn, In is formed on the top surface of the first terminal. It is preferable that the supporting substrate has high thermal conductivity. The condition for attaching the supporting substrate is eutectic bonding the supporting substrate and the first terminal by thermocompression with interposing at least one material selected from the group of Ti—Pt—AU and Ti—Pt—Pd at the temperature approximately 100–500° C. Subsequently, in the fifth step, heating the second substrate in more than or equal to 200° C. to lose its bonding strength, or dissolving the eutectic portion with an organic solvent or an acid solution eliminate the bonding layer forms the nitride semiconductor light-emitting element. As mentioned above, the nitride semiconductor light-emitting element has the structure with (supporting substrate)/(Ti—Pt—AuSn, Ti—Pt—PdSn, etc.)/(first terminal)/(nitride semiconductor)/(second terminal) from the supporting substrate successively.

A method for producing the nitride semiconductor light-emitting element according to the embodiment 3 will be described is each step with the drawings.

First Step

Figure 13A:
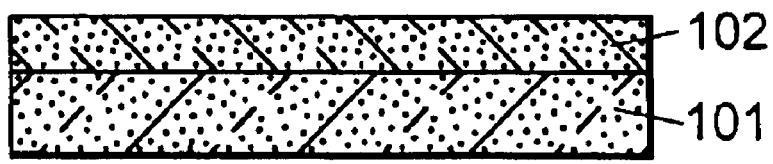
FIGS. 13A–13F schematically show cross-sectional views of another process of producing of the invention.
Figure 13B:
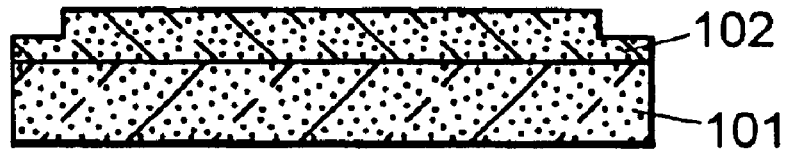
Figure 13C:
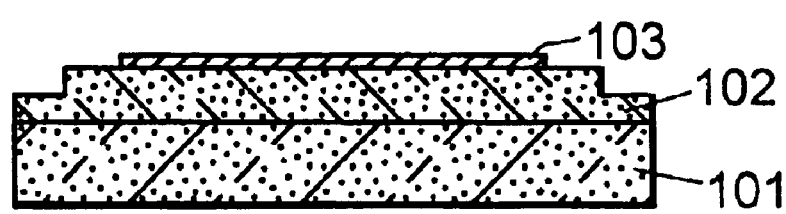
Figure 13D:
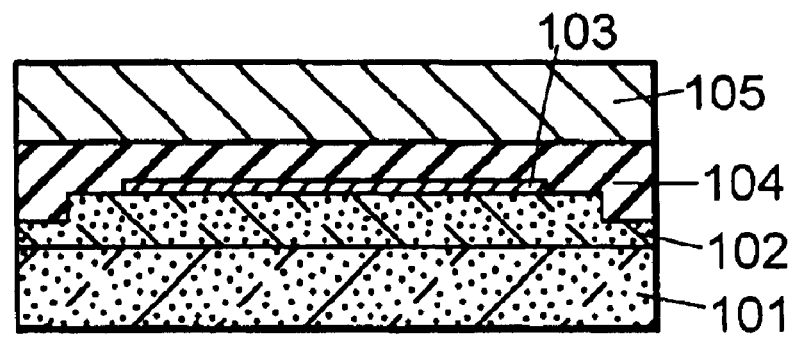

First, the nitride semiconductor 102 is grown on the first substrate 101 (FIG. 13A). Then, the nitride semiconductor layer is etched (FIG. 13B). The etching is performed for preventing crack of the nitride semiconductor layer and for ease of chip separation, and exposes n-type nitride semiconductor layer. In addition, remaining more than or equal to 1 $\mu$m thickness of the nitride semiconductor layer after etching can reduce occurrence of crack when the first substrate is eliminated. Next, the second terminal (p-type terminal) 103 is formed on the region of the nitride semiconductor 102, where is not etched (FIG. 13C). Subsequently, the second substrate 105 is attached onto the nitride semiconductor 102 (FIG. 13D). The thermocompression attaches with using a polymeric material such as epoxy resin, polyamide resin, etc. or a resist on the bonding layer 104 to be attached with the second substrate 105. The thermocompression is performed at temperature 100–200° C.

It is adequate that the material of the second substrate 105 has flatness and strength because it is eliminated in a latter process, so that it is not restricted especially, however, it is preferable that its thermal expansion coefficient is approximate to the first substrate. The reason is to prevent occurrence of the difference between them when attachment in the forth step. In addition, it is preferable that the material can be eliminated easily. Cu—W, W, Mg, Kovar material, Invar material, polyimide series resin, polyester series resin, epoxy series resin, etc. can be employed. The second terminal is formed with satisfying the formula represented in L/S=0.02, wherein S is area of the active layer, and L is the sum of length of the outline of the second substrate. Designing with satisfying the range can improve more than or equal to 1.2 times of the outgoing efficiency of the light.

Additionally, at least one material selected from the group of Ni, Co, Fe, Ti, Cu, Rh, Au, Ru, W, Zr, Mo, Ta, Pt, and Ag; an oxide of at least one element of them; or a nitride of at least one element of them can be employed as the second terminal.

Second Step

Figure 13E:
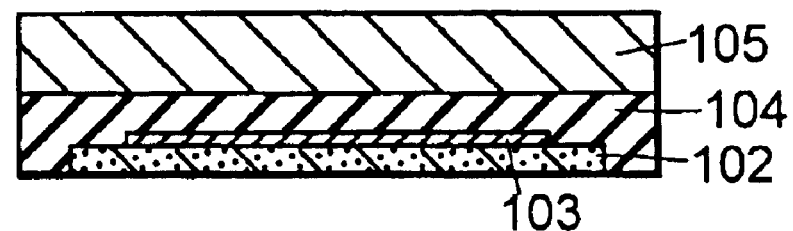

Subsequently, the first substrate is eliminated, and the exposed surface of the nitride semiconductor 102 is formed (FIG. 13E). The first substrate 101 is eliminated by polishing or excimer laser irradiation. The exposed surface of the nitride semiconductor 102 after eliminating the first substrate is further flattened by chemical polishing.

Third Step

Figure 13F:
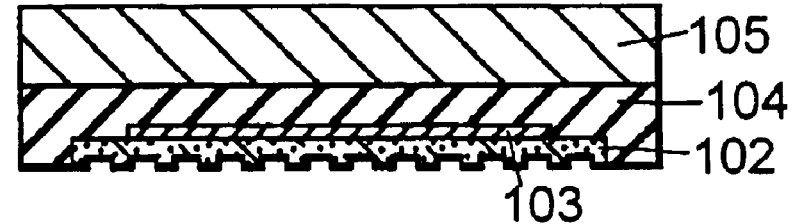

Subsequently, the asperity is formed on the exposed surface of the nitride semiconductor (FIG. 13F). Here, the depth of the asperity is more than or equal to 0.1 µm of the depth of the boundary. The asperity shape can be formed in a tapered shape or a reverse-tapered shape. In addition, the pattern of the asperity shape in a plan view has bumps and/or dips formed in a stripe shape, a grid pattern shape, an island shape, a circular shape, and can be selected from select a rectangular shape, a comb shape, or a mesh shape. For example, when circular bumps are formed, their diameter can be more than or equal to 5 µm, and their depth of the dips can be 3 µm. It is effective for improving the outgoing efficiency of the light of the LED to form the above asperity, and further interposing aluminum with high reflectivity at the boundary in a latter process can improve more than or equal to 1.5 times outgoing efficiency of the light as much as a nitride semiconductor light-emitting element without the asperity.

Forth Step

Figure 14A:
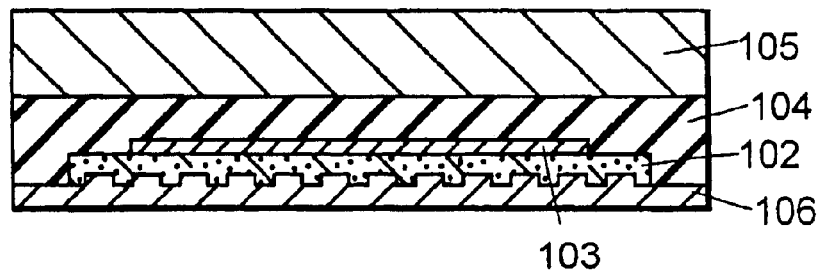
FIGS. 14A–14D schematically show cross-sectional views of another process of producing of the invention.
Figure 14B:
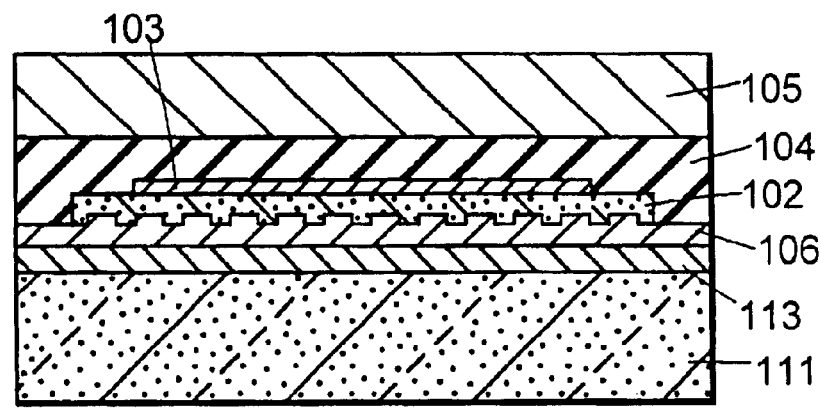

Subsequently, the first terminal 106 is formed on the asperity-forming surface (FIG. 14A), then the supporting substrate 111 is attached (FIG. 14B). In the attaching method, the supporting substrate 111, which a metallizing material such as AuSn system, PdSn system, InPd system, etc. is formed on the surface thereof, and the nitride semiconductor, which the first terminal is formed on the surface thereof, face each other, then they are pressed with applyed heat. The conductive layer 113 is formed on the attachment surface. It is preferable that the temperature at the attachment is more than or equal to 120° C. It is more preferable that it is more than or equal to 150° C. and not more than 300° C. The first terminal has aluminum in the boundary with the nitride semiconductor layer. In addition, metal for eutectic such as Sn, In is formed on the surface of the first terminal 106 to be bonded with the supporting substrate 8 by eutectic alloying. Additionally, a barrier layer formed of high melting point metal such as Pt, W, Ni, Ti, etc. can be formed for preventing from alloying with the metal for eutectic with aluminum.

Al—Pt—Sn, Al—W—In, etc. can be employed as the first terminal 106. The total thickness of the first terminal is not more than 500000 Å. In addition, the thickness of the aluminum is more than or equal to 500 and not more than 10000 Å. Designing the thickness of aluminum in the above range can provide uniform thickness in the chip even after twice attaching process. For example, the thickness of the first terminal 106 is 2000 Å–2000 Å–30000 Å.

It is advantageous to mount the chip onto the printed board when AlN, which is insulating substrate, is employed as the supporting substrate. On the other hand, it is advantageous to chip in low cost, when Si is employed. It is preferable that the thickness of the supporting substrate is 50–500 µm. Designing the thickness of the supporting substrate in the above thin range can improve thermal dissipation. It is preferable that the attachment surface of the supporting substrate has the structure with the intimate contact layer, the barrier layer, and the eutectic layer to be alloyed by eutectic in a latter process. For example, it can be formed in a metal layer such as Ti—Pt—Au, Ti—Pt—Pd, Ti—Pt—AuSn, W—Pt—Sn, RhO—Pt—Sn, RhO—Pt—Au, RhO—Pt—(Au, Sn), or the like. It is preferable that the metals of the surface of the supporting substrate side and the nitride semiconductor layer side are different material. Because it can make eutectic possible at low temperature, and can increase the melting point after eutectic.

Fifth Step

Figure 14C:
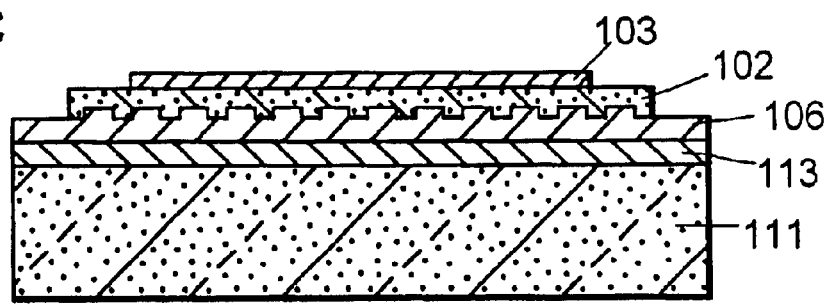

Subsequently, the second substrate 105 is eliminated in the fifth step (FIG. 14C). It is heated at higher temperature than when attached. Heating more than or equal to 200° C. can reduce the junction (bonding) strength, so that the second substrate 5 can be eliminated with the bonding layer. It is adequate that this method is applied to eliminate bond using epoxy series resin. It is also possible to dissolve the bonding layer with an organic solvent such as acetone or N-methyl-2-pyrrolidone. When AuSn is used for eutectic, the junction portion is dissolved with immersed in acid so as to separate. These methods can be used in combination with polishing.

Figure 14D:
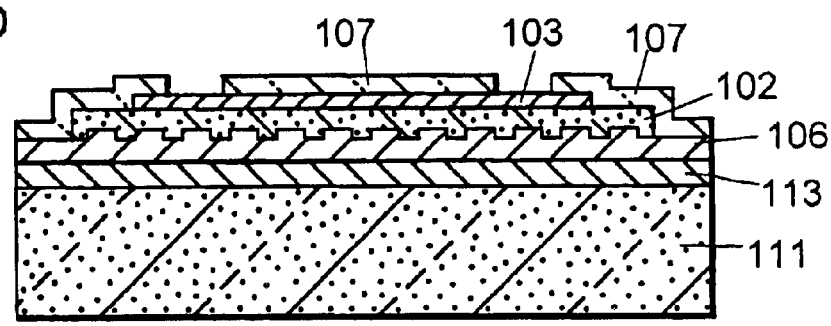
Figure 15A:
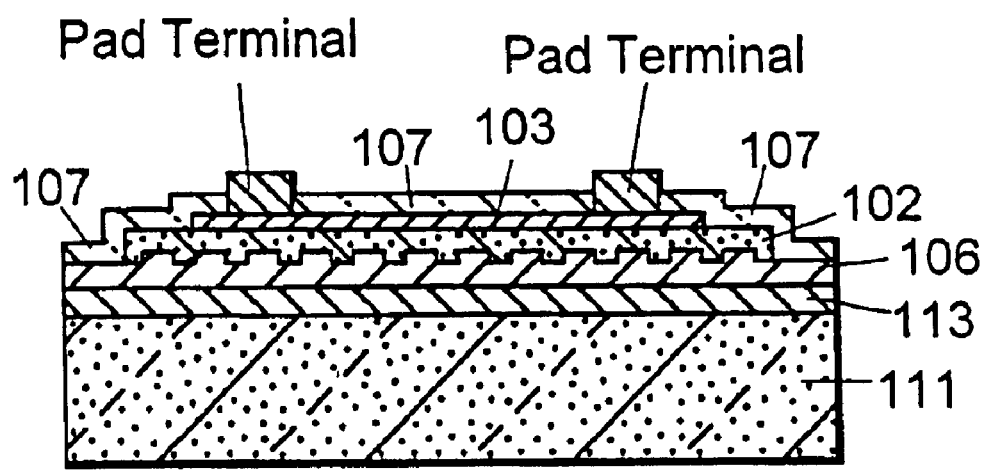
FIGS. 15A–15B schematically show cross-sectional views of another embodiment of the invention.

After eliminating the second substrate, the insulating protect layer 107 is formed on the exposed surface of the nitride semiconductor layer (FIG. 14D). Next, the pad terminal is formed on the opening portion of the protect layer (FIG. 15A). Then, dicing is performed for chipping into the nitride semiconductor element. However, the n-side terminal is employed as the first terminal, the invention is not restricted in that. The nitride semiconductor element with the supporting substrate is low thermal resistance, so that it is possible to apply more than or equal to 2 W of high electric power, and it can output more than or equal to 200 mW. The embodiment as mentioned above can produce the LED element with high outgoing efficiency of the light. On the other hand, a conventional nitride semiconductor element with sapphire substrate is high thermal resistance and poor thermal dissipation, so that it cannot output in high power.

Figure 16:
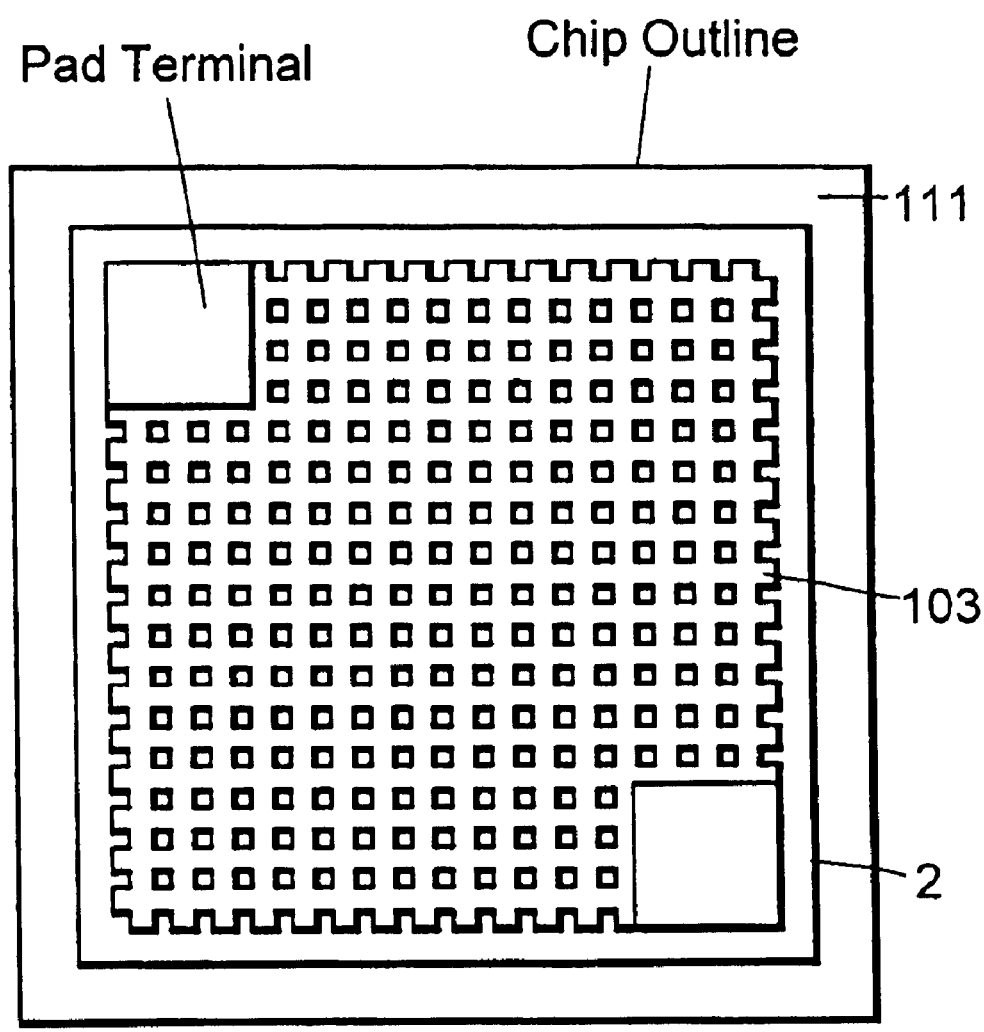
FIG. 16 schematically shows a plan view of another embodiment of the invention.
Figure 17:
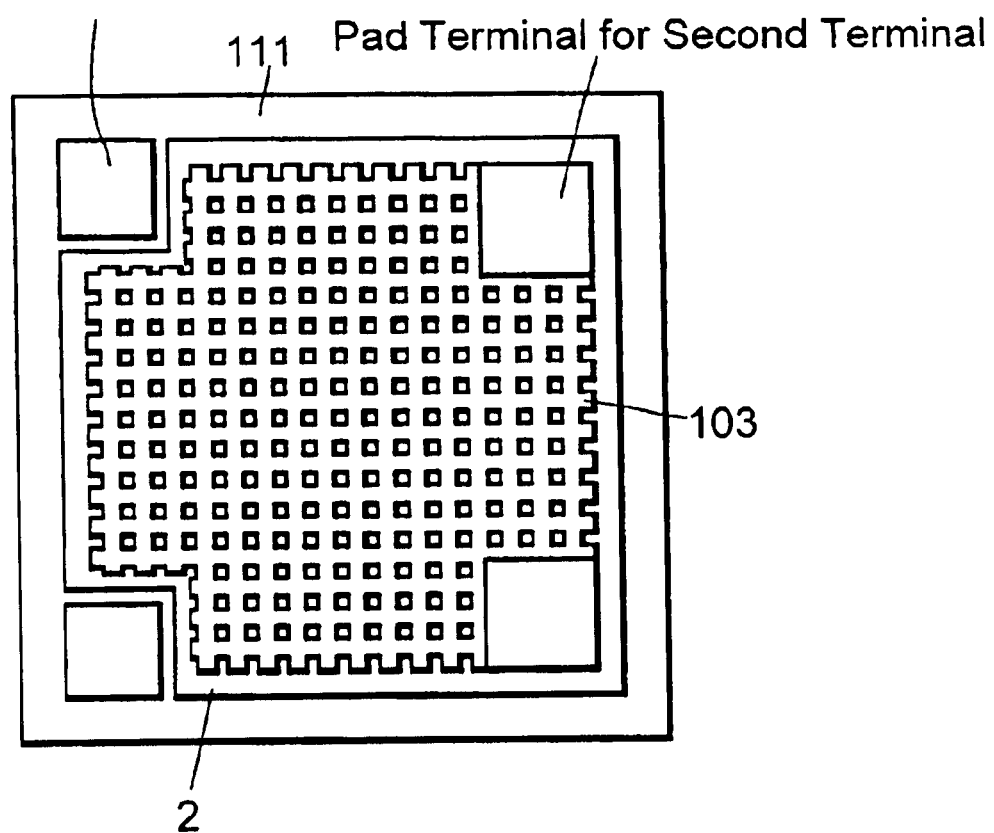
FIG. 17 schematically shows a plan view of another embodiment of the invention.

Another nitride semiconductor light-emitting element of the embodiment 3 will be described as follows. It has a first terminal, a nitride semiconductor layer successively on or above the supporting substrate. A second terminal is formed on the nitride semiconductor layer. The second terminal is formed in a mesh shape on the light-outgoing surface (FIG. 16). The area of the opening portion is 1–100 µm². In addition, the second terminal has pad terminal forming regions formed at corners in the diagonal line of the four corners. The pad terminal forming regions are not restricted two, and it can be formed at all of four corners. The supporting substrate is a insulating substrate, so that both of terminals are formed in the same plane side in the structure (FIG. 17). Additionally, it is preferable that a single-layer or a multi-layer such as $SiO_2$, $Al_2O_3$, $ZrO_2$, and $TiO_2$ can be formed on the second terminal. This insulating layer is the single-layer or the multi-layer. The protect layer also has the effect for preventing surface deterioration. The protect layer is an insulator. Employing a insulator as the protect layer can prevent short circuit when chipping by dicing, etc. to separate into chips. Therefore, yield and reliability can be improved. The second terminal can be formed in a mesh shape, a grid pattern shape, and etc. on the whole of the light-emission region. Thus, it can reduce the resistance of the nitride semiconductor layer.

The method for producing mentioned above can form aluminum with high reflectivity at the boundary between the first terminal and the nitride semiconductor layer. Thus, it can improve the outgoing efficiency of the light. Further, the opposed terminal structure can increase the area of light-emission. Furthermore, the supporting substrate used in the invention can improve thermal dissipation. Employing a conductive substrate as the supporting substrate can provide a one-wire structure. In addition, the embodiment can be applied to a laser diode.

Figure 15B:
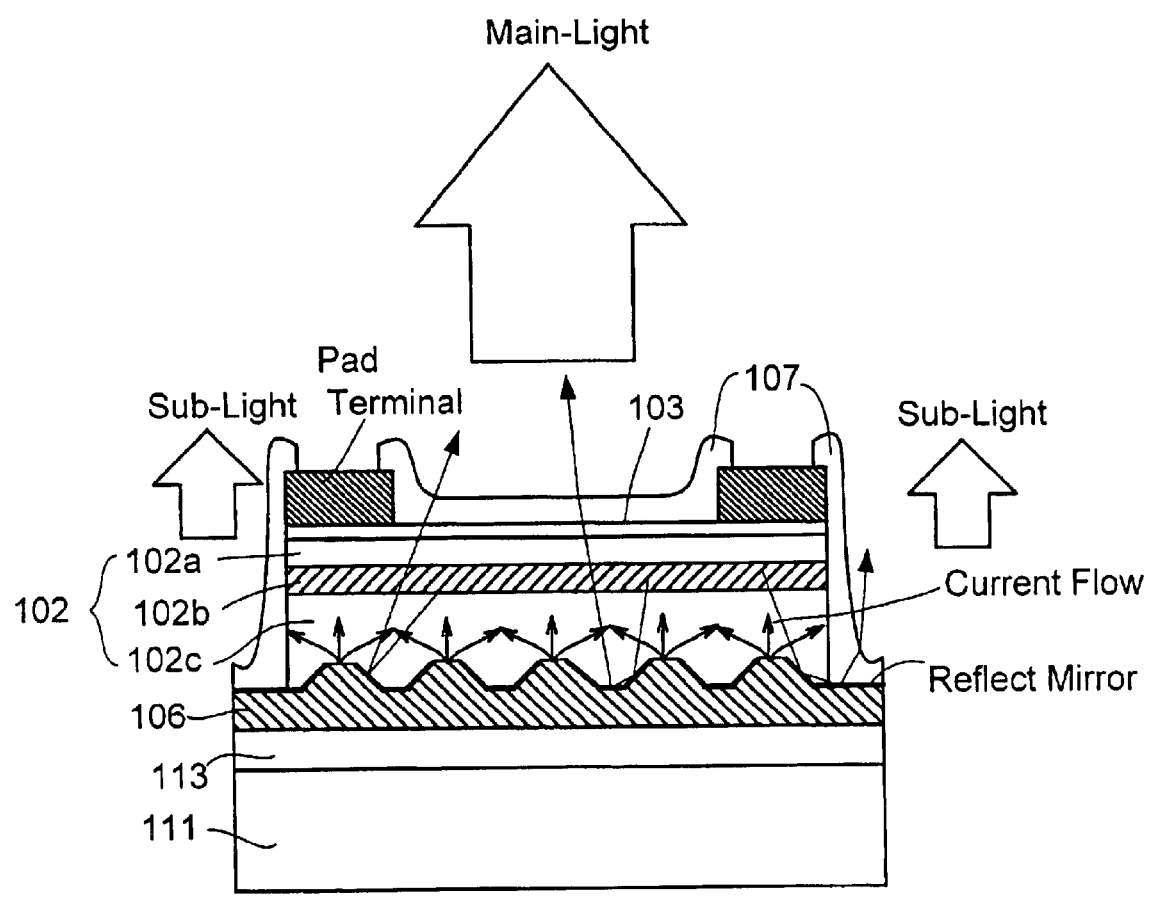

In the light-emitting element having the asperity portion at the boundary between the second terminal 106 and the semiconductor 102, the second terminal has a reflect mirror on the bottom surface and/or the inclined surface of the recess portion of the asperity portion (FIG. 15B). The reflect mirror is a material with reflecting effect as mentioned above. The reflect mirror scatters the light at the boundary effectively, so that the outgoing efficiency of the light can be improved.

EXAMPLES

Various examples of the invention will be described as follows, however, they are illustrative and not restrictive.

Example 1

A method for producing an LED element of an example 1 will be described as follows. First, a different material substrate 1 of sapphire (C-facet) is set in reactor of MOCVD, and temperature of the substrate rises to 1050° C. with flowing hydrogen, and the substrate is cleaned.

Buffer Layer

Subsequently, temperature comes down to 510° C., and a buffer layer of $Al_{0.25}Ga_{0.75}N$ is grown with thickness in approximately 100 Å on the substrate 1 with using hydrogen as carrier gas; ammonia, TMG (trimethylgallium), and TMA (trimethylaluminum) as material gas.

Second Conductive Type Nitride Semiconductor Layer

After the buffer layer is grown, a first conductive type nitride semiconductor layer is grown in order as below. First, only TMG is stopped, and temperature rises to 1050° C. After 1050° C., an undpoed GaN layer 103 is grown with thickness 1.5 μm with using TMG, and ammonia as material gas, similarly. Subsequently, at 1050° C., an n-type contact layer of GaN with doped Si concentration of $4.5 \times 10^{18}/cm^3$ is grown with thickness 2.25 μm with using TMG, ammonia as material gas, and silane gas as impurity gas, similarly. The thickness of the n-type contact layer can be 2–30 μm.

Subsequently, only silane gas is stopped, and an undoped GaN layer is grown with thickness 3000 Å with using TMG, and ammonia at 1050° C. Next, a GaN layer with doped Si concentration of $4.5 \times 10^{18}/cm^3$ is grown with thickness 300 Å with adding silane gas at same temperature. Then, only silane gas is stopped, an undoped GaN layer is grown with thickness 50 Å at same temperature. Thus, the second conductive type nitride semiconductor layer composed of three layers with total thickness 3350 Å is formed.

Subsequently, an undoped GaN layer is grown with thickness 40 Å at same temperature. Next, an undoped $In_{0.13}Ga_{0.87}N$ layer is grown with thickness 20 Å with using TMG, TMI, and ammonia at temperature 800° C. These process are performed repeatedly, each layer is laminated by turns in 10 layers respectively. Finally the GaN layer is grown with thickness 40 Å. Thus a superlattice structure layer with total thickness 640 Å is formed.

Subsequently, a barrier layer of an undoped GaN layer is grown with thickness 200 Å. Next, a well layer of undoped $In_{0.4}Ga_{0.6}N$ is grown with thickness 30 Å at temperature 800° C. Then, five barrier layers and four well layers are laminated by turns in order of (barrier layer)+(well layer)+(barrier layer)+(well layer) . . . +(barrier layer). Thus, an active layer of a multi-quantum-well layer with total thickness 1120 Å is formed. In addition, however both of the active layer and an n-side second multi-layer laminated under the active layer (the substrate side) are composed of a laminated body of GaN layer and InGaN layer, the composition of the InGaN layer included in the active layer is $In_{0.4}Ga_{0.6}N$.

First Conductive Nitride Semiconductor Layer

Subsequently, p-type $Al_{0.2}Ga_{0.8}N$ with doped Mg concentration of $1 \times 10^{20}/cm^3$ is grown with thickness 40 Å with using TMG, TMA, ammonia, and $Cp_2Mg$ (cyclopentadienyl magnesium) at temperature 1050° C. Next, a $In_{0.03}Ga_{0.97}N$ layer with doped Mg concentration of $1 \times 10^{20}/cm^3$ is grown with thickness 25 Å with using TMG, TMI, ammonia, and $Cp_2Mg$ at temperature 800° C. These process are performed repeatedly, each layer is laminated by turns in five layers respectively. Finally the p-type $Al_{0.2}Ga_{0.8}N$ layer is grown with thickness 40 Å. Thus a multi-layer with the superlattice structure with total thickness 365 Å is formed.

Subsequently, a p-type contact layer of a p-type GaN layer with doped Mg concentration of $1 \times 10^{20}/cm^3$ is grown with thickness 1200 Å with using TMG, ammonia, and $Cp_2Mg$ at 1050° C.

After the reaction, temperature comes down to room temperature, and the wafer is annealed in the reactor under atmosphere with nitrogen at 700° C. so as to reduce the resistance of the p-type layer.

After annealing, the wafer is retrieved from the reactor, then a p-type terminal is formed as a first terminal. Rh is laminated on the p-type terminal with thickness 2000 Å. Subsequently, after ohmic annealing is performed at 600° C., a second insulating protect layer $SiO_2$ is formed with thickness 0.3 μm. Then, an intimate contact layer, a barrier layer, and a eutectic layer are formed in order of Ti—Pt—Au—Sn—Au with the thickness 2000 Å–3000 Å–3000 Å–30000 Å–1000 Å, so as to form a conductive layer 5.

On the other hand, a supporting substrate is prepared. A conductive layer is formed in order of Ti—Pt—Pd with the thickness 2000 Å–3000 Å–12000 Å on the supporting substrate composed of 15% of Cu, and 85% of W with the thickness 200 μm.

Subsequently, the conductive layer 5, which is formed on the p-type terminal as the first terminal and the second insulating protect layer, and the metal-layer-formed surface of the supporting substrate are attached. The press pressure is applied at heater set temperature 280° C. Then eutectic is performed. Next, after the sapphire substrate is eliminated by grinding, the second conductive type nitride semiconductor layer is exposed. Then, the n-type contact layer, which is the exposed surface of the second conductive type nitride semiconductor layer, is polished to remove roughness of the surface.

Subsequently, GaN is broken into chips with a $SiO_2$ mask by a RIE apparatus. Next, an n-type terminal, which is the second terminal 6, is formed in order of Ti—Al—Ti—Pt—Au with the thickness 100 Å–2500 Å–1000 Å–2000 Å–6000 Å on the n-type contact layer. Then, after the supporting substrate is polished until its thickness 100 μm, Ti—Pt—Au is formed on the back surface of the supporting substrate with the thickness 1000 Å–2000 Å–3000 Å. Finally, dicing is performed. The obtained LED element as mentioned above with the size 1 mm×1 mm emits, in a forward current 20 mA, in blue with 460 nm, with output 4 mW, and Vf is 3.3 V.

Example 2

As the example 1, Ag is formed as the p-type terminal, which is first terminal. The thickness of the p-type terminal is 2000 Å, and the other conditions are same as the example 1. In the obtained LED element as mentioned above, the output is 6 mW, and Vf is 2.9 V.

Example 3

As the example 1, a supporting substrate composed of 50% of Cu and 50% of Mo with the thickness 200 μm is used. The other conditions are same as the example 1. In the obtained LED element as mentioned above, the output is 4 mW, and Vf is 2.9 V.

Example 4

As the example 1, after the n-type terminal is formed, asperity is formed in a stripe shape on the surface of the exposed n-type contact layer. The depth of the dip-portion in the asperity is 1.5 μm, and the width of the dip-portion is 3 μm, and the width of the dump-portion is 3 μm. The other conditions are same. According to this dimple process, in a forward current 20 mA, the output is 5.4 mW, and Vf is 3.18 V. In a forward current 100 mA, the output is 21.3 mW, and Vf is 3.44 V.

Example 5

As the example 1, after the n-type terminal is formed, asperity is formed on the surface of the exposed n-type contact layer. The bump-portion of the asperity is formed in a hexagonal shape in a plan view. The width of the dump-portion is 8 μm, and the width of the dip-portion is 2 μm, and the depth of the dip-portion is 1.5 μm. The other conditions are same. According to this dimple process, in a forward current 20 mA, the output is 6 mW, and Vf is 3.29 V. In addition, in a forward current 100 mA, the output is 23.4 mW, and Vf is 3.52 V.

Example 6

As the example 1, after the n-type terminal is formed, asperity is formed on the surface of the exposed n-type contact layer. The dip-portion of the asperity is formed in a hexagonal shape in a plan view by drawing out the dip-portion. The width of the dump-portion is 2 μm, and the width of the dip-portion is 8 μm, and the depth of the dip-portion is 1.5 μm. The other conditions are same. According to this dimple process, in a forward current 20 mA, the output is 6.1 mW, and Vf is 3.1 V. In addition, in a forward current 100 mA, the output is 24.7 mW, and Vf is 3.41 V.

Example 7

As the example 1, a first insulating protect layer $SiO_2$ is formed with thickness 0.3 μm on the opening portion of the p-type terminal, which is the exposed surface of the nitride semiconductor layer. Further, Al, which is reflecting layer, is formed with thickness 500 Å on the insulating protect layer.

Furthermore, after the n-type terminal, which is the second terminal, is formed, a second insulating protect layer of $ZrO_2$ (refractive index 2.2) is formed with thickness 1.5 μm. In addition, asperity is formed on the surface of the protect layer with 3-μm pitch. The dump-portion of the asperity is formed in a circle shape in a plan view. The depth of the dip-portion is 1.0 μm. Subsequently, after the supporting substrate is polished until 100 μm, dicing is performed to obtain the LED element. The obtained LED element as mentioned above with the size 1 mm×1 mm emits, in a forward current 20 mA, in blue with 460 nm, with output 6 mW, and Vf is 2.9 V. Additionally, the outgoing efficiency of the light of the LED element of this example is more than or equal to 1.5 times as much as without asperity in insulating protect layer.

Example 8

As the example 7, the bump-portion of the insulating protect layer $ZrO_2$ is formed with taper angle 60°. The other conditions are same. The outgoing efficiency of the light in the LED element of this example is more than or equal to 1.5 times as much as without asperity in insulating protect layer.

Example 9

As the example 7, $Nb_2O_5$ (refractive index 2.4) is formed as the second insulating protect layer with thickness 1.5 μm. In addition, asperity is formed on the surface of the protect layer with 3-μm pitch. The dump-portion of the asperity is formed in a circle shape in a plan view. The depth of the dip-portion is 1.0 μm. The other conditions are same as the example 1. In the obtained LED element as mentioned above, the characteristics of output and Vf are similar. In addition, the outgoing efficiency of the light in the LED element of this example is more than or equal to 1.5 times as much as without asperity in insulating protect layer $Nb_2O_5$.

Example 10

As the example 7, $TiO_2$ (refractive index 2.7) is formed as the second insulating protect layer with thickness 1.5 μm. In addition, asperity is formed on the surface of the protect layer with 3-μm pitch. The dump-portion of the asperity is formed in a circle shape in a plan view. The depth of the dip-portion is 1.0 μm. The other conditions are same as the example 1. In the obtained LED element as mentioned above, the characteristics of output and Vf are similar. In addition, the outgoing efficiency of the light in the LED element of this example is more than or equal to 1.5 times as much as without asperity in insulating protect layer $TiO_2$.

Example 11

Sapphire (C-facet) used as the different material substrate. Its surface is cleaned at 1050° C. under atmosphere with hydrogen in a reactor of MOCVD. Buffer layer: subsequently, a buffer layer 2 of GaN is grown with thickness approximately 200 Å on the substrate with using ammonia, and TMG (trimethylgallium), under atmosphere with hydrogen at 510° C. High-temperature-grown layer: after the buffer layer is grown, only TMG is stopped, and temperature rises to 1050° C. At 1050° C., a high temperature grown nitride semiconductor of undoped GaN is grown with thickness 5 μm with using TMG and ammonia as material gas. Next, an n-type cladding layer of $Al_{0.07}Ga_{0.93}N$ with doped Si concentration of $5\times10^{17}/cm^3$ is grown with thickness 3 μm with using TMG, TMA, ammonia, and silane at 1050° C.

Subsequently, at temperature 800° C., barrier layers of Si doped $Al_{0.1}Ga_{0.9}N$ and well layers of undoped $In_{0.03}Ga_{0.97}N$ thereon are laminated in order of (barrier layer 1)/(well layer 1)/(barrier layer 2)/(well layer 2)/(barrier layer 3) with using TMI (trimethylgallium indium), TMG, and TMA as material gas. At that time, the barrier layer 1 is formed in 200 Å, and the barrier layers 2 and 3 are in 40 Å, and the well layers 1 and 2 are formed in 70 Å. An active layer is formed in a multi-quantum-well structure (MQW) with total thickness approximately 420 Å.

Subsequently, a p-type cladding layer 7 of $Al_{0.2}Ga_{0.8}N$ with doped Mg concentration of $1\times10^{20}/cm^3$ is grown with thickness 600 Å with using TMG, TMA, ammonia, and Cp$_2$Mg (cyclopentadienyl magnesium) at 1050° C. under atmosphere with hydrogen. Next, a second p-type contact layer of Al$_{0.07}$Ga$_{0.93}$N with doped Mg concentration of $1\times10^{19}$/cm$^3$ is grown with thickness 0.1 μm on the p-type cladding layer with using TMG, TMA, ammonia, and Cp$_2$Mg. Then, a second p-type contact layer of Al$_{0.07}$Ga$_{0.93}$N with doped Mg concentration of $2\times10^{21}$/cm$^3$ is grown with thickness 0.02 μm with adjusting amount of the gas flow.

After growth, the wafer is annealed in the reactor under atmosphere with nitrogen at 700° C. so as to further reduce the resistance of the p-type layer. After annealing, the wafer is retrieved from the reactor, then a p-type terminal is formed as a first terminal. An Rh layer is formed on the p-type terminal with thickness 2000 Å. Subsequently, after ohmic annealing is performed at 600° C., a first insulating protect layer SiO$_2$ is formed with thickness 0.3 μm on the exposed surface except the p-type terminal.

Subsequently, a multi-layer of Ni—Pt—Au—Sn—Au with the thickness 2000 Å–3000 Å–3000 Å–30000 Å–1000 Å is formed on the p-type terminal as a conductive layer. Here, Ni is an intimate contact layer, and Pt is a barrier layer, and Sn is a first eutectic layer. In addition, the Au layer between Pt and Sn plays a role of preventing diffusion of Sn to the barrier layer. The Au layer of the top layer plays a role of improving intimate contact.

On the other hand, a metal substrate of mixed body composed of 30% of Cu and 70% of W with thickness 200 μm is used as the supporting substrate. An intimate layer of Ti, a barrier layer of Pt, and a supporting substrate side conductive layer of Au are formed with the thickness 2000 Å–3000 Å–12000 Å, successively.

Subsequently, the conductive layer formed surfaces face each other, then the nitride semiconductor element and the supporting substrate are thermocompressed at heater temperature 250° C. by press-compression. Thus, both of the conductive layers are formed in eutectic with diffused. Next, after the sapphire substrate is eliminated by grinding, the exposed buffer layer or high-temperature-grown layer is polished. Further, polishing is performed until the AlGaN layer of the cladding layer is exposed so as to remove roughness of the surface.

Subsequently, after the surface of the n-type cladding layer is polished, a multi-layer terminal of Ti—Al—Ti—Pt—Au with thickness 100 Å–2500 Å–1000 Å–2000 Å–6000 Å is formed on the n-type cladding layer as an n-type terminal, which is a second terminal. Next, the supporting substrate is polished until 200 μm, a multi-layer of Ti—Pt—Au with 1000 Å–2000 Å–3000 Å is formed on the back surface of the supporting substrate as a p-pad terminal for a p-type terminal. Finally, the element is separated by dicing.

The obtained LED element with the size 1 mm×1 mm emits, in a forward current 20 mA, in ultra-violet with 460 nm, with output 4.2 mW, and Vf is 3.47 V.

Example 12

The method is performed as similar condition of the example 11 except employing laser irradiation method instead of the polishing method when eliminating the different material substrate.

A wavelength 248 nm of KrF excimer laser is used. The laser beam with output 600 J/cm$^2$ and with a 1 mm×50 mm of line shape scans the whole of the opposite surface from a primary layer of the sapphire substrate. Thus the laser irradiation is performed. The laser irradiation decomposes the nitride semiconductor of the primary layer, then the sapphire substrate is eliminated.

In the obtained LED element, in a forward current 20 mA, the peak of light-emission wavelength is 373 nm, and Vf is 3.47V, and the output of the light-emission is 4.2 mW. In addition, because it is not necessary to grind the sapphire substrate, it can reduce the time for producing extremely compared with the example 1. The output of the light-emission is much improved compared with the conventional element.

Example 13

The nitride semiconductor element is formed as similar condition of the example 11. Further, a coating layer composed of SiO$_2$ with YAG as a fluorescent material is formed on the whole of the nitride semiconductor element.

Thus, the nitride semiconductor light-emitting element emitting white light, with less self-absorption and high converting efficiency is obtained.

Example 14

The nitride semiconductor element is formed as similar condition of the example 13. In this example, a plurality of the nitride semiconductor elements is arranged in a dot matrix on the conductive substrate. A exposed surface is formed a part of the plurality of the nitride semiconductor elements, then packaging is performed. Further, a coating layer composed of SiO$_2$ with YAG as a fluorescent material is formed on the exposed portion.

Thus, the nitride semiconductor light-emitting device, which disposes a plurality of the nitride semiconductor elements emitting white light, emits in white light with large light-emission area. This can be applied to a light source for illumination.

Example 15

Sapphire (C-facet) used as the different material substrate. Its surface is cleaned at 1050° C. under atmosphere with hydrogen in a reactor of MOCVD.

Subsequently, a buffer layer 2 of GaN is grown with thickness approximately 200 Å on the substrate with using ammonia, and TMG (trimethylgallium), under atmosphere with hydrogen at 510° C. After the buffer layer is grown, only TMG is stopped, and temperature rises to 1050° C. At 1050° C., a high temperature grown nitride semiconductor of undoped GaN is grown with thickness 5 μm as a second conductive type nitride semiconductor layer with using TMG and ammonia as material gas. Next, an n-type cladding layer of Al$_{0.1}$Ga$_{0.9}$N with doped Si concentration of $1\times10^{19}$/cm$^3$ is grown with thickness 2.5 μm with using TMG, TMA, ammonia, and silane at 1050° C.

Subsequently, at temperature 900° C., barrier layers of Si doped Al$_{0.08}$Ga$_{0.92}$N with doped Si concentration of $1\times10^{19}$/cm$^3$ and well layers of undoped In$_{0.01}$Ga$_{0.99}$N thereon are laminated in order of (barrier layer 1)/(well layer 1)/(barrier layer 2)/(well layer 2)/(barrier layer 3)/(well layer 3)/(barrier layer 4). At that time, each of the barrier layers 1, 2, 3, and 4 is formed in 370 Å, and each of the well layers 1, 2, and 3 is formed in 80 Å. Only the barrier layer 4 is undoped. An active layer is formed in a multi-quantum-well structure (MQW) with total thickness approximately 1700 Å.

Subsequently, a first conductive type nitride semiconductor layer is formed. A p-type cladding layer of Al$_{0.2}$Ga$_{0.8}$N with doped Mg concentration of $1\times10^{20}$/cm$^3$ is grown with thickness 370 Å with using TMG, TMA, ammonia, and Cp$_2$Mg (cyclopentadienyl magnesium) at temperature 1050° C. under atmosphere with hydrogen. Next, an Al$_{0.07}$Ga$_{0.93}$N layer with doped Mg concentration of 1×10$^{19}$/cm$^3$ is grown with thickness 0.1/m on the p-type cladding layer with using TMG, TMA, ammonia, and Cp$_2$Mg. Then, an Al$_{0.07}$Ga$_{0.93}$N layer with doped Mg concentration of 2×10$^{21}$/cm$^3$ is grown with thickness 0.02 μm with adjusting amount of the gas flow.

After growth, the wafer is annealed in the reactor under atmosphere with nitrogen at 700° C. so as to reduce the resistance of the p-type layer. After annealing, the wafer is retrieved from the reactor. Then an Rh layer is formed with thickness 2000 Å as a p-type terminal on the Al$_{0.07}$Ga$_{0.93}$N layer. Subsequently, after ohmic annealing is performed at 600° C., a first insulating protect layer SiO$_2$ is formed with thickness 0.3 μm on the exposed surface except the p-type terminal.

On the other hand, a substrate of mixed body composed of 30% of Cu and 70% of W with thickness 200 μm is used as the supporting substrate. An intimate layer of Ti, a barrier layer of Pt, and a supporting substrate side conductive layer of Pd are formed with the thickness 2000 Å–3000 Å–12000 Å, successively.

Subsequently, the conductive layers face each other, then the nitride semiconductor element and the supporting substrate are thermocompressed at heater temperature 250° C. by press-compression. Thus, both of the conductive layers are formed in eutectic with diffused.

Subsequently, a wavelength 248 nm of KrF excimer laser is used. The laser beam with output 600 J/cm$^2$ and with a 1 mm×50 mm of line shape scans the whole of the opposite surface from a primary layer of the sapphire substrate. Thus the laser irradiation is performed. The laser irradiation decomposes the nitride semiconductor of the primary layer, then the sapphire substrate is eliminated. Further, polishing is performed until the rest of thickness of the n-type cladding layer of n-type Al$_{0.1}$Ga$_{0.9}$N is about 2.2 μm so as to remove roughness of the surface.

Subsequently, a multi-layer terminal of Ti—Al—Ni—Au is formed as an n-type terminal. Next, the supporting substrate is polished until 100 μm, a multi-layer of Ti—Pt—Au—Sn—Au with 2000 Å–3000 Å–3000 Å–30000 Å–1000 Å is formed on the back surface of the supporting substrate as a pad terminal for a p-type terminal. Finally, the element is separated by dicing. The n-type terminal and the p-type terminal are formed in a grid shape over the whole of the respective surfaces of the semiconductor layer. At that time, they are in formed in a staggered format so that the opening portions among the grid patterns of the n-side and the p-side do not overlap each other.

The obtained LED element with the size 1 mm×1 mm emits, in a forward current 20 mA, in ultra-violet with 365 nm, with output 2.4 mW, and Vf is 3.6 V.

Example 16

A blue LED element of this example will be described as follows.

Sapphire (C-facet) used as the different material substrate. Its surface is cleaned at 1050° C. under atmosphere with hydrogen in a reactor of MOCVD.

Subsequently, a buffer layer 2 of GaN is grown with thickness approximately 200 Å on the substrate with using ammonia, and TMG (trimethylgallium), under atmosphere with hydrogen at 510° C. After the buffer layer is grown, only TMG is stopped, and temperature rises to 1050° C. After 1050° C., an n-type contact layer of GaN with doped Si concentration of 1×10$^{18}$/cm$^3$ is grown with thickness 5 μm with using TMG, ammonia, and silane gas. Next, an n-type cladding layer 5 of Al$_{0.18}$Ga$_{0.82}$N with doped Si concentration of 5×10$^{17}$/cm$^3$ is grown with thickness 400 Å with using TMG, TMA, ammonia, and silane at 1050° C.

Subsequently, at temperature 800° C., barrier layers of Si doped GaN and well layers of undoped InGaN thereon are laminated in order of (barrier layer)/(well layer)/(barrier layer)/(well layer)/(barrier layer) with using TMI, TMG, and TMA as material gas. At that time, the barrier layers are formed in 200 Å, and the well layers are formed in 50 Å. An active layer is formed in a multi-quantum-well structure (MQW) with total thickness approximately 700 Å.

Subsequently, a p-type cladding layer 7 of Al$_{0.2}$Ga$_{0.8}$N with doped Mg concentration of 1×10$^{20}$/cm$^3$ is grown with thickness 600 Å with using TMG, TMA, ammonia, and Cp$_2$Mg (cyclopentadienyl magnesium) at temperature 1050° C. under atmosphere with hydrogen. Next, a p-type contact layer of GaN layer with doped Mg concentration of 2×10$^{21}$/cm$^3$ is grown with thickness 0.15 μm on the p-type cladding layer with using TMG, ammonia, and Cp$_2$Mg.

After growth, the wafer is annealed in the reactor under atmosphere with nitrogen at 700° C. so as to reduce the resistance of the p-type layer.

After annealing, the wafer is retrieved from the reactor, then an Rh layer is formed on the p-type contact layer with thickness 2000 Å. Subsequently, after ohmic annealing is performed at 600° C., a first insulating protect layer SiO$_2$ is formed with thickness 0.3 μm on the exposed surface except the p-type terminal.

Subsequently, a multi-layer Ni—Pt—Au—Sn—Au with the thickness 2000 Å–3000 Å–3000 Å–30000 Å–1000 Å is formed on the p-type terminal as a conductive layer. Here, Ni is an intimate contact layer, and Pt is a barrier layer, and Sn is a first eutectic layer. In addition, the Au layer between Pt and Sn plays a role of preventing diffusion of Sn to the barrier layer. The Au layer of the top layer plays a role of improving intimate contact.

On the other hand, a substrate of mixed body composed of 30% of Cu and 70% of W with thickness 200 μm is used as the supporting substrate. An intimate layer of Ti, a barrier layer of Pt, and a supporting substrate side conductive layer of Au are formed with the thickness 2000 Å–3000 Å–12000 Å, successively.

Subsequently, the conductive layers of the nitride semiconductor element and the supporting substrate are thermocompressed at heater temperature 250° C. by press-compression. Thus, both of the conductive layers are formed in eutectic with diffused.

Subsequently, a wavelength 248 nm of KrF excimer laser is used. The laser beam with output 600 J/cm$^2$ and with a 1 mm×50 mm of line shape scans the whole of the opposite surface from a primary layer of the sapphire substrate. Thus the laser irradiation is performed. The laser irradiation decomposes the nitride semiconductor of the primary layer, then the sapphire substrate is eliminated. Further, polishing is performed until the n-type contact layer is exposed so as to remove roughness of the surface.

Next, a multi-layer terminal of Ti—Al—Ti—Pt—Au with the thickness 100 Å–2500 Å–1000 Å–2000 Å–6000 Å is formed on the n-type contact layer as a second terminal. Then, after the supporting substrate is polished until its thickness 100 μm, a multi-layer terminal of Ti—Pt—Au is formed on the back surface of the supporting substrate with the thickness 1000 Å–2000 Å–3000 Å as a pad terminal for a p-type terminal. Finally, the element is separated by dicing.

The obtained LED element with the size 1 mm×1 mm emits, in a forward current 20 mA, in blue with 460 nm.

Example 17

The nitride semiconductor element is formed as similar condition of the example 16. Further, a coating layer composed of $SiO_2$ with YAG as a fluorescent material is formed on the whole of the nitride semiconductor element. Thus, the nitride semiconductor light-emitting device emits white light.

Example 18

The nitride semiconductor element is formed as similar condition of the example 17. In this example, a plurality of the nitride semiconductor elements is arranged in a dot matrix on the conductive substrate. An exposed surface is formed a part of the plurality of the nitride semiconductor elements, then packaging is performed. Further, a coating layer composed of $SiO_2$ with YAG as a fluorescent material is formed on the exposed portion.

Thus, the nitride semiconductor light-emitting device, which disposes a plurality of the nitride semiconductor elements emitting white light, emits in white light with large light-emission area. This can be applied to a light source for illumination.

Example 19

Sapphire (C-facet) used as the different material substrate. Its surface is cleaned at 1050° C. under atmosphere with hydrogen in a reactor of MOCVD.

Subsequently, a buffer layer of GaN is grown with thickness approximately 200 Å on the substrate with using ammonia, and TMG (trimethylgallium), under atmosphere with hydrogen at 510° C. After the buffer layer is grown, only TMG is stopped, and temperature rises to 1050° C. At 1050° C., a high temperature grown nitride semiconductor of undoped GaN is grown with thickness 5 μm with using TMG and ammonia as material gas.

After the high-temperature-grown layer is grown, a composition grading AlGaN layer is formed with thickness 0.4 μm with using TMG and ammonia as material gas at same temperature. The composition grading AlGaN layer plays a role of reducing lattice mismatch between the high-temperature-grown layer and an n-type cladding layer. It is grown with increasing the mixed crystal ratio of Al and the amount of doped Si form undoped GaN to a n-type $Al_{0.07}Ga_{0.93}N$ with doped Si concentration of $1\times10^{19}/cm^3$ gradually.

Next, an n-type cladding layer 5 of $Al_{0.07}Ga_{0.93}N$ with doped Si concentration of $1\times10^{19}/cm^3$ is grown with thickness 2.5 μm with using TMG, TMA, ammonia, and silane at 1050° C.

Subsequently, at temperature 900° C., barrier layers of Si doped $Al_{0.09}Ga_{0.91}N$ with doped Si concentration of $1\times10^{19}/cm^3$ and well layers of undoped $In_{0.01}Ga_{0.99}N$ thereon are laminated in order of (barrier layer 1)/(well layer 1)/(barrier layer 2)/(well layer 2)/(barrier layer 3)/(well layer 3)/(barrier layer 4). At that time, each of the barrier layers 1, 2, 3, and 4 is formed with thickness 200 Å, and each of the well layers 1, 2, and 3 is formed with thickness 60 Å. Only the barrier layer 4 is undoped.

Subsequently, a p-type cladding layer 7 of $Al_{0.38}Ga_{0.62}N$ with doped Mg concentration of $1\times10^{20}/cm^3$ is grown with thickness 270 Å with using TMG, TMA, ammonia, and $Cp_2Mg$ (cyclopentadienyl magnesium) at 1050° C. under atmosphere with hydrogen. Next, a second p-type contact layer of $Al_{0.07}Ga_{0.93}N$ with doped Mg concentration of $4\times10^{18}/cm^3$ is grown with thickness 0.1 μm on the p-type cladding layer with using TMG, TMA, ammonia, and $Cp_2Mg$. Then, a second p-type contact layer of $Al_{0.07}Ga_{0.93}N$ with doped Mg concentration of $1\times10^{21}/cm^3$ is grown with thickness 0.02 μm with adjusting amount of the gas flow.

After growth, the wafer is annealed in the reactor under atmosphere with nitrogen at 700° C. so as to reduce the resistance of the p-type layer.

After annealing, the wafer is retrieved from the reactor, then an Rh layer is formed on the p-type contact layer with thickness 2000 Å as a p-type terminal. Subsequently, after ohmic annealing is performed at 600° C., a insulating protect layer $SiO_2$ is formed with thickness 0.3 μm on the exposed surface except the p-type terminal.

On the other hand, a substrate of mixed body composed of 15% of Cu and 85% of W with thickness 200 μm is used as the supporting substrate. An intimate layer of Ti, a barrier layer of Pt, and a supporting substrate side conductive layer of Pd are formed with the thickness 2000 Å–3000 Å–12000 Å, successively.

Subsequently, the conductive layers of the nitride semiconductor element and the supporting substrate are thermocompressed at heater temperature 250° C. by press-compression. Thus, both of the conductive layers are formed in eutectic with diffused.

Subsequently, a wavelength 248 nm of KrF excimer laser is used. The laser beam with output 600 $J/cm^2$ and with a 1 mm×50 mm of line shape scans the whole of the opposite surface from a primary layer of the sapphire substrate. Thus the laser irradiation is performed. The laser irradiation decomposes the nitride semiconductor of the primary layer, then the sapphire substrate is eliminated. Further, the primary layer, the high-temperature-grown layer, and the composition grading layer are polished. Furthermore, polishing is performed until the rest of the thickness of n-type cladding layer, which is formed of n-type $Al_{0.3}Ga_{0.7}N$, is about 2.2 μm so as to remove roughness of the surface.

Subsequently, a multi-layer terminal of Ti—Al—Ni—Au is formed as an n-type terminal, which is a second terminal. In consideration of the outgoing efficiency of the light, the n-type terminal is formed not on the whole of the surface but with 70% of the opening ratio. Next, the supporting substrate is polished until 100 μm, a multi-layer of Ti—Pt—Au—Sn—Au with 2000 Å–3000 Å–3000 Å–30000 Å–1000 Å is formed on the back surface of the supporting substrate as a pad terminal for a p-type terminal. Finally, the element is separated by dicing. The n-type terminal and the p-type terminal are formed in a grid pattern shape over the whole of the respective surfaces of the semiconductor layer. At that time, they are in formed in a staggered format so that the opening portions among the grid patterns of the n-side and the p-side do not overlap each other.

This element emit, in 500 mA of pulse current at room temperature, in ultra-violet with 365 nm, and the output is 118 mW, and driving voltage is 4.9 V, and external quantum efficiency is 6.9%. In addition, it emits, in 500 mA of direct current at room temperature, in ultra-violet with 365 nm, and the output is 100 mW, and driving voltage is 4.6 V, and external quantum efficiency is 5.9%.

Example 20

After the nitride semiconductor is grown on the Sapphire substrate, then annealed. Next, the nitride semiconductor is etched on its surface with depth 4.5 μm by RIE. Then, a first terminal (p-type terminal) of its material Ni—Au with thickness 80 Å–100 Å is formed. After that, it is annealed under atmosphere with oxygen at 600° C.

Subsequently, a Cu—W substrate (Cu 15%) as a second substrate is prepared, then it is thermocompressed to the first terminal forming surface of the nitride semiconductor with epoxy sheet at 150° C. Next, the back of the sapphire substrate is polish so as to be mirror-like. Further, excimer laser is irradiated from the back of the sapphire substrate to remove the nitride semiconductor from the sapphire substrate. Then, CMP exposes the surface of the Si doped GaN. After that, resist is formed in a mesh shape on the exposed surface of the GaN, and the GaN is etched with depth 1 μm by RIE. Bump-portions of the GaN formed in a mesh shape are hexagonal shapes with 5-μm pitch in a plan view.

Subsequently, a surface treatment is performed to the etched surface of the nitride semiconductor by BHF, and a second terminal (n-side terminal) 6 of Al—Pt—Sn with thickness 2000 Å–2000 Å–30000 Å is formed from GaN side. Further, CuW substrate (Cu 15%) as a supporting substrate is prepared, and a eutectic 7 of Ti—Pt—Pd with thickness 2000 Å–2000 Å–15000 Å is formed. After that, the nitride semiconductor with the second substrate and the supporting substrate is thermocompressed at 250° C.

In addition, the nitride semiconductor attached with the supporting substrate is inserted in a boiled acetone solution. Then, the second substrate is removed from the epoxy sheet as a bonding layer 4. As mentioned above, the nitride semiconductor is formed on the supporting substrate.

Subsequently, a protect layer 9 of $SiO_2$ is formed on the second terminal (p-side terminal) except a pad terminal forming region. Then, a pad terminal of Ni—Au with thickness 1000 Å–6000 Å is formed on the pad-terminal-forming region.

Subsequently, the supporting substrate 8 is polished until 100 μm, an LED element is obtained by dicing. The obtained LED element mentioned above with size 1 mm×1 mm emits, in a forward current 20 mA, in blue with 460 nm, with output more than or equal to 6 mW, and Vf is 2.9 V. In addition, the outgoing efficiency of the light of the LED element of this example is more than or equal to 1.5 times as much as the LED element without asperity in the nitride semiconductor.

Example 21

As the example 20, an LED element with nitride semiconductor 2 emitting in ultra-violet is formed. The other conditions are similar to the example 20. The conditions of the nitride semiconductor 2 are explained as follows.

A buffer layer of GaN with thickness 200 Å, a undoped GaN layer with thickness 5 μm, an n-type cladding layer of Si doped $Al_{0.18}Ga_{0.82}N$ (amount of doped Si: $5\times10^{17}/cm^3$) with thickness 400 Å, and an active layer with total thickness 420 Å, which is composed of (Si doped $Al_{0.1}Ga_{0.9}N$ with thickness 200 Å)/($In_{0.03}Al_{0.02}Ga_{0.95}N$ with thickness 70 Å)/(Si doped $Al_{0.1}Ga_{0.9}N$ with thickness 40 Å), are formed. Subsequently, a p-type cladding layer of Mg doped $Al_{0.2}Ga_{0.8}N$ with thickness 600 Å, and a p-type contact layer, which is composed of Mg doped $Al_{0.04}Ga_{0.96}N$ (amount of doped Mg: $1\times10^{19}/cm^3$) with thickness 0.1 μm and Mg doped $Al_{0.01}Ga_{0.99}N$ (amount of doped Mg: $2\times10^{21}/cm^3$) with thickness 0.02 μm, are formed The obtained LED element mentioned above with size 1 mm×1 mm emits, in a forward current 20 mA, in ultra-violet with 373 nm, with output 4.2 mW, and Vf is 3.5 V.

Example 22

As the example 20, Rh is employed as a second terminal. The second terminal is formed with thickness 2000 Å in a mesh shape with hexagonal shapes with 5-μm pitch. The other conditions are similar to the example 20. The obtained LED element mentioned above has the characteristics similar to the example 1.

Example 23

An insulating AlN substrate is employed as the supporting substrate, and both terminals are formed in the same plane side (FIG. 17). The other conditions are similar to the example 23. The obtained LED element mentioned above emits, in a forward current 20 mA, in blue with 460 nm, with output more than or equal to 5 mW, and Vf is 3.0 V.

Example 24

As the example 1, conductive wires connect the LED element with external terminals, then a coating layer including a fluorescent material on the LED element in the method explained below.

1. First, resist or polyimide film is formed on the terminal of the LED element.
2. Next, as mentioned above, an yttrium-aluminum garnet system fluorescent material activated with cerium, an ethylene silicate hydrolysis solution, and a high boiling-point solvent are adjusted as a mixed solution. Then it is stirred to disperse the fluorescent material as applying liquid.
3. The applying liquid is applied to the top surface and side surfaces of the LED element except the supporting substrate and the portion, on which the protect layer is formed, by the above spray coating method.
4. First curing is performed by drying at 150° C. for 30 minutes, and a several ten μm of layer is formed.
5. An ethylene silicate hydrolysis solution without fluorescent materials is impregnated on the formed layer.
6. Finally, the resist or the polyimide film is eliminated, then second curing is performed by drying at 240° C. for 30 minutes. The processes from 1 to 6 mentioned above forms the coating layer 14, which is a continuous layer at least on the exposed surface of the nitride semiconductor layer with total thickness 5–10 μm. The layer is disposed on the top surface, the side surfaces, and the corners of the LED element except the terminal of the element. The layer is formed with thickness 20–30 μm uniformly.

The light-emitting device of the example has the fluorescent material, whose material is an inorganic material not to deteriorate even in use with the light-emitting element emitting in blue region to ultra-violet region, applied on the light-emitting element. Therefore, it can provide the light-emitting device with less color variation of light-emission even in use for long time. In addition, the coating layer 14 with approximately uniform thickness is formed at least the surface to be observed light-emission, so that the color temperature of the light-emitting device of the example is observed in all directions uniformly. Additionally, the coating layer is formed on the all surfaces to be observed the light from the light-emitting element, so that all light do not pass through the supporting substrate. Thus, the outgoing efficiency of the light converted wavelength by the fluorescent material is improved compared with the conventional light-emitting element using the sapphire substrate. In addition, using the supporting substrate with high thermal conductivity can improve thermal dissipation compared with the conventional light-emitting element using the sapphire substrate.

Example 25

A coating layer is formed with material, which is the applying liquid adjusted as the example 24 or silicone with the yttrium-aluminum garnet system fluorescent material activated with cerium by screen printing. When the silicone with the fluorescent material is employed, curing is performed at 150° C. for 1 hour. The scribe line is drawn on the semiconductor wafer, then the wafer is broken into chips as the light-emitting element by dicing.

Thus, the coating layer 14 with the fluorescent material is formed in a wafer state, so that it is possible to inspect and to select the light-emission color at the stage previous to form a light-emitting device with disposing the LED chip on a metal package, etc., that is, at the stage forming the coating layer with the fluorescent material on the LED chip. Therefore it improves the manufacturing yield of the light-emitting device. In addition, the color temperature of LED chip, on which the coating layer 14 is formed, of this example can be observed uniformly in all directions to observe the light-emission of the LED.

Example 26

It is possible to form a mesa shape or reverse-mesa shape, and an island shape, a grid pattern shape, a rectangular shape, a circle shape, or polygonal shape on the exposed surface of the nitride semiconductor element as the example 24. The coating layer is formed on the exposed surface, to which dimple process performs, and the side surfaces of the semiconductor layer similarly as the example 25. It is preferable that the thickness of the coating layer on the top surface, the side surfaces, and the corners of the light-emitting element are nearly uniform.

Thus, forming in that shape can improve the outgoing efficiency of the light from the light-emitting element, and also can provide the light-emitting device with less color variation of light-emission even in use for long time.

Example 27

In the example 19, after the insulating protect layer $SiO_2$ is formed on the exposed surface except the p-type terminal, a eutectic-forming layer of Rh—Ir—Pt is formed on the p-type layer. The other conditions are same as the example 20. The obtained LED element mentioned above has same characteristics as the example 1.

Example 28

The light-emitting element is formed in the same manner of the example 19 except the n-type cladding layer. The n-type cladding layer of this example is formed as follows.

A first n-type cladding layer of $Al_{0.07}Ga_{0.93}N$ with doped Si concentration of $1 \times 10^{19}/cm^3$ is grown with thickness 1.7 $\mu m$ with using TMG, TMA, ammonia, and silane at 1050° C., and a second n-type cladding layer of $Al_{0.07}Ga_{0.93}N$ with doped Si concentration of $2 \times 10^{17}/cm^3$ is grown with thickness 0.8 $\mu m$ thereon. They are formed as the n-type cladding layer. The obtained LED element mentioned above can reduce the driving voltage about 0.3 V lower than the example 19, and can reduce element deterioration in a long-duration light emission.

Example 29

A buffer layer of GaN is grown with thickness approximately 200 Å on a sapphire substrate. Subsequently, temperature rises to 1050° C. At 1050° C., a high temperature grown nitride semiconductor of undoped GaN is grown with thickness 5 $\mu m$ with using TMG and ammonia as material gas.

Second Conductive Type Nitride Semiconductor Layer

Next, an n-type cladding layer of $Al_{0.18}Ga_{0.82}N$ with doped Si concentration of $5 \times 10^{17}/cm^3$ is grown with thickness 400 Å with using TMG, TMA, ammonia, and silane at 1050° C.

Active Layer

Subsequently, at temperature 800° C., barrier layers of Si doped $Al_{0.1}Ga_{0.9}N$ and well layers of undoped $In_{0.03}Al_{0.02}Ga_{0.95}N$ thereon are laminated in order of (barrier layer 1)/(well layer 1)/(barrier layer 2)/(well layer 2)/(barrier layer 3) with using TMI (trimethylgallium indium), TMG, and TMA as material gas. At that time, the barrier layer 1 is formed in 200 Å, and the barrier layers 2 and 3 are in 40 Å, and the well layers 1 and 2 are formed in 70 Å. An active layer is formed in a multi-quantum-well structure (MQW) with total thickness approximately 420 Å.

First Conductive Type Nitride Semiconductor Layer

Subsequently, a p-type cladding layer of $Al_{0.2}Ga_{0.8}N$ with doped Mg concentration of $1 \times 10^{20}/cm^3$ is grown with thickness 600 Å with using TMG, TMA, ammonia, and $Cp_2Mg$ (cyclopentadienyl magnesium) at 1050° C. under atmosphere with hydrogen. Next, a second p-type contact layer of $Al_{0.04}Ga_{0.96}N$ with doped Mg concentration of $1 \times 10^{19}/cm^3$ is grown with thickness 0.1 $\mu m$ on the p-type cladding layer with using TMG, TMA, ammonia, and $Cp_2Mg$. Then, a second p-type contact layer of $Al_{0.01}Ga_{0.99}N$ with doped Mg concentration of $2 \times 10^{21}/cm^3$ is grown with thickness 0.02 $\mu m$ with adjusting amount of the gas flow.

After growth, the wafer is annealed in the reactor under atmosphere with nitrogen at 700° C. so as to further reduce the resistance of the p-type layer.

After annealing, the wafer is retrieved from the reactor, then a p-type terminal is formed as a first terminal. An Rh layer is formed on the p-type terminal with thickness 2000 Å. Subsequently, after ohmic annealing is performed at 600° C., a first insulating protect layer $SiO_2$ is formed with thickness 0.3 $\mu m$ on the exposed surface except the p-type terminal.

Subsequently, a multi-layer of Ni—Pt—Au—Sn—Au with the thickness 2000 Å–3000 Å–3000 Å–30000 Å–1000 Å is formed on the p-type terminal as a conductive layer 5. Here, Ni is an intimate contact layer, and Pt is a barrier layer, and Sn is a first eutectic layer. In addition, the Au layer between Pt and Sn plays a role of preventing diffusion of Sn to the barrier layer. The Au layer of the top layer plays a role of improving intimate contact with the conductive layer 12 of the supporting substrate side.

On the other hand, a metal substrate of mixed body composed of 30% of Cu and 70% of W with thickness 200 $\mu m$ is used as the supporting substrate 11. An intimate layer of Ti, a barrier layer of Pt, and a supporting substrate side conductive layer of Au are formed with the thickness 2000 Å–3000 Å–12000 Å, successively.

Subsequently, the conductive layer formed surfaces face each other, then the nitride semiconductor element and the supporting substrate are thermocompressed at heater temperature 250° C. by press-compression. Thus, both of the conductive layers are formed in eutectic with diffused.

Next, after the sapphire substrate is eliminated by grinding, the exposed buffer layer or high-temperature-grown layer is polished. Further, polishing is performed until the AlGaN layer of the cladding layer is exposed so as to remove roughness of the surface.

Subsequently, a multi-layer terminal of Ti—Al—Ti—Pt—Au with thickness 100 Å–2500 Å–1000 Å–2000 Å–6000 Å is formed on the n-type contact layer as an n-type terminal, which is a second terminal. Next, the supporting substrate is polished until 200 $\mu$m, a multi-layer of Ti—Pt—Au with 1000 Å–2000 Å–3000 Å is formed on the back surface of the supporting substrate as a p-pad terminal for a p-type terminal. Finally, the element is separated by dicing.

The obtained LED element with the size 1 mm×1 mm emits, in a forward current 20 mA, in ultra-violet with 460 nm, with output 4.2 mW, and Vf is 3.47 V.

Example 30

The nitride semiconductor element is formed as similar condition of the example 29. Further, a coating layer composed of $SiO_2$ with YAG as a fluorescent material is formed on the whole of the nitride semiconductor element.

Thus, the nitride semiconductor light-emitting element emitting white light, with less self-absorption and high converting efficiency is obtained.

Example 31

The nitride semiconductor element is formed as similar condition of the example 30. In this example, a plurality of the nitride semiconductor elements is arranged in a dot matrix on the conductive substrate. An exposed surface is formed a part of the plurality of the nitride semiconductor elements, then packaging is performed. Further, a coating layer composed of $SiO_2$ with YAG as a fluorescent material is formed on the exposed portion.

Thus, the nitride semiconductor light-emitting device, which disposes a plurality of the nitride semiconductor elements emitting white light, emits in white light with large light-emission area. This can be applied to a light source for illumination.

Example 32

The different material substrate of sapphire (C-facet) used. Its surface is cleaned at 1050° C. under atmosphere with hydrogen in a reactor of MOCVD.

Subsequently, a buffer layer 2 of GaN is grown with thickness approximately 200 Å on the substrate with using ammonia, and TMG (trimethylgallium), under atmosphere with hydrogen at 510° C. After the buffer layer is grown, only TMG is stopped, and temperature rises to 1050° C. At 1050° C., a high temperature grown nitride semiconductor of undoped GaN is grown with thickness 5 $\mu$m with using TMG and ammonia as material gas.

First Conductive Type Nitride Semiconductor Layer

Next, an n-type cladding layer of $Al_{0.1}Ga_{0.9}N$ with doped Si concentration of $1\times10^{19}/cm^3$ is grown with thickness 2.5 $\mu$m with using TMG, TMA, ammonia, and silane at 1050° C.

Active Layer

Subsequently, at temperature 900° C., barrier layers of Si doped $Al_{0.08}Ga_{0.92}N$ with doped Si concentration of $1\times10^{19}/cm^3$ and well layers of undoped $In_{0.1}Ga_{0.9}N$ thereon are laminated in order of (barrier layer 1)/(well layer 1)/(barrier layer 2)/(well layer 2)/(barrier layer 3)/(well layer 3)/(barrier layer 4). At that time, each of the barrier layers 1, 2, 3, and 4 is formed in 370 Å, and each of the well layers 1, 2, and 3 is formed in 80 Å. Only the barrier layer 4 is undoped. An active layer is formed in a multi-quantum-well structure (MQW) with total thickness approximately 1700 Å.

Second Conductive Type Nitride Semiconductor Layer

Subsequently, a p-type cladding layer of $Al_{0.2}Ga_{0.8}N$ with doped Mg concentration of $1\times10^{20}/cm^3$ is grown with thickness 370 Å with using TMG, TMA, ammonia, and $Cp_2Mg$ (cyclopentadienyl magnesium) at temperature 1050° C. under atmosphere with hydrogen. Next, an $Al_{0.07}Ga_{0.93}N$ layer with doped Mg concentration of $1\times10^{19}/cm^3$ is grown with thickness 0.1 $\mu$m on the p-type cladding layer with using TMG, TMA, ammonia, and $Cp_2Mg$. Then, an $Al_{0.07}Ga_{0.93}N$ layer with doped Mg concentration of $2\times10^{21}/cm^3$ is grown with thickness 0.02 $\mu$m with adjusting amount of the gas flow.

After growth, the wafer is annealed in the reactor under atmosphere with nitrogen at 700° C., so as to reduce the resistance of the p-type layer.

After annealing, the wafer is retrieved from the reactor. Then an Rh layer is formed with thickness 2000 Å as a p-type terminal on the $Al_{0.07}Ga_{0.93}N$ layer. Subsequently, after ohmic annealing is performed at 600° C., a first insulating protect layer $SiO_2$ is formed with thickness 0.3 $\mu$m on the exposed surface except the p-type terminal. Subsequently, a multi-layer of Rh—Ir—Pt is formed on the p-type terminal as the first conductive layer.

On the other hand, a substrate of mixed body composed of 30% of Cu and 70% of W with thickness 200 $\mu$m is used as the supporting substrate. An intimate layer of Ti, a barrier layer of Pt, and a supporting substrate side conductive layer of Pd are formed with the thickness 2000 Å–3000 Å–12000 Å, successively.

Subsequently, the conductive layers face each other, then the nitride semiconductor element and the supporting substrate are thermocompressed at heater temperature 250° C. by press-compression. Thus, both of the conductive layers are formed in eutectic with diffused.

Subsequently, a wavelength 248 nm of KrF excimer laser is used. In the laminated body, which is bonded with the supporting substrate, for bonding, the laser beam with output 600 $J/cm^2$ and with a 1 mm×50 mm of line shape scans the whole of the opposite surface from a primary layer of the sapphire substrate. Thus the laser irradiation is performed. The laser irradiation decomposes the nitride semiconductor of the primary layer, then the sapphire substrate is eliminated. Further, polishing is performed until the rest of thickness of the n-type cladding layer of n-type $Al_{0.3}Ga_{0.7}N$ is about 2.2 $\mu$m, so as to remove roughness of the surface.

Subsequently, a multi-layer terminal of Ti—Al—Ni—Au is formed as an n-type terminal. Next, the supporting substrate is polished until 100 $\mu$m, a multi-layer of Ti—Pt—Au—Sn—Au with 2000 Å–3000 Å–3000 Å–30000 Å–1000 Å is formed on the back surface of the supporting substrate as a pad terminal for a p-type terminal. Finally, the element is separated by dicing. The n-type terminal and the p-type terminal are formed in a grid shape over the whole of the respective surfaces of the semiconductor layer. At that time, they are in formed in a staggered format so that the opening portions among the grid patterns of the n-side and the p-side do not overlap each other.

The obtained LED element with the size 1 mm×1 mm emits, in a forward current 20 mA, in ultra-violet with 365 nm, with output 2.4 mW, and Vf is 3.6 V.

Example 33

Figure 20A:
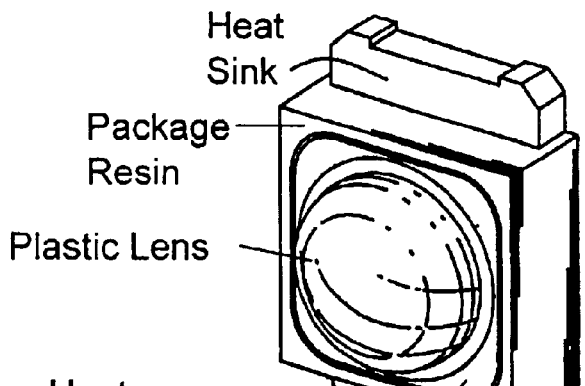
FIGS. 20A–20C show a perspective view, a plan view, and a schematic cross-sectional diagram of the light-emitting device according to another embodiment of the invention.
Figure 20B:
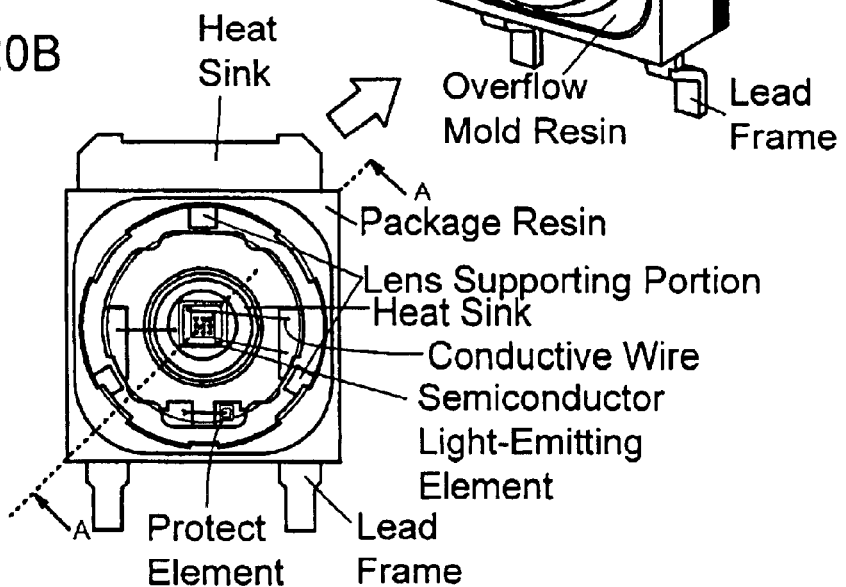
Figure 20C:
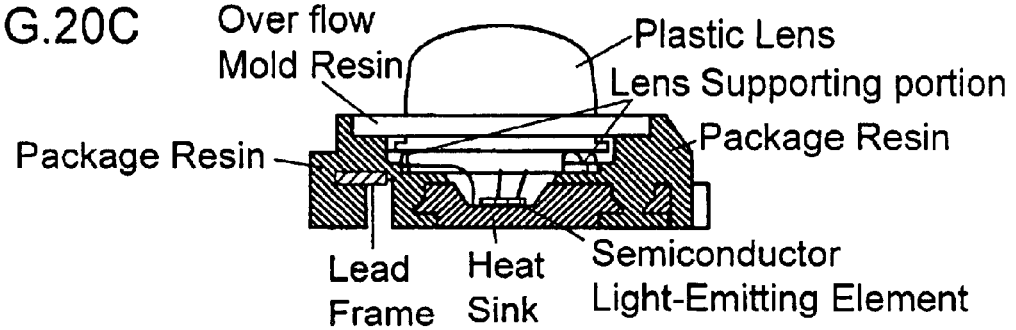

The light-emitting element obtained in the example 1 is die-bonded on a bottom surface of an opening portion of a heat sink (package) by epoxy resin. The bonding material is not specifically limited for die-bonding, for example, Au—Sn alloy; resin, glass including a conductive material; or the like can be employed. It is preferable to employ Ag as the included conductive material. Employing Ag paste with Ag content 80–90% can provide the light-emitting device with high heat dissipation and with less stress after bonding. Subsequently, Au wires electrically connect each terminal of the die-bonded semiconductor light-emitting device with each terminal exposed from the bottom surface of the opening portion of the package (FIG. 20)

Next, 3 wt % of light calcium carbonate (refractive index 1.62), whose average particle size is 1.0 μm, and oil absorption is 70 ml/100 g, is added as a diffusion material against 100 wt % of phenyl methyl system silicone resin composition (refractive index 1.53), then it is stirred by a rotation-revolution mixer for 5 minutes. Subsequently, to cool the heat cause of the stirring, set it aside for 30 minutes, thereby the resin cools, and becomes stable.

The obtained cure composition as mentioned above is injected in the opening portion of package until the same plane with the top surface of the walls thereof. Finally, the heat treatment is performed at 70° C. for three hours and at 150° C. for one hour. Consequently, the light-emitting surface with a recess, which has a parabola shape from center to the ends of the opening portion uniformly surrounded by the walls, is obtained. In addition, the cured mold material of the cure composition is composed of a first layer with high content of diffusion material and a second layer with lower content of or without diffusion material separately. The first layer covers the surface of the light-emitting element. Accordingly, the light emitted from the light-emitting element can outgo effectively and uniformly. It is preferable that the first layer is formed from the bottom surface of the opening portion and the surface of the light-emitting element continuously. Thus, a smooth shape of the light-emission surface is formed in the opening portion.

In the light-emitting device according to this example, the light emitted from the light-emitting element can outgo thorough the front surface side with low loss. The light from the light-emitting element can move into a light-incident surface of an optical guide plate in wide range even the light-emitting device is thin.

Example 34

The light-emitting device is formed in the same manner of the example 33 except that the mold material includes a fluorescent material.

As for the fluorescent material, solution dissolving rare-earth elements, Y, Gd, and Ce, in acid according to stoichiometry ratio is coprecipitated with oxalic acid. Then, mixing coprecipitation oxides, which are formed by burning the coprecipitated materials, and an aluminum oxide, a mixed material can be obtained. After mixing the mixed material and barium fluoride as flux, inserting them in to a crucible, then burning them at temperature 1400° C. in air for 3 hours, a burned material can be obtained. Next, the burned material is crushed in water by a ball mill. Then washing, separating, drying it, finally sifting it through a sieve, the fluorescent material, $(Y_{0.995}Gd_{0.005})_{2.750}Al_5O_{12}:Ce_{0.250}$ with center particle size 8 μm can be formed.

Including the fluorescent material can provide the light-emitting device with mixed light mixing the light from the light-emitting element and the light, to which the light from the light-emitting element is partially converted with converting its wavelength by the fluorescent material.

Example 35

The light-emitting device is formed in the same manner of the example 33 except using the light-emitting element obtained in the example 19. In the light-emitting device according to this example, the light emitted from the light-emitting element can outgo thorough the front surface side with low loss. The light from the light-emitting element can move into a light-incident surface of an optical guide plate in wide range even the light-emitting device is thin.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds thereof are therefore intended to be embraced by the claims.

What is claimed is:

1. A method for producing a nitride semiconductor element having at least a conductive layer, a first terminal, a nitride semiconductor with a light-emitting layer, and a second terminal, from a supporting substrate successively, comprising:
   a growing step for growing the nitride semiconductor having at least a second conductive type nitride semiconductor layer, the light-emitting layer, and a first conductive type nitride semiconductor layer, on a different material substrate; subsequently,
   a attaching step for attaching the supporting substrate to the first conductive type nitride semiconductor layer side of the nitride semiconductor with interposing between them the first terminal; and subsequently,
   a different-material-substrate-eliminating step for eliminating the different material substrate so as to expose the second conductive type nitride semiconductor layer.

2. The method according to claim 1, wherein the conductive layer is formed by a eutectic junction in the attaching step.

3. The method according to claim 1, wherein the attaching step is performed by thermocompression bonding.

4. The method according to claim 1, wherein the different-material-substrate-eliminating step is performed by laser irradiation, polishing, or chemical polishing.

5. The method according to claim 1, wherein the light-emitting layer has a quantum well structure, which includes at least a well layer of $Al_aIn_bGa_{1-a-b}N$ (0=a=1, 0=b=1, a+b=1) and a barrier layer of $Al_cIn_dGa_{1-c-d}N$ (0=c=1, 0=d=1, c+d=1).

6. The method according to claim 5, wherein,
   the light-emitting layer has a quantum well structure, which includes at least a well layer of $Al_aIn_bGa_{1-a-b}N$ (0<a=1, 0<b=1, a+b<1) and a barrier layer of $Al_cIn_dGa_{1-c-d}N$ (0<c=1, 0<d=1, c+d<1), and
   the first conductive type semiconductor layer is disposed in one side of the principal plane of the light-emitting layer,
   the second conductive type semiconductor layer, which includes Al, is disposed in another side of the principal plane of the light-emitting layer.

7. The method according to claim 1, further comprising:
   an asperity-portion-forming step for forming an asperity portion on the exposed surface of the nitride semiconductor, which is the second type conductive nitride semiconductor layer, after the different-material-substrate-eliminating step.

8. The method according to claim 1, further comprising:
   a step for forming a second insulating protect layer on the exposed surface of the nitride semiconductor, which is the second type conductive nitride semiconductor layer, after the different-material-substrate-eliminating step.

9. The method according to claim 8, further comprising:
a step for forming an asperity portion on the second insulating protect layer.

10. The method according to claim 8, wherein the refractive index of the second insulating protect layer is more than or equal to 1 and not more than 2.5.

11. The method according to claim 1, further comprising:
a step for breaking the nitride semiconductor into chips by etching the exposed surface of the nitride semiconductor after the different-material-substrate-eliminating step.

12. A method for producing a nitride semiconductor element having at least a conductive layer, a first terminal, a nitride semiconductor with a light-emitting layer, and a second terminal, from a supporting substrate successively, comprising:
a growing step for growing the nitride semiconductor having at least an undoped GaN layer, a second conductive type nitride semiconductor layer, the light-emitting layer, and a first conductive type nitride semiconductor layer on a different material substrate; subsequently,
a attaching step for attaching the supporting substrate to the first conductive type nitride semiconductor layer side of the nitride semiconductor with interposing the first terminal between them; and subsequently,
an exposing step for exposing the second conductive type nitride semiconductor layer by eliminating the different material substrate and the undoped GaN.

13. The method according to claim 12, wherein the nitride semiconductor layers except the light-emitting layer in the nitride semiconductor have a band gap larger than the light-emission band gap.

14. The method according to claim 2, further comprising:
a step for forming a second insulating protect layer on the exposed surface of the nitride semiconductor, which is the second type conductive nitride semiconductor layer, after the different-material-substrate-eliminating step.

15. The method according to claim 3, further comprising:
a step for forming a second insulating protect layer on the exposed surface of the nitride semiconductor, which is the second type conductive nitride semiconductor layer, after the different-material-substrate-eliminating step.

16. The method according to claim 4, further comprising:
a step for forming a second insulating protect layer on the exposed surface of the nitride semiconductor, which is the second type conductive nitride semiconductor layer, after the different-material-substrate-eliminating step.

17. The method according to claim 5, further comprising:
a step for forming a second insulating protect layer on the exposed surface of the nitride semiconductor, which is the second type conductive nitride semiconductor layer, after the different-material-substrate-eliminating step.

18. The method according to claim 6, further comprising:
a step for forming a second insulating protect layer on the exposed surface of the nitride semiconductor, which is the second type conductive nitride semiconductor layer, after the different-material-substrate-eliminating step.

19. The method according to claim 7, further comprising:
a step for forming a second insulating protect layer on the exposed surface of the nitride semiconductor, which is the second type conductive nitride semiconductor layer, after the different-material-substrate-eliminating step.

* * * * *